United States Patent
Glendenning et al.

(10) Patent No.: US 12,174,888 B2
(45) Date of Patent: Dec. 24, 2024

(54) METHODS AND SYSTEMS FOR CREATING AUTOMATA NETWORKS

(71) Applicant: Micron Technology, Inc., Boise, ID (US)

(72) Inventors: Paul Glendenning, Woodside, CA (US); Michael C. Leventhal, Los Gatos, CA (US); Paul Dlugosch, Eagle, ID (US); Harold B Noyes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 360 days.

(21) Appl. No.: 17/228,212

(22) Filed: Apr. 12, 2021

(65) Prior Publication Data

US 2021/0232630 A1    Jul. 29, 2021

Related U.S. Application Data

(63) Continuation of application No. 15/286,202, filed on Oct. 5, 2016, now Pat. No. 10,977,309.

(Continued)

(51) Int. Cl.
*G06F 3/0481*    (2022.01)
*G06F 8/34*    (2018.01)
(Continued)

(52) U.S. Cl.
CPC ........ *G06F 16/9024* (2019.01); *G06F 3/0481* (2013.01); *G06F 8/34* (2013.01);
(Continued)

(58) Field of Classification Search
CPC .. G06F 16/9024; G06F 16/902; G06F 16/904; G06F 3/0481; G06F 8/34; G06F 8/41; G06F 30/20; G06N 3/004
See application file for complete search history.

(56) References Cited

U.S. PATENT DOCUMENTS 3,849,762 A    11/1974    Fujimoto et al.
3,921,136 A    11/1975    Bar-Lev
(Continued)

FOREIGN PATENT DOCUMENTS

EP    0476159 A1    3/1992
EP    0943995 A2    9/1999
(Continued)

OTHER PUBLICATIONS

LabVIEW Fundamentals, "LV_FundamentalsP.pdf" 165pgs. (Year: 2005).*

(Continued)

*Primary Examiner* — Haoshian Shih
(74) *Attorney, Agent, or Firm* — Fletcher Yoder, P.C.

(57) ABSTRACT

The Automata Processor Workbench (AP Workbench) is an application for creating and editing designs of AP networks (e.g., one or more portions of the state machine engine, one or more portions of the FSM lattice, or the like) based on, for example, an Automata Network Markup Language (ANML). For instance, the application may include a tangible, non-transitory computer-readable medium configured to store instructions executable by a processor of an electronic device, wherein the instructions include instructions to represent an automata network as a graph.

20 Claims, 26 Drawing Sheets

Related U.S. Application Data

(60) Provisional application No. 62/238,060, filed on Oct. 6, 2015.

(51) Int. Cl.

| | |
|---|---|
| *G06F 8/41* | (2018.01) |
| *G06F 16/901* | (2019.01) |
| *G06F 16/904* | (2019.01) |
| *G06N 3/004* | (2023.01) |
| *G06F 30/20* | (2020.01) |

(52) U.S. Cl.
CPC .............. *G06F 8/41* (2013.01); *G06F 16/902* (2019.01); *G06F 16/904* (2019.01); *G06N 3/004* (2013.01); *G06F 30/20* (2020.01)

(56) References Cited

U.S. PATENT DOCUMENTS

| | | | |
|---|---|---|---|
| 4,011,547 A | 3/1977 | Kimmel | |
| 4,014,000 A | 3/1977 | Uno et al. | |
| 4,123,695 A | 10/1978 | Hale et al. | |
| 4,153,897 A | 5/1979 | Yasuda et al. | |
| 4,204,193 A | 5/1980 | Schroeder | |
| 4,414,685 A | 11/1983 | Sternberg | |
| 4,748,674 A | 5/1988 | Freeman | |
| 5,014,327 A | 5/1991 | Potter et al. | |
| 5,028,821 A | 7/1991 | Kaplinsky | |
| 5,216,748 A | 6/1993 | Quenot et al. | |
| 5,257,361 A | 10/1993 | Doi et al. | |
| 5,287,523 A | 2/1994 | Allison et al. | |
| 5,291,482 A | 3/1994 | McHarg et al. | |
| 5,300,830 A | 4/1994 | Hawes | |
| 5,331,227 A | 7/1994 | Hawes | |
| 5,357,512 A | 10/1994 | Khaira et al. | |
| 5,371,878 A | 12/1994 | Coker | |
| 5,377,129 A | 12/1994 | Molvig et al. | |
| 5,459,798 A | 10/1995 | Bailey et al. | |
| 5,615,237 A | 3/1997 | Chang et al. | |
| 5,659,551 A | 8/1997 | Huott et al. | |
| 5,723,984 A | 3/1998 | Sharpe-Geisier | |
| 5,754,878 A | 5/1998 | Asghar et al. | |
| 5,790,531 A | 8/1998 | Ellebracht et al. | |
| 5,812,394 A * | 9/1998 | Lewis ................ | G05B 19/0426 700/86 |
| 5,881,312 A | 3/1999 | Dulong | |
| 5,896,548 A | 4/1999 | Ofek | |
| 5,956,741 A | 9/1999 | Jones | |
| 6,011,407 A | 1/2000 | New | |
| 6,016,361 A | 1/2000 | Hongu et al. | |
| 6,034,963 A | 3/2000 | Minami et al. | |
| 6,041,405 A | 3/2000 | Green | |
| 6,052,766 A | 4/2000 | Betker et al. | |
| 6,058,469 A | 5/2000 | Baxter | |
| 6,151,644 A | 11/2000 | Wu | |
| 6,240,003 B1 | 5/2001 | McElroy | |
| 6,279,128 B1 | 8/2001 | Arnold et al. | |
| 6,317,427 B1 | 11/2001 | Augusta et al. | |
| 6,362,868 B1 | 3/2002 | Silverbrook | |
| 6,400,996 B1 | 6/2002 | Hoffberg et al. | |
| 6,606,699 B2 | 8/2003 | Pechanek et al. | |
| 6,614,703 B2 | 9/2003 | Pitts et al. | |
| 6,625,740 B1 | 9/2003 | Datar et al. | |
| 6,633,443 B1 | 10/2003 | Watanabe et al. | |
| 6,636,483 B1 | 10/2003 | Pannell | |
| 6,640,262 B1 | 10/2003 | Uppunda et al. | |
| 6,697,979 B1 | 2/2004 | Vorbach et al. | |
| 6,700,404 B1 | 3/2004 | Feng et al. | |
| 6,728,877 B2 | 4/2004 | Mackin et al. | |
| 6,880,087 B1 | 4/2005 | Carter | |
| 6,906,938 B2 | 6/2005 | Kaginele | |
| 6,944,710 B2 | 9/2005 | Regev et al. | |
| 6,977,897 B1 | 12/2005 | Nelson et al. | |
| 7,010,639 B2 | 3/2006 | Larson et al. | |
| 7,089,352 B2 | 8/2006 | Regev et al. | |
| 7,146,643 B2 | 12/2006 | Dapp et al. | |
| 7,176,717 B2 | 2/2007 | Sunkavalli et al. | |
| 7,276,934 B1 | 10/2007 | Young | |
| 7,305,047 B1 | 12/2007 | Turner | |
| 7,358,761 B1 | 4/2008 | Sunkavalli et al. | |
| 7,366,352 B2 | 4/2008 | Kravec et al. | |
| 7,392,229 B2 | 6/2008 | Harris et al. | |
| 7,428,722 B2 | 9/2008 | Sunkavalli et al. | |
| 7,487,131 B2 | 2/2009 | Harris et al. | |
| 7,487,542 B2 | 2/2009 | Boulanger et al. | |
| 7,499,464 B2 | 3/2009 | Ayrapetian et al. | |
| 7,725,510 B2 | 5/2010 | Alicherry et al. | |
| 7,774,286 B1 | 8/2010 | Harris | |
| 7,804,719 B1 | 9/2010 | Chirania et al. | |
| 7,890,923 B2 | 2/2011 | Elaasar | |
| 7,899,052 B1 | 3/2011 | Hao et al. | |
| 7,917,684 B2 | 3/2011 | Noyes et al. | |
| 7,970,964 B2 | 6/2011 | Noyes | |
| 8,015,530 B1 | 9/2011 | Sinclair et al. | |
| 8,020,131 B1 | 9/2011 | Van Mau et al. | |
| 8,065,249 B1 | 11/2011 | Harris et al. | |
| 8,140,780 B2 | 3/2012 | Noyes | |
| 8,146,040 B1 | 3/2012 | Janneck et al. | |
| 8,159,900 B2 | 4/2012 | Moore et al. | |
| 8,209,521 B2 | 6/2012 | Noyes et al. | |
| 8,239,660 B2 | 8/2012 | Cervini | |
| 8,281,395 B2 | 10/2012 | Pawlowski | |
| 8,294,490 B1 | 10/2012 | Kaviani | |
| 8,402,188 B2 | 3/2013 | Noyes et al. | |
| 8,536,896 B1 | 9/2013 | Trimberger | |
| 8,593,175 B2 | 11/2013 | Noyes et al. | |
| 8,648,621 B2 | 2/2014 | Noyes et al. | |
| 8,680,888 B2 | 3/2014 | Brown et al. | |
| 8,725,961 B2 | 5/2014 | Noyes | |
| 8,782,624 B2 | 7/2014 | Brown et al. | |
| 8,938,590 B2 | 1/2015 | Noyes et al. | |
| 9,058,465 B2 | 6/2015 | Noyes et al. | |
| 9,063,532 B2 | 6/2015 | Brown | |
| 9,075,428 B2 | 7/2015 | Brown | |
| 9,118,327 B2 | 8/2015 | Noyes et al. | |
| 9,235,798 B2 | 1/2016 | Brown et al. | |
| 2002/0186044 A1 | 12/2002 | Agrawal et al. | |
| 2003/0107996 A1 | 6/2003 | Black et al. | |
| 2003/0142698 A1 | 7/2003 | Parhl | |
| 2003/0163615 A1 | 8/2003 | Yu | |
| 2003/0226002 A1 | 12/2003 | Boutaud et al. | |
| 2004/0019875 A1 * | 1/2004 | Welch ................ | G06F 9/451 717/109 |
| 2004/0100980 A1 | 5/2004 | Jacobs et al. | |
| 2004/0125807 A1 | 7/2004 | Liu et al. | |
| 2004/0151211 A1 | 8/2004 | Snider | |
| 2004/0184662 A1 | 9/2004 | Kravec et al. | |
| 2005/0033820 A1 | 2/2005 | Steindl | |
| 2005/0154916 A1 | 7/2005 | Boulanger et al. | |
| 2005/0251638 A1 | 11/2005 | Boutaud et al. | |
| 2006/0158219 A1 | 7/2006 | Sunkavalli et al. | |
| 2006/0195496 A1 | 8/2006 | Vadi et al. | |
| 2006/0206875 A1 | 9/2006 | Ullmann et al. | |
| 2006/0257043 A1 | 11/2006 | Chiu | |
| 2006/0274001 A1 | 12/2006 | Guttag et al. | |
| 2006/0288070 A1 | 12/2006 | Vadi et al. | |
| 2007/0005869 A1 | 1/2007 | Balraj et al. | |
| 2007/0075878 A1 | 4/2007 | Furodet et al. | |
| 2007/0127482 A1 | 6/2007 | Harris et al. | |
| 2007/0150623 A1 | 6/2007 | Kravec et al. | |
| 2007/0282833 A1 | 12/2007 | McMillen | |
| 2007/0283108 A1 | 12/2007 | Isherwood et al. | |
| 2008/0126690 A1 | 5/2008 | Rajan et al. | |
| 2008/0129334 A1 | 6/2008 | Sunkavalli et al. | |
| 2008/0133874 A1 | 6/2008 | Capek et al. | |
| 2008/0140661 A1 | 6/2008 | Pandya | |
| 2008/0178031 A1 | 7/2008 | Dong-Han | |
| 2008/0256347 A1 | 10/2008 | Eickemeyer et al. | |
| 2008/0263036 A1 * | 10/2008 | Yamamoto ............ | G06F 16/583 707/E17.02 |
| 2008/0320053 A1 | 12/2008 | Iijima et al. | |
| 2009/0198952 A1 | 8/2009 | Khmeinitsky et al. | |
| 2009/0204734 A1 | 8/2009 | Strait et al. | |
| 2010/0100691 A1 | 4/2010 | Noyes et al. | |

(56) References Cited

U.S. PATENT DOCUMENTS

| | | | |
|---|---|---|---|
| 2010/0100714 A1 | 4/2010 | Noyes et al. |
| 2010/0115173 A1 | 5/2010 | Noyes |
| 2010/0115347 A1 | 5/2010 | Noyes |
| 2010/0118425 A1 | 5/2010 | Rafaelof |
| 2010/0138432 A1 | 6/2010 | Noyes |
| 2010/0138575 A1 | 6/2010 | Noyes |
| 2010/0138634 A1 | 6/2010 | Noyes |
| 2010/0138635 A1 | 6/2010 | Noyes |
| 2010/0145182 A1 | 6/2010 | Schmidt et al. |
| 2010/0174887 A1 | 7/2010 | Pawlowski |
| 2010/0174929 A1 | 7/2010 | Pawlowski |
| 2010/0175130 A1 | 7/2010 | Pawlowski |
| 2010/0185647 A1 | 7/2010 | Noyes |
| 2010/0325352 A1 | 12/2010 | Schuette et al. |
| 2010/0332809 A1 | 12/2010 | Noyes et al. |
| 2011/0004578 A1 | 1/2011 | Momma et al. |
| 2011/0145182 A1 | 6/2011 | Dlugosch |
| 2011/0145271 A1 | 6/2011 | Noyes et al. |
| 2011/0145544 A1 | 6/2011 | Noyes et al. |
| 2011/0161620 A1 | 6/2011 | Kaminski et al. |
| 2011/0208900 A1 | 8/2011 | Schuette et al. |
| 2011/0258360 A1 | 10/2011 | Noyes |
| 2011/0307233 A1 | 12/2011 | Tseng et al. |
| 2011/0307433 A1 | 12/2011 | Dlugosch |
| 2011/0307503 A1 | 12/2011 | Dlugosch |
| 2011/0320759 A1 | 12/2011 | Craddock et al. |
| 2012/0179854 A1 | 7/2012 | Noyes |
| 2012/0192163 A1 | 7/2012 | Glendenning et al. |
| 2012/0192164 A1 | 7/2012 | Xu et al. |
| 2012/0192165 A1 | 7/2012 | Xu et al. |
| 2012/0192166 A1 | 7/2012 | Xu et al. |
| 2013/0154685 A1 | 6/2013 | Noyes |
| 2013/0156043 A1 | 6/2013 | Brown et al. |
| 2013/0159239 A1 | 6/2013 | Brown et al. |
| 2013/0159670 A1 | 6/2013 | Noyes |
| 2013/0159671 A1 | 6/2013 | Brown et al. |
| 2013/0275709 A1 | 10/2013 | Gajapathy |
| 2014/0025614 A1 | 1/2014 | Noyes et al. |
| 2014/0025923 A1 | 1/2014 | Klein |
| 2014/0067736 A1 | 3/2014 | Noyes |
| 2014/0204956 A1 | 7/2014 | Brown et al. |
| 2014/0225889 A1 | 8/2014 | Kim et al. |
| 2014/0279776 A1 | 9/2014 | Brown et al. |
| 2014/0325494 A1 | 10/2014 | Brown et al. |

FOREIGN PATENT DOCUMENTS

| | | | |
|---|---|---|---|
| JP | 08087462 A | 4/1996 |
| JP | 10069459 A | 3/1998 |
| JP | 10111862 A | 4/1998 |
| JP | 2000231549 A | 8/2000 |
| JP | 2000347708 A | 12/2000 |
| KR | 1020080097573 A | 11/2008 |
| WO | WO0065425 A1 | 11/2000 |
| WO | WO0138978 A1 | 5/2001 |
| WO | WO03039001 A1 | 5/2003 |
| WO | WO2005036750 A1 | 4/2005 |
| WO | WO2011114120 A1 | 9/2011 |

OTHER PUBLICATIONS

Fransson, "Simulators for formal languages, automata and theory of computation with focus on JFLAP", 2013, pp. 1-64, "fransson.pdf" (Year: 2013).*
Beesley, K. R.; Arabic Morphology Using Only Finite-State Operations; Xerox Research Centre Europe; pp. 50-57; 1998.
Bird, S. et al.; One-Level Phonology: Autosegmental Representations and Rules as Finite Automata; Association for Computational Linguistics; University of Edinburgh; vol. 20; No. 1; pp. 55-90; 1994.
Bispo, J. et al.; Regular Expression Matching for Reconfigurable Packet Inspection; IEEE International Conference on Field Programmable Technology; 2006.
Bispo, J. et al.; Synthesis of Regular Expressions Targeting FPGAs: Current Status and Open Issues; IST/INESC-ID, Libson, Portugal; pp. 1-12; 2007.
Brodie, B. et al.; A scalable Architecture for High-Throughput Regular-Expression Pattern Matching; Exegy Inc.; pp. 1-12; 2006.
Clark, C.; Design of Efficient FPGA Circuits for Matching Complex Patterns in Network Intrusion Detection Systems (Master of Science Thesis); Georgia Institute of Technology; pp. 1-56; Dec. 2003.
Clark, C.; A Unified Model of Pattern-Matching Circuits for Field-Programmable Gate Arrays [Doctoral Dissertation]; Georgia Institute of Technology; pp. 1-177; 2006.
Clark, C. et al.; Scalable Pattern Matching for High Speed Networks; Proceedings of the 12$^{th}$ Annual IEEE symposium on Field-Programmable Custom Computing Machines (FCCM'04);Georgia Institute of Technology; pp. 1-9; 2004.
Clark, C. et al.; A Unified Model of Pattern-Matching Circuit Architectures; Tech Report GIT-CERCS-05-20;Georgia Institute of Technology; pp. 1-17; 2005.
Fide, S.; String Processing in Hardware; Scalable Parallel and Distributed Systems Lab; Proceedings of the 12$^{th}$ Annual IEEE symposium on Field-Programmable Custom Computing Machines (FCCM'04); School of Electrical and Computer Engineering; Georgia Institute of Technology; pp. 1-9; 2004.
Fisk, M. et al.; Applying Fast String Matching to Intrusion Detection; Los Alamos National Laboratory; University of California San Diego; pp. 1-21; 2002.
Korenek, J.; Traffic Scanner-Hardware Accelerated Intrusion Detection System; http://www.liberouter.org/ ; 2006.
Kumar, S. et al.; Curing Regular Expressions matching Algorithms from Insomnia, Amnesia, and Acaluia; Department of Computer Science and Engineering; Washington University in St. Louis; pp. 1-17; Apr. 27, 2007.
Lipovski, G.; Dynamic Systolic Associative Memory Chip; IEEE; Department of Electrical and Computer Engineering; University of Texas at Austin; pp. 481-492; 1990.
Lin, C. et al.; Optimization of Pattern Matching Circuits for Regular Expression on FPGA; IEEE Transactions on Very Large Scale Integrations Systems; vol. 15, No. 12, pp. 1-6; Dec. 2007.
Schultz, K. et al.; Fully Parallel Integrated CAM/RAM Using Preclassification to Enable Large Capacities; IEEE Journal on Solid-State Circuits; vol. 31; No. 5; pp. 689-699; May 1996.
Shafai, F. et al.; Fully Parallel 30-MHz, 2.5-Mb CAM; IEEE Journal of Solid-State Circuits, vol. 33; No. 11; pp. 1690-1696; Nov. 1998.
Sidhu, R. et al.; Fast Regular Expression Pattern Matching using FPGAs; Department of EE-Systems; University of Southern California; pp. 1-12; 2001.
Wada, T.; Multiobject Behavior Recognition Event Driven Selective Attention Method; IEEE; pp. 1-16; 2000.
Yu, F.; High Speed Deep Packet Inspection with Hardware Support; Electrical Engineering and Computer Sciences; University of California at Berkeley; pp. 1-217; Nov. 22, 2006.
Freescale and Kaspersky® Accelerated Antivirus Solution Platform for OEM Vendors; Freescale Semiconductors Document; pp. 1-16; 2007.
PCT/US2009/067534 International Search Report and Written Opinion Apr. 26, 2010.
PCT/US2009/061649 International Search Report Feb. 15, 2010.
Taiwan Application No. 098144804 Office Action dated Nov. 4, 2013.
PCT/US2012/067992 International Search Report Mar. 28, 2013.
PCT/US2012/068011 International Search Report Apr. 15, 2013.
PCT/US2012/067999 International Search Report May 14, 2013.
PCT/US2012/067995 International Search Report May 17, 2013.
PCT/US2012/067988 International Search Report (Partial) Jun. 24, 2014.
PCT/US2013/049744 International Search Report and Written Opinion Oct. 22, 2013.
PCT/US2013/049748 International Search Report and Written Opinion Oct. 22, 2013.
PCT/US2013/049755 International Search Report and Written Opinion Oct. 24, 2013.
PCT/US2013/049753 International Search Report and Written Opinion Nov. 7, 2013.

(56) References Cited

OTHER PUBLICATIONS

PCT/US2013/055434 International Search Report and Written Opinion Nov. 29, 2013.
PCT/US2013/055438 International Search Report and Written Opinion Nov. 29, 2013.
PCT/US2013/055436 International Search Report and Written Opinion Dec. 9, 2013.
PCT/US2014/023589 International Search Report and Written Opinion Jul. 24, 2014.
Soewito et al., "Self-Addressable Memory-Based FSM: A scalable Intrusion Detection Engine", IEEE Network, pp. 14-21; Feb. 2009.
Hurson A. R.; A VLSI Design for the Parallel Finite State Automation and Its Performance Evaluation as a Hardware Scanner; International Journal of Computer and Information Sciences, vol. 13, No. 6; 1984.
Carpenter et al., "A Massively Parallel Architecture for a Self-Organizing Neural Pattern Recognition Machine", Academic Press, Inc.; 1987.
Cong et al., "Application-Specific Instruction Generation for Configurable Processor Architectures", Computer Science Department, University of California, ACM; 2004.
Glette et al., "An Online EHW Pattern Recognition System Applied to Face Image Recognition", University of Oslo, Norway; 2007.
Kawai et al., "An Adaptive Pattern Recognition Hardware with On-chip Shift Register-based Partial Reconfiguration", IEEE; 2008.
Kutrib et al., "Massively Parallel Pattern Recognition with Link Features", IFIG Research Report 0003; 2000.
Marculescu et al., Power Management of Multi-Core Systems: Challenges, Approaches, and Recent Developments Tutorial at ASPLOS, London, UK [online]; Mar. 4, 2012.
Vitanen et al.; Image Pattern Recognition Using Configurable Logic Cell Array; New Advances in Computer Graphics; pp. 355-368; 1989.
Yasunaga et al., "Kernel-based Pattern Recognition Hardware: Its Design Methodology Using Evolved Truth Tables", IEEE, 2000.
U.S. Appl. No. 60/652,738, filed Feb. 12, 2005, Harris.
U.S. Appl. No. 61/788,364, filed Mar. 15, 2013, Brown et al.
Sabotta, "Advantages and Challenges of Programming the Micron Automata Processor," Iowa State University Capstones, Theses, and Dissertations, 2013, 53 pgs.
Saber et al., "A Visual Representation of Cellular Automate-Like Systems," Journal of Visual Languages & Computing, Nov. 6, 2003, 30 pgs, Elsevier Ltd.
Noyes, "Micron's Automata Processor Architecture: Reconfigurable and Massively Parallel Automate Processing," 2014, 55 pgs.
Fransson, "Simulators for Formal Languages, Automata and Theory of Computation with Focus on JFLAP," Institutionen för Dataventenskap och Elektronik (IDE), Västerås, 2013, 64 pgs.
Rangel-Mondragon,"A Finite Automaton Editor," Wolfram Demonstration Project, 2011, 3 pgs.

* cited by examiner

METHODS AND SYSTEMS FOR CREATING AUTOMATA NETWORKS

CROSS REFERENCE TO RELATED APPLICATIONS

This application is a continuation application of U.S. application Ser. No. 15/286,202, entitled "Methods and Systems for Creating Networks," filed Oct. 5, 2016, now U.S. Pat. No. 10,977,309, which issued on Apr. 13, 2021, which is a Non-Provisional Application claiming priority to U.S. Provisional Patent Application No. 62/238,060, entitled "Methods and Systems for Creating Networks", filed Oct. 6, 2015, which is herein incorporated by reference.

BACKGROUND

Field of Invention

Embodiments relate generally to electronic devices and, more specifically, in certain embodiments, to electronic devices with parallel devices for data analysis.

Description of Related Art

Complex pattern recognition can be inefficient to perform on a conventional von Neumann based computer. A biological brain, in particular a human brain, however, is adept at performing pattern recognition. Current research suggests that a human brain performs pattern recognition using a series of hierarchically organized neuron layers in the neocortex. Neurons in the lower layers of the hierarchy analyze "raw signals" from, for example, sensory organs, while neurons in higher layers analyze signal outputs from neurons in the lower levels. This hierarchical system in the neocortex, possibly in combination with other areas of the brain, accomplishes the complex pattern recognition that enables humans to perform high level functions such as spatial reasoning, conscious thought, and complex language.

In the field of computing, pattern recognition tasks are increasingly challenging. Ever larger volumes of data are transmitted between computers, and the number of patterns that users wish to identify is increasing. For example, spam or malware are often detected by searching for patterns in a data stream, e.g., particular phrases or pieces of code. The number of patterns increases with the variety of spam and malware, as new patterns may be implemented to search for new variants. Searching a data stream for each of these patterns can form a computing bottleneck. Often, as the data stream is received, it is searched for each pattern, one at a time. The delay before the system is ready to search the next portion of the data stream increases with the number of patterns. Thus, pattern recognition may slow the receipt of data.

Hardware has been designed to search a data stream for patterns, but this hardware often is unable to process adequate amounts of data in an amount of time given. Some devices configured to search a data stream do so by distributing the data stream among a plurality of circuits. The circuits each determine whether the data stream matches a portion of a pattern. Often, a large number of circuits operate in parallel, each searching the data stream at generally the same time. The system may then further process the results from these circuits, to arrive at the final results. These "intermediate results", however, can be larger than the original input data, which may pose issues for the system. The ability to use a cascaded circuits approach, similar to the human brain, offers one potential solution to this problem. However, there has not been a system that effectively allows for performing pattern recognition in a manner more comparable to that of a biological brain. Development of such a system is desirable.

DETAILED DESCRIPTION

Figure 1:
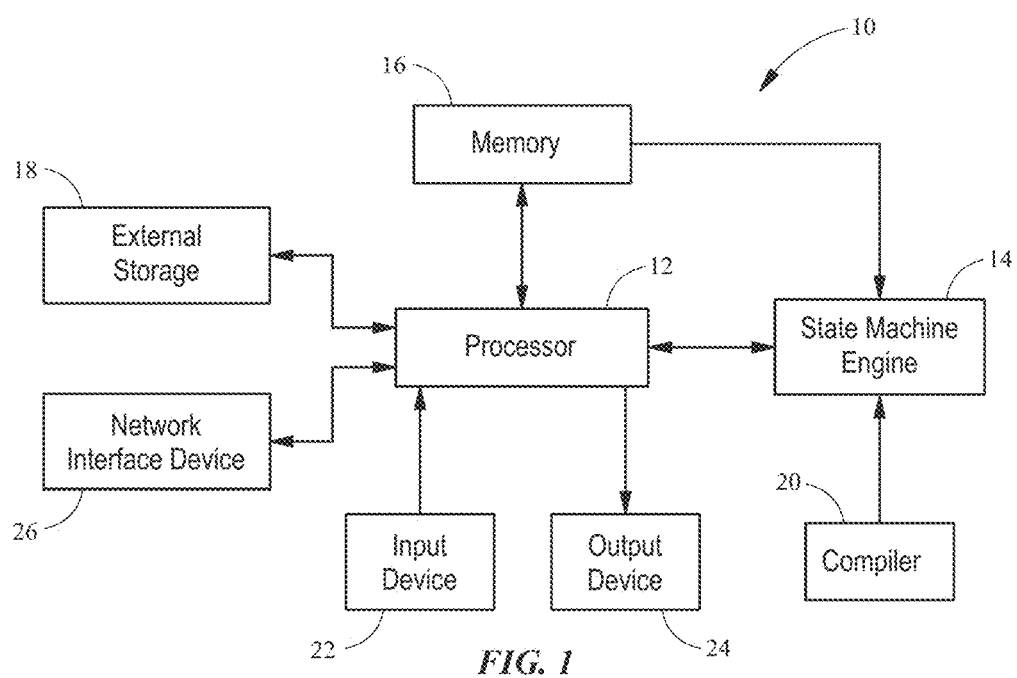
FIG. 1 illustrates an example of system having a state machine engine, according to various embodiments.

Turning now to the figures, FIG. 1 illustrates an embodiment of a processor-based system, generally designated by reference numeral 10. The system 10 may be any of a variety of types such as a desktop computer, laptop computer, pager, cellular phone, personal organizer, portable audio player, control circuit, camera, etc. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

In a typical processor-based device, such as the system 10, a processor 12, such as a microprocessor, controls the processing of system functions and requests in the system 10. Further, the processor 12 may comprise a plurality of processors that share system control. The processor 12 may be coupled directly or indirectly to each of the elements in the system 10, such that the processor 12 controls the system 10 by executing instructions that may be stored within the system 10 or external to the system 10.

In accordance with the embodiments described herein, the system 10 includes a state machine engine 14, which may operate under control of the processor 12. The state machine engine 14 may employ any one of a number of state machine architectures, including, but not limited to Mealy architectures, Moore architectures, Finite State Machines (FSMs), Deterministic FSMs (DFSMs), Bit-Parallel State Machines (BPSMs), etc. Though a variety of architectures may be used, for discussion purposes, the application refers to FSMs. However, those skilled in the art will appreciate that the described techniques may be employed using any one of a variety of state machine architectures.

As discussed further below, the state machine engine 14 may include a number of (e.g., one or more) finite state machine (FSM) lattices (e.g., core of a chip). For purposes of this application the term "lattice" refers to an organized framework (e.g., routing matrix, routing network, frame) of elements (e.g., Boolean cells, counter cells, state machine elements, state transition elements). Furthermore, the "lattice" may have any suitable shape, structure, or hierarchical organization (e.g., grid, cube, spherical, cascading). Each FSM lattice may implement multiple FSMs that each receive and analyze the same data in parallel. Further, the FSM lattices may be arranged in groups (e.g., clusters), such that clusters of FSM lattices may analyze the same input data in parallel. Further, clusters of FSM lattices of the state machine engine 14 may be arranged in a hierarchical structure wherein outputs from state machine lattices on a lower level of the hierarchical structure may be used as inputs to state machine lattices on a higher level. By cascading clusters of parallel FSM lattices of the state machine engine 14 in series through the hierarchical structure, increasingly complex patterns may be analyzed (e.g., evaluated, searched, etc.).

Further, based on the hierarchical parallel configuration of the state machine engine 14, the state machine engine 14 can be employed for complex data analysis (e.g., pattern recognition or other processing) in systems that utilize high processing speeds. For instance, embodiments described herein may be incorporated in systems with processing speeds of 1 GByte/sec. Accordingly, utilizing the state machine engine 14, data from high speed memory devices or other external devices may be rapidly analyzed. The state machine engine 14 may analyze a data stream according to several criteria (e.g., search terms), at about the same time, e.g., during a single device cycle. Each of the FSM lattices within a cluster of FSMs on a level of the state machine engine 14 may each receive the same search term from the data stream at about the same time, and each of the parallel FSM lattices may determine whether the term advances the state machine engine 14 to the next state in the processing criterion. The state machine engine 14 may analyze terms according to a relatively large number of criteria, e.g., more than 100, more than 110, or more than 10,000. Because they operate in parallel, they may apply the criteria to a data stream having a relatively high bandwidth, e.g., a data stream of greater than or generally equal to 1 GByte/sec, without slowing the data stream.

In one embodiment, the state machine engine 14 may be configured to recognize (e.g., detect) a great number of patterns in a data stream. For instance, the state machine engine 14 may be utilized to detect a pattern in one or more of a variety of types of data streams that a user or other entity might wish to analyze. For example, the state machine engine 14 may be configured to analyze a stream of data received over a network, such as packets received over the Internet or voice or data received over a cellular network. In one example, the state machine engine 14 may be configured to analyze a data stream for spam or malware. The data stream may be received as a serial data stream, in which the data is received in an order that has meaning, such as in a temporally, lexically, or semantically significant order. Alternatively, the data stream may be received in parallel or out of order and, then, converted into a serial data stream, e.g., by reordering packets received over the Internet. In some embodiments, the data stream may present terms serially, but the bits expressing each of the terms may be received in parallel. The data stream may be received from a source external to the system 10, or may be formed by interrogating a memory device, such as the memory 16, and forming the data stream from data stored in the memory 16. In other examples, the state machine engine 14 may be configured to recognize a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase. The stream of data to be analyzed may include multiple bits of data in a binary format or other formats, e.g., base ten, ASCII, etc. The stream may encode the data with a single digit or multiple digits, e.g., several binary digits.

As will be appreciated, the system 10 may include memory 16. The memory 16 may include volatile memory, such as Dynamic Random Access Memory (DRAM), Static Random Access Memory (SRAM), Synchronous DRAM (SDRAM), Double Data Rate DRAM (DDR SDRAM), DDR2 SDRAM, DDR3 SDRAM, etc. The memory 16 may also include non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) to be used in conjunction with the volatile memory. The memory 16 may include one or more memory devices, such as DRAM devices, that may provide data to be analyzed by the state machine engine 14. As used herein, the term "provide" may generically refer to direct, input, insert, issue, route, send, transfer, transmit, generate, give, make available, move, output, pass, place, read out, write, etc. Such devices may be referred to as or include solid state drives (SSD's), MultimediaMediaCards (MMC's), SecureDigital (SD) cards, CompactFlash (CF) cards, or any other suitable device. Further, it should be appreciated that such devices may couple to the system 10 via any suitable interface, such as Universal Serial Bus (USB), Peripheral Component Interconnect (PCI), PCI Express (PCI-E), Small Computer System Interface (SCSI), IEEE 1394 (Firewire), or any other suitable interface. To facilitate operation of the memory 16, such as the flash memory devices, the system 10 may include a memory controller (not illustrated). As will be appreciated, the memory controller may be an independent device or it may be integral with the processor 12. Additionally, the system 10 may include an external storage 18, such as a magnetic storage device. The external storage may also provide input data to the state machine engine 14.

The system 10 may include a number of additional elements. For instance, a compiler 20 may be used to configure (e.g., program) the state machine engine 14, as described in more detail with regard to FIG. 8. An input device 22 may also be coupled to the processor 12 to allow a user to input data into the system 10. For instance, an input device 22 may be used to input data into the memory 16 for later analysis by the state machine engine 14. The input device 22 may include buttons, switching elements, a keyboard, a light pen, a stylus, a mouse, and/or a voice recognition system, for instance. An output device 24, such as a display may also be coupled to the processor 12. The display 24 may include an LCD, a CRT, LEDs, and/or an audio display, for example. They system may also include a network interface device 26, such as a Network Interface Card (NIC), for interfacing with a network, such as the Internet. As will be appreciated, the system 10 may include many other components, depending on the application of the system 10.

FIGS. 2-5 illustrate an example of a FSM lattice 30. In an example, the FSM lattice 30 comprises an array of blocks 32. As will be described, each block 32 may include a plurality of selectively couple-able hardware elements (e.g., configurable elements and/or special purpose elements) that correspond to a plurality of states in a FSM. Similar to a state in a FSM, a hardware element can analyze an input stream and activate a downstream hardware element, based on the input stream.

The configurable elements can be configured (e.g., programmed) to implement many different functions. For instance, the configurable elements may include state transition elements (STEs) 34, 36 (shown in FIG. 5) that are hierarchically organized into rows 38 (shown in FIGS. 3 and 4) and blocks 32 (shown in FIGS. 2 and 3). The STEs each may be considered an automaton, e.g., a machine or control mechanism designed to follow automatically a predetermined sequence of operations or respond to encoded instructions. Taken together, the STEs form an automata processor as state machine engine 14. To route signals between the hierarchically organized STEs 34, 36, a hierarchy of configurable switching elements can be used, including inter-block switching elements 40 (shown in FIGS. 2 and 3), intra-block switching elements 42 (shown in FIGS. 3 and 4) and intra-row switching elements 44 (shown in FIG. 4).

As described below, the switching elements may include routing structures and buffers. A STE 34, 36 can correspond to a state of a FSM implemented by the FSM lattice 30. The STEs 34, 36 can be coupled together by using the configurable switching elements as described below. Accordingly, a FSM can be implemented on the FSM lattice 30 by configuring the STEs 34, 36 to correspond to the functions of states and by selectively coupling together the STEs 34, 36 to correspond to the transitions between states in the FSM.

Figure 2:
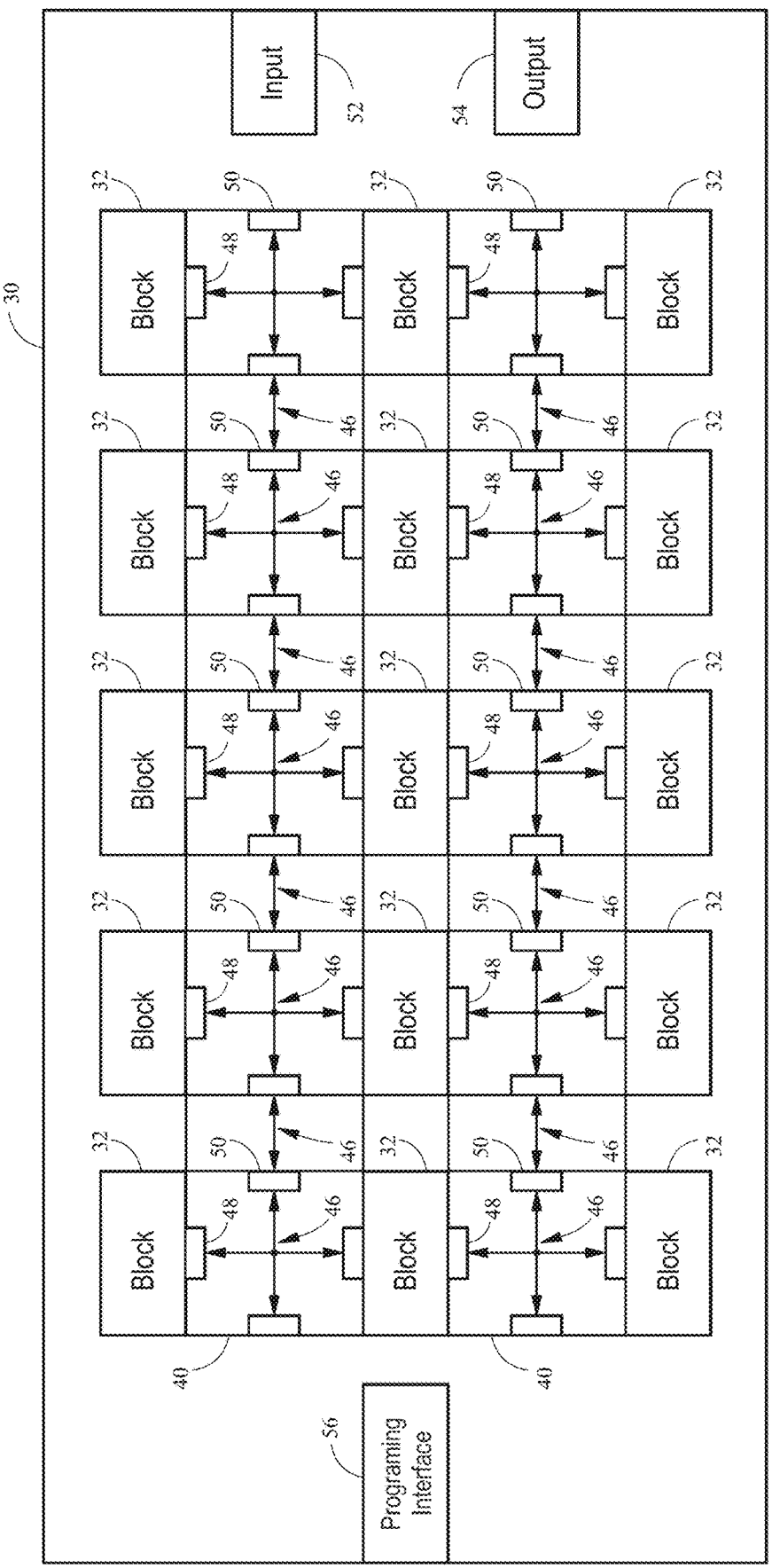
FIG. 2 illustrates an example of an FSM lattice of the state machine engine of FIG. 1, according to various embodiments.

FIG. 2 illustrates an overall view of an example of a FSM lattice 30. The FSM lattice 30 includes a plurality of blocks 32 that can be selectively coupled together with configurable inter-block switching elements 40. The inter-block switching elements 40 may include conductors 46 (e.g., wires, traces, etc.) and buffers 48, 50. In an example, buffers 48 and 50 are included to control the connection and timing of signals to/from the inter-block switching elements 40. As described further below, the buffers 48 may be provided to buffer data being sent between blocks 32, while the buffers 50 may be provided to buffer data being sent between inter-block switching elements 40. Additionally, the blocks 32 can be selectively coupled to an input block 52 (e.g., a data input port) for receiving signals (e.g., data) and providing the data to the blocks 32. The blocks 32 can also be selectively coupled to an output block 54 (e.g., an output port) for providing signals from the blocks 32 to an external device (e.g., another FSM lattice 30). The FSM lattice 30 can also include a programming interface 56 to configure (e.g., via an image, program) the FSM lattice 30. The image can configure (e.g., set) the state of the STEs 34, 36. For example, the image can configure the STEs 34, 36 to react in a certain way to a given input at the input block 52. For example, a STE 34, 36 can be set to output a high signal when the character 'a' is received at the input block 52.

In an example, the input block 52, the output block 54, and/or the programming interface 56 can be implemented as registers such that writing to or reading from the registers provides data to or from the respective elements. Accordingly, bits from the image stored in the registers corresponding to the programming interface 56 can be loaded on the STEs 34, 36. Although FIG. 2 illustrates a certain number of conductors (e.g., wire, trace) between a block 32, input block 52, output block 54, and an inter-block switching element 40, it should be understood that in other examples, fewer or more conductors may be used.

Figure 3:
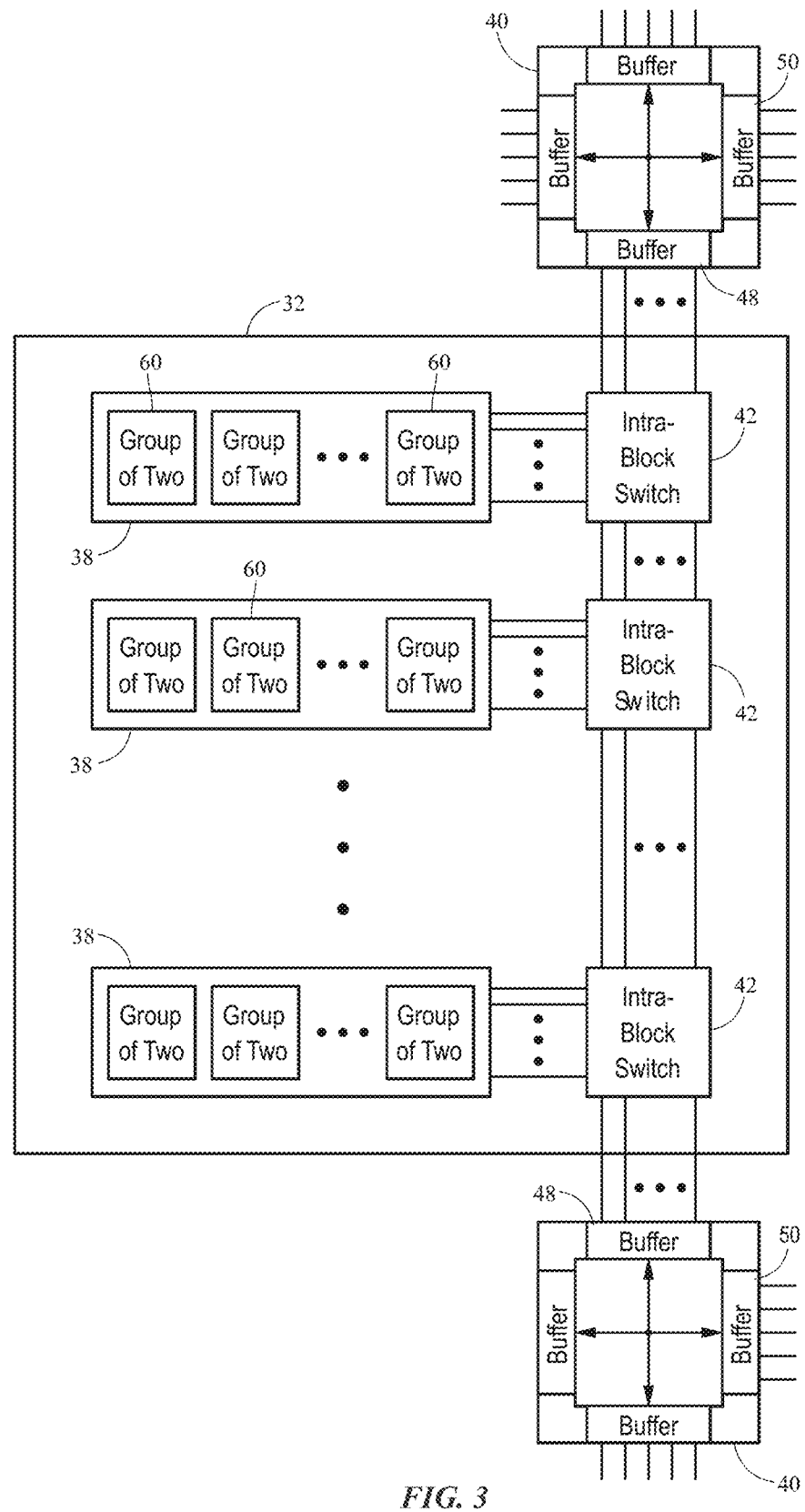
FIG. 3 illustrates an example of a block of the FSM lattice of FIG. 2, according to various embodiments.

FIG. 3 illustrates an example of a block 32. A block 32 can include a plurality of rows 38 that can be selectively coupled together with configurable intra-block switching elements 42. Additionally, a row 38 can be selectively coupled to another row 38 within another block 32 with the inter-block switching elements 40. A row 38 includes a plurality of STEs 34, 36 organized into pairs of elements that are referred to herein as groups of two (GOTs) 60. In an example, a block 32 comprises sixteen (16) rows 38.

Figure 4:
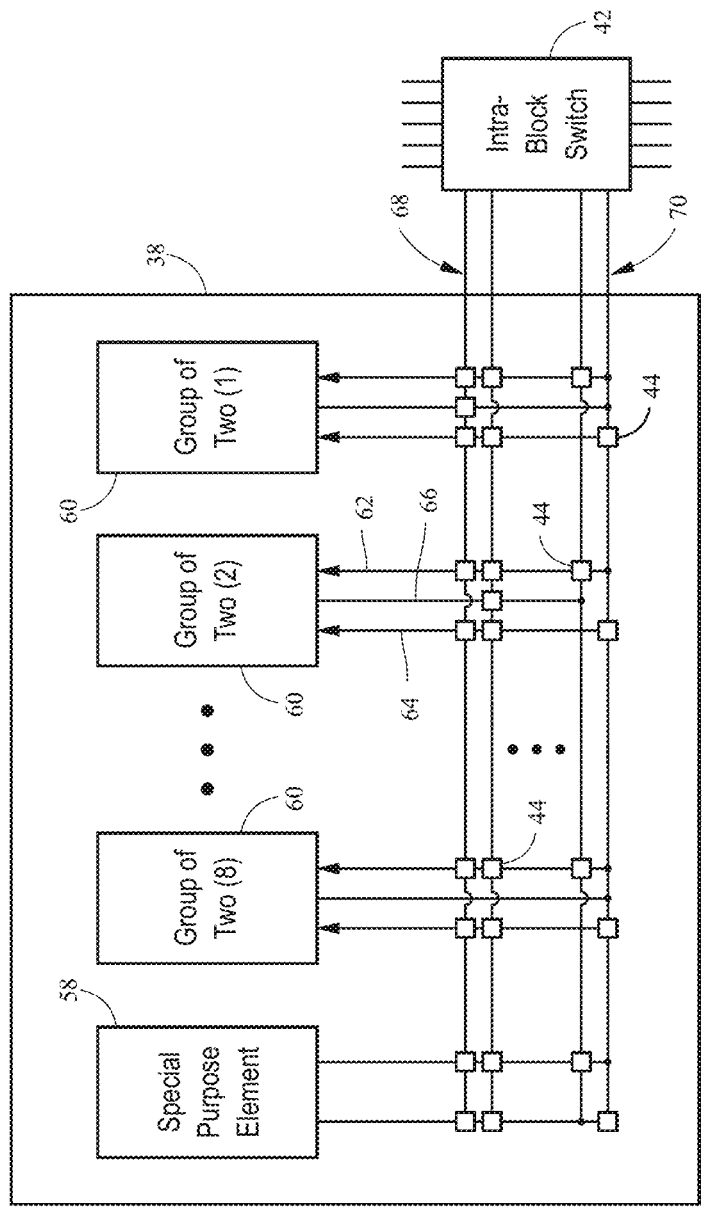
FIG. 4 illustrates an example of a row of the block of FIG. 3, according to various embodiments.

FIG. 4 illustrates an example of a row 38. A GOT 60 can be selectively coupled to other GOTs 60 and any other elements (e.g., a special purpose element 58) within the row 38 by configurable intra-row switching elements 44. A GOT 60 can also be coupled to other GOTs 60 in other rows 38 with the intra-block switching element 42, or other GOTs 60 in other blocks 32 with an inter-block switching element 40. In an example, a GOT 60 has a first and second input 62, 64, and an output 66. The first input 62 is coupled to a first STE 34 of the GOT 60 and the second input 64 is coupled to a second STE 36 of the GOT 60, as will be further illustrated with reference to FIG. 5.

In an example, the row 38 includes a first and second plurality of row interconnection conductors 68, 70. In an example, an input 62, 64 of a GOT 60 can be coupled to one or more row interconnection conductors 68, 70, and an output 66 can be coupled to one or more row interconnection conductor 68, 70. In an example, a first plurality of the row interconnection conductors 68 can be coupled to each STE 34, 36 of each GOT 60 within the row 38. A second plurality of the row interconnection conductors 70 can be coupled to only one STE 34, 36 of each GOT 60 within the row 38, but cannot be coupled to the other STE 34, 36 of the GOT 60. In an example, a first half of the second plurality of row interconnection conductors 70 can couple to first half of the STEs 34, 36 within a row 38 (one STE 34 from each GOT 60) and a second half of the second plurality of row interconnection conductors 70 can couple to a second half of the STEs 34, 36 within a row 38 (the other STE 34, 36 from each GOT 60), as will be better illustrated with respect to FIG. 5. The limited connectivity between the second plurality of row interconnection conductors 70 and the STEs 34, 36 is referred to herein as "parity". In an example, the row 38 can also include a special purpose element 58 such as a counter, a configurable Boolean logic element, look-up table, RAM, a field configurable gate array (FPGA), an application specific integrated circuit (ASIC), a configurable processor (e.g., a microprocessor), or other element for performing a special purpose function.

In an example, the special purpose element 58 comprises a counter (also referred to herein as counter 58). In an example, the counter 58 comprises a 12-bit configurable down counter. The 12-bit configurable counter 58 has a counting input, a reset input, and zero-count output. The counting input, when asserted, decrements the value of the counter 58 by one. The reset input, when asserted, causes the counter 58 to load an initial value from an associated register. For the 12-bit counter 58, up to a 12-bit number can be loaded in as the initial value. When the value of the counter 58 is decremented to zero (0), the zero-count output is asserted. The counter 58 also has at least two modes, pulse and hold. When the counter 58 is set to pulse mode, the zero-count output is asserted when the counter 58 reaches zero. For example, the zero-count output is asserted during the processing of an immediately subsequent next data byte, which results in the counter 58 being offset in time with respect to the input character cycle. After the next character cycle, the zero-count output is no longer asserted. In this manner, for example, in the pulse mode, the zero-count output is asserted for one input character processing cycle. When the counter 58 is set to hold mode the zero-count output is asserted during the clock cycle when the counter 58 decrements to zero, and stays asserted until the counter 58 is reset by the reset input being asserted.

In another example, the special purpose element 58 comprises Boolean logic. For example, the Boolean logic may be used to perform logical functions, such as AND, OR, NAND, NOR, Sum of Products (SoP), Negated-Output Sum of Products (NSoP), Negated-Output Product of Sume (NPoS), and Product of Sums (POS) functions. This Boolean logic can be used to extract data from terminal state STEs (corresponding to terminal nodes of a FSM, as discussed later herein) in FSM lattice 30. The data extracted can be used to provide state data to other FSM lattices 30 and/or to provide configuring data used to reconfigure FSM lattice 30, or to reconfigure another FSM lattice 30.

Figure 4A:
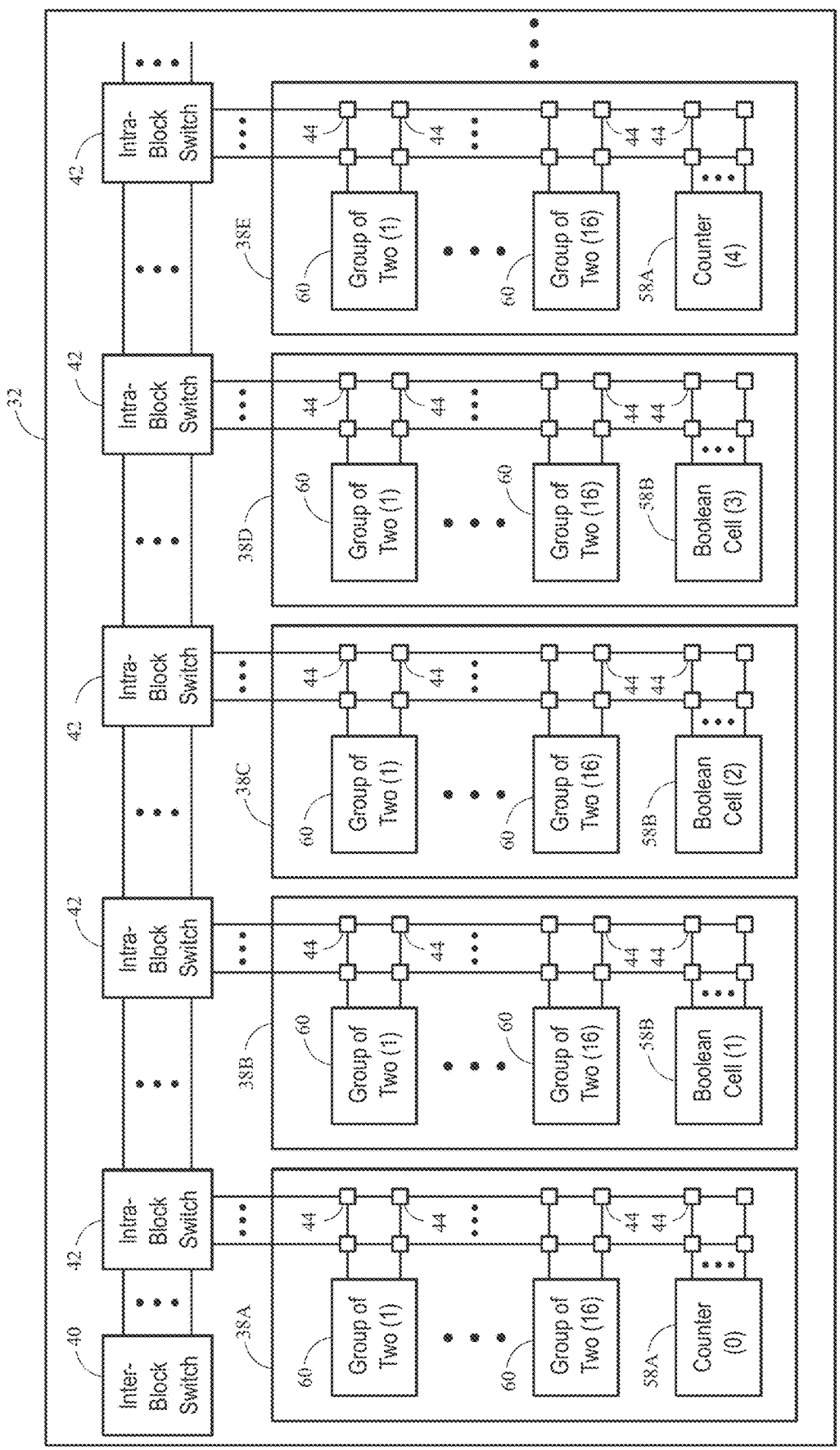
FIG. 4A illustrates a block as in FIG. 3 having counters in rows of the block, according to various embodiments of the invention.

FIG. 4A is an illustration of an example of a block 32 having rows 38 which each include the special purpose element 58. For example, the special purpose elements 58 in the block 32 may include counter cells 58A and Boolean logic cells 58B. While only the rows 38 in row positions 0 through 4 are illustrated in FIG. 4A (e.g., labeled 38A through 38E), each block 32 may have any number of rows 38 (e.g., 16 rows 38), and one or more special purpose elements 58 may be configured in each of the rows 38. For example, in one embodiment, counter cells 58A may be configured in certain rows 38 (e.g., in row positions 0, 4, 8, and 12), while the Boolean logic cells 58B may be configured in the remaining of the 16 rows 38 (e.g., in row positions 1, 2, 3, 5, 6, 7, 9, 10, 11, 13, 14, 15, and 16). The GOT 60 and the special purpose elements 58 may be selectively coupled (e.g., selectively connected) in each row 38 through intra-row switching elements 44, where each row 38 of the block 32 may be selectively coupled with any of the other rows 38 of the block 32 through intra-block switching elements 42.

In some embodiments, each active GOT 60 in each row 38 may output a signal indicating whether one or more conditions are detected (e.g., a search result is detected), and the special purpose element 58 in the row 38 may receive the GOT 60 output to determine whether certain quantifiers of the one or more conditions are met and/or count a number of times a condition is detected. For example, quantifiers of a count operation may include determining whether a condition was detected at least a certain number of times, determining whether a condition was detected no more than a certain number of times, determining whether a condition was detected exactly a certain number of times, and determining whether a condition was detected within a certain range of times.

Outputs from the counter 58A and/or the Boolean logic cell 58B may be communicated through the intra-row switching elements 44 and the intra-block switching elements 42 to perform counting or logic with greater complexity. For example, counters 58A may be configured to implement the quantifiers, such as asserting an output only when a condition is detected an exact number of times. Counters 58A in a block 32 may also be used concurrently, thereby increasing the total bit count of the combined counters to count higher numbers of a detected condition. Furthermore, in some embodiments, different special purpose elements 58 such as counters 58A and Boolean logic cells 58B may be used together. For example, an output of one or more Boolean logic cells 58B may be counted by one or more counters 58A in a block 32.

Figure 5:
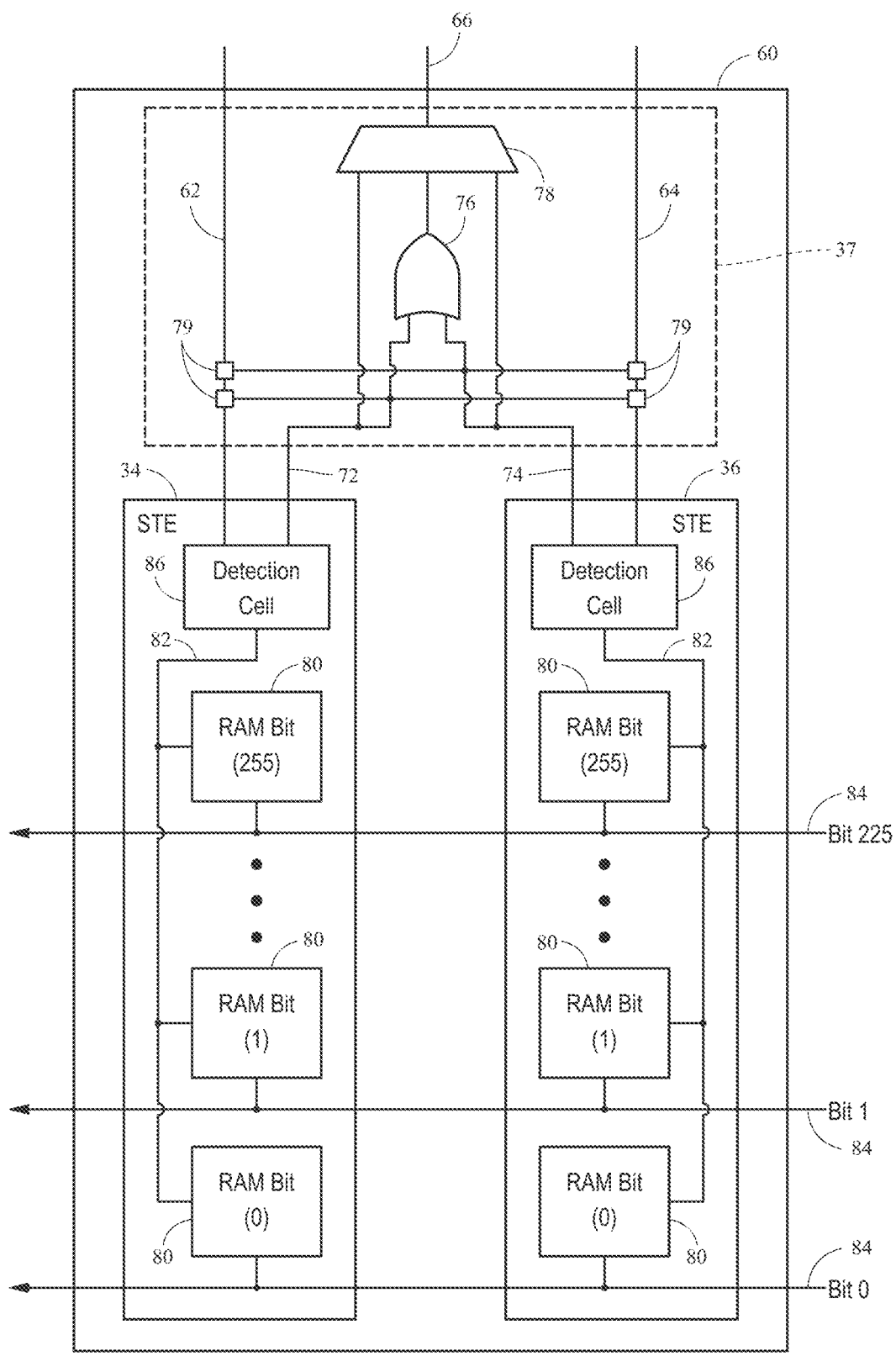
FIG. 5 illustrates an example of a Group of Two of the row of FIG. 4, according to embodiments.

FIG. 5 illustrates an example of a GOT 60. The GOT 60 includes a first STE 34 and a second STE 36 coupled to intra-group circuitry 37. That is, the first STE 34 and a second STE 36 may have inputs 62, 64 and outputs 72, 74 coupled to an OR gate 76 and a 3-to-1 multiplexer 78 of the intra-group circuitry 37. The 3-to-1 multiplexer 78 can be set to couple the output 66 of the GOT 60 to either the first STE 34, the second STE 36, or the OR gate 76. The OR gate 76 can be used to couple together both outputs 72, 74 to form the common output 66 of the GOT 60. In an example, the first and second STE 34, 36 exhibit parity, as discussed above, where the input 62 of the first STE 34 can be coupled to some of the row interconnection conductors 68 and the input 64 of the second STE 36 can be coupled to other row interconnection conductors 70 the common output 66 may be produced which may overcome parity problems. In an example, the two STEs 34, 36 within a GOT 60 can be cascaded and/or looped back to themselves by setting either or both of switching elements 79. The STEs 34, 36 can be cascaded by coupling the output 72, 74 of the STEs 34, 36 to the input 62, 64 of the other STE 34, 36. The STEs 34, 36 can be looped back to themselves by coupling the output 72, 74 to their own input 62, 64. Accordingly, the output 72 of the first STE 34 can be coupled to neither, one, or both of the input 62 of the first STE 34 and the input 64 of the second STE 36. Additionally, as each of the inputs 62, 64 may be coupled to a plurality of row routing lines, an OR gate may be utilized to select any of the inputs from these row routing lines along inputs 62, 64, as well as the outputs 72, 74.

In an example, each state transition element 34, 36 comprises a plurality of memory cells 80, such as those often used in dynamic random access memory (DRAM), coupled in parallel to a detect line 82. One such memory cell 80 comprises a memory cell that can be set to a data state, such as one that corresponds to either a high or a low value (e.g., a 1 or 0). The output of the memory cell 80 is coupled to the detect line 82 and the input to the memory cell 80 receives signals based on data on the data stream line 84. In an example, an input at the input block 52 is decoded to select one or more of the memory cells 80. The selected memory cell 80 provides its stored data state as an output onto the detect line 82. For example, the data received at the input block 52 can be provided to a decoder (not shown) and the decoder can select one or more of the data stream lines 84. In an example, the decoder can convert an 8-bit ACSII character to the corresponding 1 of 256 data stream lines 84.

A memory cell 80, therefore, outputs a high signal to the detect line 82 when the memory cell 80 is set to a high value and the data on the data stream line 84 selects the memory cell 80. When the data on the data stream line 84 selects the memory cell 80 and the memory cell 80 is set to a low value, the memory cell 80 outputs a low signal to the detect line 82. The outputs from the memory cells 80 on the detect line 82 are sensed by a detection cell 86.

In an example, the signal on an input line 62, 64 sets the respective detection cell 86 to either an active or inactive state. When set to the inactive state, the detection cell 86 outputs a low signal on the respective output 72, 74 regardless of the signal on the respective detect line 82. When set to an active state, the detection cell 86 outputs a high signal on the respective output line 72, 74 when a high signal is detected from one of the memory cells 82 of the respective STE 34, 36. When in the active state, the detection cell 86 outputs a low signal on the respective output line 72, 74 when the signals from all of the memory cells 82 of the respective STE 34, 36 are low.

In an example, an STE 34, 36 includes 256 memory cells 80 and each memory cell 80 is coupled to a different data stream line 84. Thus, an STE 34, 36 can be programmed to output a high signal when a selected one or more of the data stream lines 84 have a high signal thereon. For example, the STE 34 can have a first memory cell 80 (e.g., bit 0) set high and all other memory cells 80 (e.g., bits 1-255) set low. When the respective detection cell 86 is in the active state, the STE 34 outputs a high signal on the output 72 when the data stream line 84 corresponding to bit 0 has a high signal thereon. In other examples, the STE 34 can be set to output a high signal when one of multiple data stream lines 84 have a high signal thereon by setting the appropriate memory cells 80 to a high value.

In an example, a memory cell 80 can be set to a high or low value by reading bits from an associated register. Accordingly, the STEs 34 can be configured by storing an image created by the compiler 20 into the registers and loading the bits in the registers into associated memory cells 80. In an example, the image created by the compiler 20 includes a binary image of high and low (e.g., 1 and 0) bits. The image can configure the FSM lattice 30 to implement a FSM by cascading the STEs 34, 36. For example, a first STE 34 can be set to an active state by setting the detection cell 86 to the active state. The first STE 34 can be set to output a high signal when the data stream line 84 corresponding to bit 0 has a high signal thereon. The second STE 36 can be initially set to an inactive state, but can be set to, when active, output a high signal when the data stream line 84 corresponding to bit 1 has a high signal thereon. The first STE 34 and the second STE 36 can be cascaded by setting the output 72 of the first STE 34 to couple to the input 64 of the second STE 36. Thus, when a high signal is sensed on the data stream line 84 corresponding to bit 0, the first STE 34 outputs a high signal on the output 72 and sets the detection cell 86 of the second STE 36 to an active state. When a high signal is sensed on the data stream line 84 corresponding to bit 1, the second STE 36 outputs a high signal on the output 74 to activate another STE 36 or for output from the FSM lattice 30.

In an example, a single FSM lattice 30 is implemented on a single physical device, however, in other examples two or more FSM lattices 30 can be implemented on a single physical device (e.g., physical chip). In an example, each FSM lattice 30 can include a distinct data input block 52, a distinct output block 54, a distinct programming interface 56, and a distinct set of configurable elements. Moreover, each set of configurable elements can react (e.g., output a high or low signal) to data at their corresponding data input block 52. For example, a first set of configurable elements corresponding to a first FSM lattice 30 can react to the data at a first data input block 52 corresponding to the first FSM lattice 30. A second set of configurable elements corresponding to a second FSM lattice 30 can react to a second data input block 52 corresponding to the second FSM lattice 30. Accordingly, each FSM lattice 30 includes a set of configurable elements, wherein different sets of configurable elements can react to different input data. Similarly, each FSM lattice 30, and each corresponding set of configurable elements can provide a distinct output. In some examples, an output block 54 from a first FSM lattice 30 can be coupled to an input block 52 of a second FSM lattice 30, such that input data for the second FSM lattice 30 can include the output data from the first FSM lattice 30 in a hierarchical arrangement of a series of FSM lattices 30.

In an example, an image for loading onto the FSM lattice 30 comprises a plurality of bits of data for configuring the configurable elements, the configurable switching elements, and the special purpose elements within the FSM lattice 30. In an example, the image can be loaded onto the FSM lattice 30 to configure the FSM lattice 30 to provide a desired output based on certain inputs. The output block 54 can provide outputs from the FSM lattice 30 based on the reaction of the configurable elements to data at the data input block 52. An output from the output block 54 can include a single bit indicating a search result of a given pattern, a word comprising a plurality of bits indicating search results and non-search results to a plurality of patterns, and a state vector corresponding to the state of all or certain configurable elements at a given moment. As described, a number of FSM lattices 30 may be included in a state machine engine, such as state machine engine 14, to perform data analysis, such as pattern-recognition (e.g., speech recognition, image recognition, etc.) signal processing, imaging, computer vision, cryptography, and others.

Figure 6:
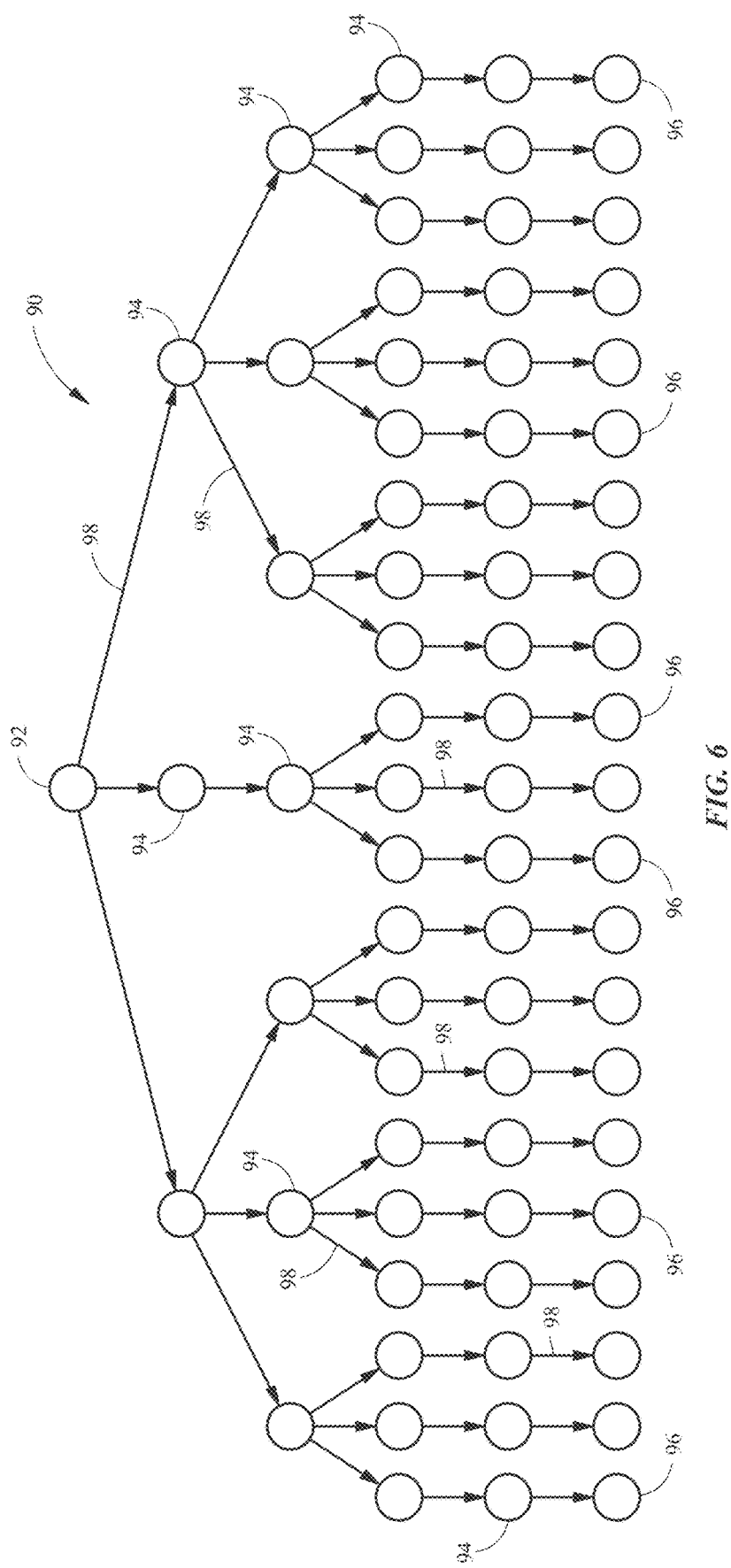
FIG. 6 illustrates an example of a finite state machine graph, according to various embodiments.

FIG. 6 illustrates an example model of a finite state machine (FSM) that can be implemented by the FSM lattice 30. The FSM lattice 30 can be configured (e.g., programmed) as a physical implementation of a FSM. A FSM can be represented as a diagram 90, (e.g., directed graph, undirected graph, pseudograph), which contains one or more root nodes 92. In addition to the root nodes 92, the FSM can be made up of several standard nodes 94 and terminal nodes 96 that are connected to the root nodes 92 and other standard nodes 94 through one or more edges 98. A node 92, 94, 96 corresponds to a state in the FSM. The edges 98 correspond to the transitions between the states.

Each of the nodes 92, 94, 96 can be in either an active or an inactive state. When in the inactive state, a node 92, 94, 96 does not react (e.g., respond) to input data. When in an active state, a node 92, 94, 96 can react to input data. An upstream node 92, 94 can react to the input data by activating a node 94, 96 that is downstream from the node when the input data matches criteria specified by an edge 98 between the upstream node 92, 94 and the downstream node 94, 96. For example, a first node 94 that specifies the character 'b' will activate a second node 94 connected to the first node 94 by an edge 98 when the first node 94 is active and the character 'b' is received as input data. As used herein, "upstream" refers to a relationship between one or more nodes, where a first node that is upstream of one or more other nodes (or upstream of itself in the case of a loop or feedback configuration) refers to the situation in which the first node can activate the one or more other nodes (or can activate itself in the case of a loop). Similarly, "downstream" refers to a relationship where a first node that is downstream of one or more other nodes (or downstream of itself in the case of a loop) can be activated by the one or more other nodes (or can be activated by itself in the case of a loop). Accordingly, the terms "upstream" and "downstream" are used herein to refer to relationships between one or more nodes, but these terms do not preclude the use of loops or other non-linear paths among the nodes.

In the diagram 90, the root node 92 can be initially activated and can activate downstream nodes 94 when the input data matches an edge 98 from the root node 92. Nodes 94 can activate nodes 96 when the input data matches an edge 98 from the node 94. Nodes 94, 96 throughout the diagram 90 can be activated in this manner as the input data is received. A terminal node 96 corresponds to a search result of a sequence of interest in the input data. Accordingly, activation of a terminal node 96 indicates that a sequence of interest has been received as the input data. In the context of the FSM lattice 30 implementing a pattern recognition function, arriving at a terminal node 96 can indicate that a specific pattern of interest has been detected in the input data.

In an example, each root node 92, standard node 94, and terminal node 96 can correspond to a configurable element in the FSM lattice 30. Each edge 98 can correspond to connections between the configurable elements. Thus, a standard node 94 that transitions to (e.g., has an edge 98 connecting to) another standard node 94 or a terminal node 96 corresponds to a configurable element that transitions to (e.g., provides an output to) another configurable element. In some examples, the root node 92 does not have a corresponding configurable element.

As will be appreciated, although the node 92 is described as a root node and nodes 96 are described as terminal nodes, there may not necessarily be a particular "start" or root node and there may not necessarily be a particular "end" or output node. In other words, any node may be a starting point and any node may provide output.

When the FSM lattice 30 is programmed, each of the configurable elements can also be in either an active or inactive state. A given configurable element, when inactive, does not react to the input data at a corresponding data input block 52. An active configurable element can react to the input data at the data input block 52, and can activate a downstream configurable element when the input data matches the setting of the configurable element. When a configurable element corresponds to a terminal node 96, the configurable element can be coupled to the output block 54 to provide an indication of a search result to an external device.

An image loaded onto the FSM lattice 30 via the programming interface 56 can configure the configurable elements and special purpose elements, as well as the connections between the configurable elements and special purpose elements, such that a desired FSM is implemented through the sequential activation of nodes based on reactions to the data at the data input block 52. In an example, a configurable element remains active for a single data cycle (e.g., a single character, a set of characters, a single clock cycle) and then becomes inactive unless re-activated by an upstream configurable element.

A terminal node 96 can be considered to store a compressed history of past search results. For example, the one or more patterns of input data required to reach a terminal node 96 can be represented by the activation of that terminal node 96. In an example, the output provided by a terminal node 96 is binary, for example, the output indicates whether a search result for a pattern of interest has been generated or not. The ratio of terminal nodes 96 to standard nodes 94 in a diagram 90 may be quite small. In other words, although there may be a high complexity in the FSM, the output of the FSM may be small by comparison.

In an example, the output of the FSM lattice 30 can comprise a state vector. The state vector comprises the state (e.g., activated or not activated) of configurable elements of the FSM lattice 30. In another example, the state vector can include the state of all or a subset of the configurable elements whether or not the configurable elements corresponds to a terminal node 96. In an example, the state vector includes the states for the configurable elements corresponding to terminal nodes 96. Thus, the output can include a collection of the indications provided by all terminal nodes 96 of a diagram 90. The state vector can be represented as a word, where the binary indication provided by each terminal node 96 comprises one bit of the word. This encoding of the terminal nodes 96 can provide an effective indication of the detection state (e.g., whether and what sequences of interest have been detected) for the FSM lattice 30.

As mentioned above, the FSM lattice 30 can be programmed to implement a pattern recognition function. For example, the FSM lattice 30 can be configured to recognize one or more data sequences (e.g., signatures, patterns) in the input data. When a data sequence of interest is recognized by the FSM lattice 30, an indication of that recognition can be provided at the output block 54. In an example, the pattern recognition can recognize a string of symbols (e.g., ASCII characters) to, for example, identify malware or other data in network data.

Figure 7:
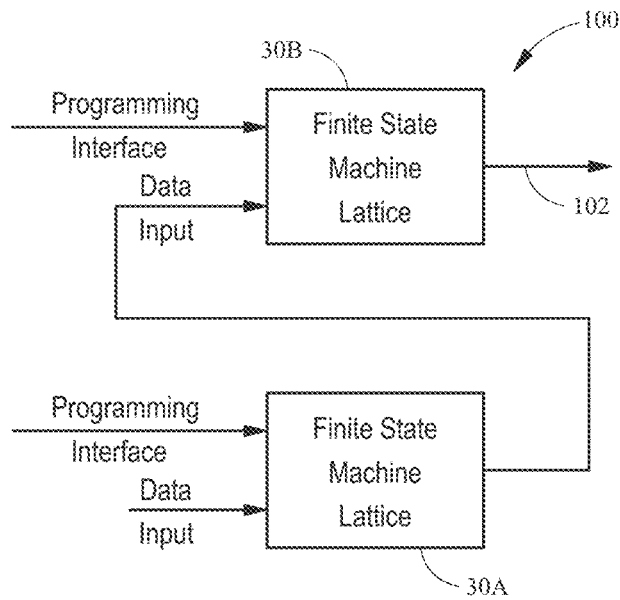
FIG. 7 illustrates an example of two-level hierarchy implemented with FSM lattices, according to various embodiments.

FIG. 7 illustrates an example of hierarchical structure 100, wherein two levels of FSM lattices 30 are coupled in series and used to analyze data. Specifically, in the illustrated embodiment, the hierarchical structure 100 includes a first FSM lattice 30A and a second FSM lattice 30B arranged in series. Each FSM lattice 30 includes a respective data input block 52 to receive data input, a programming interface block 56 to receive configuring signals and an output block 54.

The first FSM lattice 30A is configured to receive input data, for example, raw data at a data input block. The first FSM lattice 30A reacts to the input data as described above and provides an output at an output block. The output from the first FSM lattice 30A is sent to a data input block of the second FSM lattice 30B. The second FSM lattice 30B can then react based on the output provided by the first FSM lattice 30A and provide a corresponding output signal 102 of the hierarchical structure 100. This hierarchical coupling of two FSM lattices 30A and 30B in series provides a means to provide data regarding past search results in a compressed word from a first FSM lattice 30A to a second FSM lattice 30B. The data provided can effectively be a summary of complex matches (e.g., sequences of interest) that were recorded by the first FSM lattice 30A.

Figure 7A:
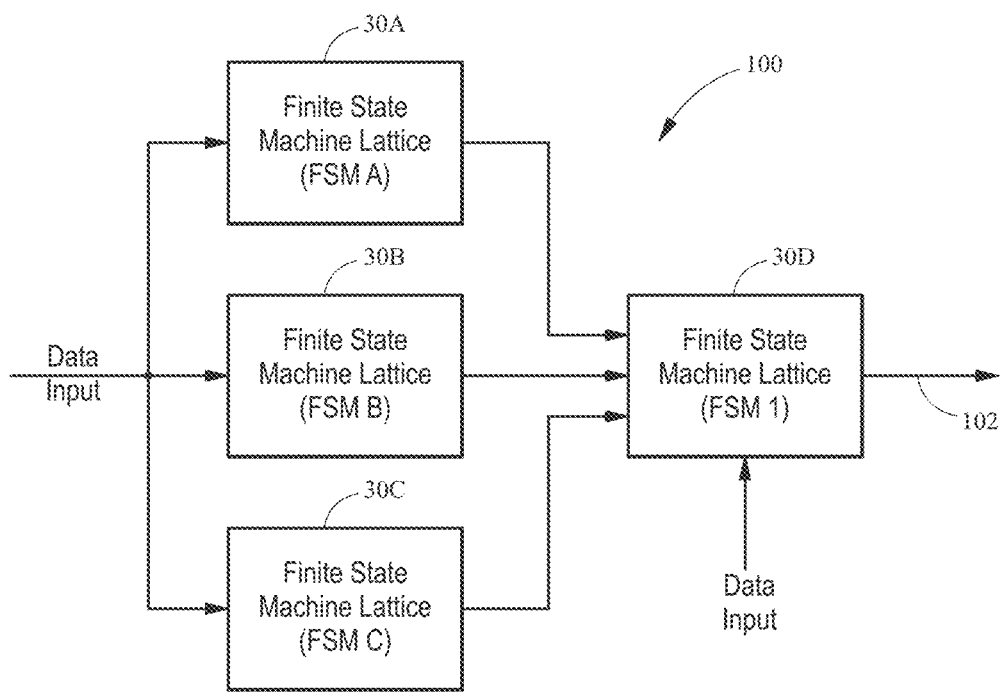
FIG. 7A illustrates a second example of two-level hierarchy implemented with FSM lattices, according to various embodiments.

FIG. 7A illustrates a second two-level hierarchy 100 of FSM lattices 30A, 30B, 30C, and 30D, which allows the overall FSM 100 (inclusive of all or some of FSM lattices 30A, 30B, 30C, and 30D) to perform two independent levels of analysis of the input data. The first level (e.g., FSM lattice 30A, FSM lattice 30B, and/or FSM lattice 30C) analyzes the same data stream, which includes data inputs to the overall FSM 100. The outputs of the first level (e.g., FSM lattice 30A, FSM lattice 30B, and/or FSM lattice 30C) become the inputs to the second level, (e.g., FSM lattice 30D). FSM lattice 30D performs further analysis of the combination the analysis already performed by the first level (e.g., FSM lattice 30A, FSM lattice 30B, and/or FSM lattice 30C). By connecting multiple FSM lattices 30A, 30B, and 30C together, increased knowledge about the data stream input may be obtained by FSM lattice 30D.

The first level of the hierarchy (implemented by one or more of FSM lattice 30A, FSM lattice 30B, and FSM lattice 30C) can, for example, perform processing directly on a raw data stream. For example, a raw data stream can be received at an input block 52 of the first level FSM lattices 30A, 30B, and/or 30C and the configurable elements of the first level FSM lattices 30A, 30B, and/or 30C can react to the raw data stream. The second level (implemented by the FSM lattice 30D) of the hierarchy can process the output from the first level. For example, the second level FSM lattice 30D receives the output from an output block 54 of the first level FSM lattices 30A, 30B, and/or 30C at an input block 52 of the second level FSM lattice 30D and the configurable elements of the second level FSM lattice 30D can react to the output of the first level FSM lattices 30A, 30B, and/or 30C. Accordingly, in this example, the second level FSM lattice 30D does not receive the raw data stream as an input, but rather receives the indications of search results for patterns of interest that are generated from the raw data stream as determined by one or more of the first level FSM lattices 30A, 30B, and/or 30C. Thus, the second level FSM lattice 30D can implement a FSM 100 that recognizes patterns in the output data stream from the one or more of the first level FSM lattices 30A, 30B, and/or 30C. However, it should also be appreciated that the second level FSM lattice 30D can additionally receive the raw data stream as an input, for example, in conjunction with the indications of search results for patterns of interest that are generated from the raw data stream as determined by one or more of the first level FSM lattices 30A, 30B, and/or 30C. It should be appreciated that the second level FSM lattice 30D may receive inputs from multiple other FSM lattices in addition to receiving output from the one or more of the first level FSM lattices 30A, 30B, and/or 30C. Likewise, the second level FSM lattice 30D may receive inputs from other devices. The second level FSM lattice 30D may combine these multiple inputs to produce outputs. Finally, while only two levels of FSM lattices 30A, 30B, 30C, and 30D are illustrated, it is envisioned that additional levels of FSM lattices may be stacked such that there are, for example, three, four, 10, 100, or more levels of FSM lattices.

Figure 8:
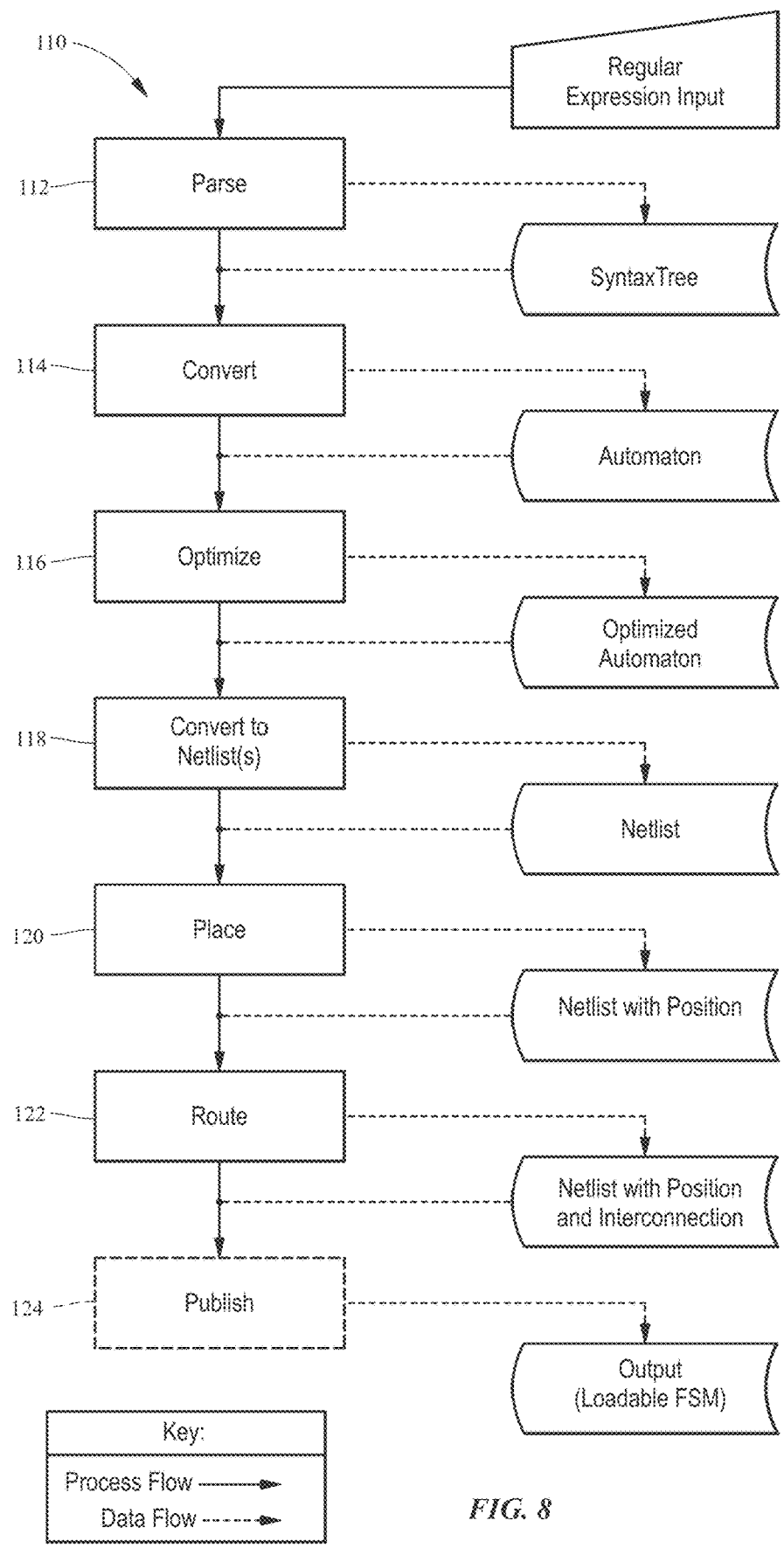
FIG. 8 illustrates an example of a method for a compiler to convert source code into a binary file for programming of the FSM lattice of FIG. 2, according to various embodiments.

FIG. 8 illustrates an example of a method 110 for a compiler to convert source code into an image used to configure a FSM lattice, such as lattice 30, to implement a FSM. Method 110 includes parsing the source code into a syntax tree (block 112), converting the syntax tree into an automaton (block 114), optimizing the automaton (block 116), converting the automaton into a netlist (block 118), placing the netlist on hardware (block 120), routing the netlist (block 122), and publishing the resulting image (block 124).

In an example, the compiler 20 includes an application programming interface (API) that allows software developers to create images for implementing FSMs on the FSM lattice 30. The compiler 20 provides methods to convert an input set of regular expressions in the source code into an image that is configured to configure the FSM lattice 30. The compiler 20 can be implemented by instructions for a computer having a von Neumann architecture. These instructions can cause a processor 12 on the computer to implement the functions of the compiler 20. For example, the instructions, when executed by the processor 12, can cause the processor 12 to perform actions as described in blocks 112, 114, 116, 118, 120, 122, and 124 on source code that is accessible to the processor 12.

In an example, the source code describes search strings for identifying patterns of symbols within a group of symbols. To describe the search strings, the source code can include a plurality of regular expressions (regexes). A regex can be a string for describing a symbol search pattern. Regexes are widely used in various computer domains, such as programming languages, text editors, network security, and others. In an example, the regular expressions supported by the compiler include criteria for the analysis of unstructured data. Unstructured data can include data that is free form and has no indexing applied to words within the data. Words can include any combination of bytes, printable and non-printable, within the data. In an example, the compiler can support multiple different source code languages for implementing regexes including Perl, (e.g., Perl compatible regular expressions (PCRE)), PHP, Java, and .NET languages.

At block 112 the compiler 20 can parse the source code to form an arrangement of relationally connected operators, where different types of operators correspond to different functions implemented by the source code (e.g., different functions implemented by regexes in the source code). Parsing source code can create a generic representation of the source code. In an example, the generic representation comprises an encoded representation of the regexs in the source code in the form of a tree graph known as a syntax tree. The examples described herein refer to the arrangement as a syntax tree (also known as an "abstract syntax tree") in other examples, however, a concrete syntax tree as part of the abstract syntax tree, a concrete syntax tree in place of the abstract syntax tree, or other arrangement can be used.

Since, as mentioned above, the compiler 20 can support multiple languages of source code, parsing converts the source code, regardless of the language, into a non-language specific representation, e.g., a syntax tree. Thus, further processing (blocks 114, 116, 118, 120) by the compiler 20 can work from a common input structure regardless of the language of the source code.

As noted above, the syntax tree includes a plurality of operators that are relationally connected. A syntax tree can include multiple different types of operators. For example, different operators can correspond to different functions implemented by the regexes in the source code.

At block 114, the syntax tree is converted into an automaton. An automaton comprises a software model of a FSM which may, for example, comprise a plurality of states. In order to convert the syntax tree into an automaton, the operators and relationships between the operators in the syntax tree are converted into states with transitions between the states. Moreover, in one embodiment, conversion of the automaton is accomplished based on the hardware of the FSM lattice 30.

In an example, input symbols for the automaton include the symbols of the alphabet, the numerals 0-9, and other printable characters. In an example, the input symbols are represented by the byte values 0 through 255 inclusive. In an example, an automaton can be represented as a directed graph where the nodes of the graph correspond to the set of states. In an example, a transition from state p to state q on an input symbol α, i.e. δ(p,α), is shown by a directed connection from node p to node q. In an example, a reversal of an automaton produces a new automaton where each transition p→q on some symbol α is reversed q→p on the same symbol. In a reversal, start states become final states and the final states become start states. In an example, the language recognized (e.g., matched) by an automaton is the set of all possible character strings which when input sequentially into the automaton will reach a final state. Each string in the language recognized by the automaton traces a path from the start state to one or more final states.

At block 116, after the automaton is constructed, the automaton is optimized to reduce its complexity and size, among other things. The automaton can be optimized by combining redundant states.

At block 118, the optimized automaton is converted into a netlist. Converting the automaton into a netlist maps each state of the automaton to a hardware element (e.g., STEs 34, 36, other elements) on the FSM lattice 30, and determines the connections between the hardware elements.

At block 120, the netlist is placed to select a specific hardware element of the target device (e.g., STEs 34, 36, special purpose elements 58) corresponding to each node of the netlist. In an example, placing selects each specific hardware element based on general input and output constraints for of the FSM lattice 30.

At block 122, the placed netlist is routed to determine the settings for the configurable switching elements (e.g., inter-block switching elements 40, intra-block switching elements 42, and intra-row switching elements 44) in order to couple the selected hardware elements together to achieve the connections describe by the netlist. In an example, the settings for the configurable switching elements are determined by determining specific conductors of the FSM lattice 30 that will be used to connect the selected hardware elements, and the settings for the configurable switching elements. Routing can take into account more specific limitations of the connections between the hardware elements than can be accounted for via the placement at block 120. Accordingly, routing may adjust the location of some of the hardware elements as determined by the global placement in order to make appropriate connections given the actual limitations of the conductors on the FSM lattice 30.

Once the netlist is placed and routed, the placed and routed netlist can be converted into a plurality of bits for configuring a FSM lattice 30. The plurality of bits are referred to herein as an image (e.g., binary image).

At block 124, an image is published by the compiler 20. The image comprises a plurality of bits for configuring specific hardware elements of the FSM lattice 30. The bits can be loaded onto the FSM lattice 30 to configure the state of STEs 34, 36, the special purpose elements 58, and the configurable switching elements such that the programmed FSM lattice 30 implements a FSM having the functionality described by the source code. Placement (block 120) and routing (block 122) can map specific hardware elements at specific locations in the FSM lattice 30 to specific states in the automaton. Accordingly, the bits in the image can configure the specific hardware elements to implement the desired function(s). In an example, the image can be published by saving the machine code to a computer readable medium. In another example, the image can be published by displaying the image on a display device. In still another example, the image can be published by sending the image to another device, such as a configuring device for loading the image onto the FSM lattice 30. In yet another example, the image can be published by loading the image onto a FSM lattice (e.g., the FSM lattice 30).

In an example, an image can be loaded onto the FSM lattice 30 by either directly loading the bit values from the image to the STEs 34, 36 and other hardware elements or by loading the image into one or more registers and then writing the bit values from the registers to the STEs 34, 36 and other hardware elements. In an example, the hardware elements (e.g., STEs 34, 36, special purpose elements 58, configurable switching elements 40, 42, 44) of the FSM lattice 30 are memory mapped such that a configuring device and/or computer can load the image onto the FSM lattice 30 by writing the image to one or more memory addresses.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

Figure 9:
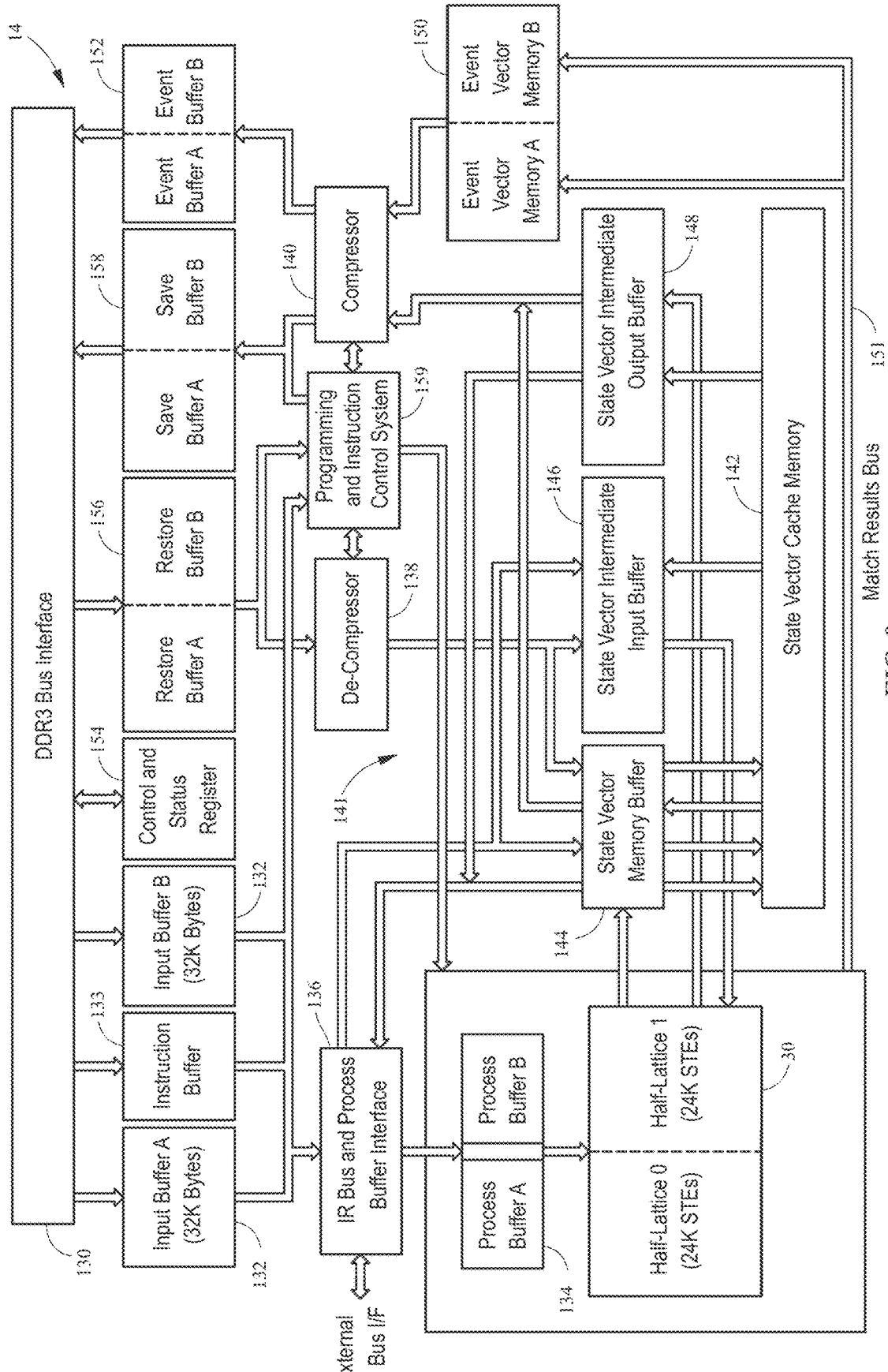
FIG. 9 illustrates a state machine engine, according to various embodiments.

Referring now to FIG. 9, an embodiment of the state machine engine 14 (e.g., a single device on a single chip) is illustrated. As previously described, the state machine engine 14 is configured to receive data from a source, such as the memory 16 over a data bus. In the illustrated embodiment, data may be sent to the state machine engine 14 through a bus interface, such as a double data rate three (DDR3) bus interface 130. The DDR3 bus interface 130 may be capable of exchanging (e.g., providing and receiving) data at a rate greater than or equal to 1 GByte/sec. Such a data exchange rate may be greater than a rate that data is analyzed by the state machine engine 14. As will be appreciated, depending on the source of the data to be analyzed, the bus interface 130 may be any suitable bus interface for exchanging data to and from a data source to the state machine engine 14, such as a NAND Flash interface, peripheral component interconnect (PCI) interface, gigabit media independent interface (GMMI), etc. As previously described, the state machine engine 14 includes one or more FSM lattices 30 configured to analyze data. Each FSM lattice 30 may be divided into two half-lattices. In the illustrated embodiment, each half lattice may include 24K STEs (e.g., STEs 34, 36), such that the lattice 30 includes 48K STEs. The lattice 30 may comprise any desirable number of STEs, arranged as previously described with regard to FIGS. 2-5. Further, while only one FSM lattice 30 is illustrated, the state machine engine 14 may include multiple FSM lattices 30, as previously described.

Data to be analyzed may be received at the bus interface 130 and provided to the FSM lattice 30 through a number of buffers and buffer interfaces. In the illustrated embodiment, the data path includes input buffers 132, an instruction buffer 133, process buffers 134, and an inter-rank (IR) bus and process buffer interface 136. The input buffers 132 are configured to receive and temporarily store data to be analyzed. In one embodiment, there are two input buffers 132 (input buffer A and input buffer B). Data may be stored in one of the two data input 132, while data is being emptied from the other input buffer 132, for analysis by the FSM lattice 30. The bus interface 130 may be configured to provide data to be analyzed to the input buffers 132 until the input buffers 132 are full. After the input buffers 132 are full, the bus interface 130 may be configured to be free to be used for other purpose (e.g., to provide other data from a data stream until the input buffers 132 are available to receive additional data to be analyzed). In the illustrated embodiment, the input buffers 132 may be 32 KBytes each. The instruction buffer 133 is configured to receive instructions from the processor 12 via the bus interface 130, such as instructions that correspond to the data to be analyzed and instructions that correspond to configuring the state machine engine 14. The IR bus and process buffer interface 136 may facilitate providing data to the process buffer 134. The IR bus and process buffer interface 136 can be used to ensure that data is processed by the FSM lattice 30 in order. The IR bus and process buffer interface 136 may coordinate the exchange of data, timing data, packing instructions, etc. such that data is received and analyzed correctly. Generally, the IR bus and process buffer interface 136 allows the analyzing of multiple data sets in parallel through a logical rank of FSM lattices 30. For example, multiple physical devices (e.g., state machine engines 14, chips, separate devices) may be arranged in a rank and may provide data to each other via the IR bus and process buffer interface 136. For purposes of this application the term "rank" refers to a set of state machine engines 14 connected to the same chip select. In the illustrated embodiment, the IR bus and process buffer interface 136 may include a 32 bit data bus. In other embodiments, the IR bus and process buffer interface 136 may include any suitable data bus, such as a 128 bit data bus.

In the illustrated embodiment, the state machine engine 14 also includes a de-compressor 138 and a compressor 140 to aid in providing state vector data through the state machine engine 14. The compressor 140 and de-compressor 138 work in conjunction such that the state vector data can be compressed to minimize the data providing times. By compressing the state vector data, the bus utilization time may be minimized. The compressor 140 and de-compressor 138 can also be configured to handle state vector data of varying burst lengths. By padding compressed state vector data and including an indicator as to when each compressed region ends, the compressor 140 may improve the overall processing speed through the state machine engine 14. The compressor 140 may be used to compress results data after analysis by the FSM lattice 30. The compressor 140 and de-compressor 138 may also be used to compress and decompress configuration data. In one embodiment, the compressor 140 and de-compressor 138 may be disabled (e.g., turned off) such that data flowing to and/or from the compressor 140 and de-compressor 138 is not modified.

As previously described, an output of the FSM lattice 30 can comprise a state vector. The state vector comprises the state (e.g., activated or not activated) of the STEs 34, 36 of the FSM lattice 30 and the dynamic (e.g., current) count of the counter 58. The state machine engine 14 includes a state vector system 141 having a state vector cache memory 142, a state vector memory buffer 144, a state vector intermediate input buffer 146, and a state vector intermediate output buffer 148. The state vector system 141 may be used to store multiple state vectors of the FSM lattice 30 and to provide a state vector to the FSM lattice 30 to restore the FSM lattice 30 to a state corresponding to the provided state vector. For example, each state vector may be temporarily stored in the state vector cache memory 142. For example, the state of each STE 34, 36 may be stored, such that the state may be restored and used in further analysis at a later time, while freeing the STEs 34, 36 for further analysis of a new data set (e.g., search terms). Like a typical cache, the state vector cache memory 142 allows storage of state vectors for quick retrieval and use, here by the FSM lattice 30, for instance. In the illustrated embodiment, the state vector cache memory 142 may store up to 512 state vectors.

As will be appreciated, the state vector data may be exchanged between different state machine engines 14 (e.g., chips) in a rank. The state vector data may be exchanged between the different state machine engines 14 for various purposes such as: to synchronize the state of the STEs 34, 36 of the FSM lattices 30 of the state machine engines 14, to perform the same functions across multiple state machine engines 14, to reproduce results across multiple state machine engines 14, to cascade results across multiple state machine engines 14, to store a history of states of the STEs 34, 36 used to analyze data that is cascaded through multiple state machine engines 14, and so forth. Furthermore, it should be noted that within a state machine engine 14, the state vector data may be used to quickly configure the STEs 34, 36 of the FSM lattice 30. For example, the state vector data may be used to restore the state of the STEs 34, 36 to an initialized state (e.g., to prepare for a new input data set), or to restore the state of the STEs 34, 36 to prior state (e.g., to continue searching of an interrupted or "split" input data set). In certain embodiments, the state vector data may be provided to the bus interface 130 so that the state vector data may be provided to the processor 12 (e.g., for analysis of the state vector data, reconfiguring the state vector data to apply modifications, reconfiguring the state vector data to improve efficiency of the STEs 34, 36, and so forth).

For example, in certain embodiments, the state machine engine 14 may provide cached state vector data (e.g., data stored by the state vector system 141) from the FSM lattice 30 to an external device. The external device may receive the state vector data, modify the state vector data, and provide the modified state vector data to the state machine engine 14 for configuring the FSM lattice 30. Accordingly, the external device may modify the state vector data so that the state machine engine 14 may skip states (e.g., jump around) as desired.

The state vector cache memory 142 may receive state vector data from any suitable device. For example, the state vector cache memory 142 may receive a state vector from the FSM lattice 30, another FSM lattice 30 (e.g., via the IR bus and process buffer interface 136), the de-compressor 138, and so forth. In the illustrated embodiment, the state vector cache memory 142 may receive state vectors from other devices via the state vector memory buffer 144. Furthermore, the state vector cache memory 142 may provide state vector data to any suitable device. For example, the state vector cache memory 142 may provide state vector data to the state vector memory buffer 144, the state vector intermediate input buffer 146, and the state vector intermediate output buffer 148.

Additional buffers, such as the state vector memory buffer 144, state vector intermediate input buffer 146, and state vector intermediate output buffer 148, may be utilized in conjunction with the state vector cache memory 142 to accommodate rapid retrieval and storage of state vectors, while processing separate data sets with interleaved packets through the state machine engine 14. In the illustrated embodiment, each of the state vector memory buffer 144, the state vector intermediate input buffer 146, and the state vector intermediate output buffer 148 may be configured to temporarily store one state vector. The state vector memory buffer 144 may be used to receive state vector data from any suitable device and to provide state vector data to any suitable device. For example, the state vector memory buffer 144 may be used to receive a state vector from the FSM lattice 30, another FSM lattice 30 (e.g., via the IR bus and process buffer interface 136), the de-compressor 138, and the state vector cache memory 142. As another example, the state vector memory buffer 144 may be used to provide state vector data to the IR bus and process buffer interface 136 (e.g., for other FSM lattices 30), the compressor 140, and the state vector cache memory 142.

Likewise, the state vector intermediate input buffer 146 may be used to receive state vector data from any suitable device and to provide state vector data to any suitable device. For example, the state vector intermediate input buffer 146 may be used to receive a state vector from an FSM lattice 30 (e.g., via the IR bus and process buffer interface 136), the de-compressor 138, and the state vector cache memory 142. As another example, the state vector intermediate input buffer 146 may be used to provide a state vector to the FSM lattice 30. Furthermore, the state vector intermediate output buffer 148 may be used to receive a state vector from any suitable device and to provide a state vector to any suitable device. For example, the state vector intermediate output buffer 148 may be used to receive a state vector from the FSM lattice 30 and the state vector cache memory 142. As another example, the state vector intermediate output buffer 148 may be used to provide a state vector to an FSM lattice 30 (e.g., via the IR bus and process buffer interface 136) and the compressor 140.

Once a result of interest is produced by the FSM lattice 30, an event vector may be stored in a event vector memory 150, whereby, for example, the event vector indicates at least one search result (e.g., detection of a pattern of interest). The event vector can then be sent to an event buffer 152 for transmission over the bus interface 130 to the processor 12, for example. As previously described, the results may be compressed. The event vector memory 150 may include two memory elements, memory element A and memory element B, each of which contains the results obtained by processing the input data in the corresponding input buffers 132 (e.g., input buffer A and input buffer B). In one embodiment, each of the memory elements may be DRAM memory elements or any other suitable storage devices. In some embodiments, the memory elements may operate as initial buffers to buffer the event vectors received from the FSM lattice 30, along results bus 151. For example, memory element A may receive event vectors, generated by processing the input data from input buffer A, along results bus 151 from the FSM lattice 30. Similarly, memory element B may receive event vectors, generated by processing the input data from input buffer B, along results bus 151 from the FSM lattice 30.

In one embodiment, the event vectors provided to the results memory 150 may indicate that a final result has been found by the FSM lattice 30. For example, the event vectors may indicate that an entire pattern has been detected. Alternatively, the event vectors provided to the results memory 150 may indicate, for example, that a particular state of the FSM lattice 30 has been reached. For example, the event vectors provided to the results memory 150 may indicate that one state (i.e., one portion of a pattern search) has been reached, so that a next state may be initiated. In this way, the event vector 150 may store a variety of types of results.

In some embodiments, IR bus and process buffer interface 136 may provide data to multiple FSM lattices 30 for analysis. This data may be time multiplexed. For example, if there are eight FSM lattices 30, data for each of the eight FSM lattices 30 may be provided to all of eight IR bus and process buffer interfaces 136 that correspond to the eight FSM lattices 30. Each of the eight IR bus and process buffer interfaces 136 may receive an entire data set to be analyzed. Each of the eight IR bus and process buffer interfaces 136 may then select portions of the entire data set relevant to the FSM lattice 30 associated with the respective IR bus and process buffer interface 136. This relevant data for each of the eight FSM lattices 30 may then be provided from the respective IR bus and process buffer interfaces 136 to the respective FSM lattice 30 associated therewith.

The event vector 150 may operate to correlate each received result with a data input that generated the result. To accomplish this, a respective result indicator may be stored corresponding to, and in some embodiments, in conjunction with, each event vector received from the results bus 151. In one embodiment, the result indicators may be a single bit flag. In another embodiment, the result indicators may be a multiple bit flag. If the result indicators may include a multiple bit flag, the bit positions of the flag may indicate, for example, a count of the position of the input data stream that corresponds to the event vector, the lattice that the event vectors correspond to, a position in set of event vectors, or other identifying information. These results indicators may include one or more bits that identify each particular event vector and allow for proper grouping and transmission of event vectors, for example, to compressor 140. Moreover, the ability to identify particular event vectors by their respective results indicators may allow for selective output of desired event vectors from the event vector memory 150. For example, only particular event vectors generated by the FSM lattice 30 may be selectively latched as an output. These result indicators may allow for proper grouping and provision of results, for example, to compressor 140. Moreover, the ability to identify particular event vectors by their respective result indicators allow for selective output of desired event vectors from the result memory 150. Thus, only particular event vectors provided by the FSM lattice 30 may be selectively provided to compressor 140.

Additional registers and buffers may be provided in the state machine engine 14, as well. In one embodiment, for example, a buffer may store information related to more than one process whereas a register may store information related to a single process. For instance, the state machine engine 14 may include control and status registers 154. In addition, a program buffer system (e.g., restore buffers 156) may be provided for initializing the FSM lattice 30. For example, initial (e.g., starting) state vector data may be provided from the program buffer system to the FSM lattice 30 (e.g., via the de-compressor 138). The de-compressor 138 may be used to decompress configuration data (e.g., state vector data, routing switch data, STE 34, 36 states, Boolean function data, counter data, match MUX data) provided to program the FSM lattice 30.

Similarly, a repair map buffer system (e.g., save buffers 158) may also be provided for storage of data (e.g., save maps) for setup and usage. The data stored by the repair map buffer system may include data that corresponds to repaired hardware elements, such as data identifying which STEs 34, 36 were repaired. The repair map buffer system may receive data via any suitable manner. For example, data may be provided from a "fuse map" memory, which provides the mapping of repairs done on a device during final manufacturing testing, to the save buffers 158. As another example, the repair map buffer system may include data used to modify (e.g., customize) a standard programming file so that the standard programming file may operate in a FSM lattice 30 with a repaired architecture (e.g., bad STEs 34, 36 in a FSM lattice 30 may be bypassed so they are not used). The compressor 140 may be used to compress data provided to the save buffers 158 from the fuse map memory. As illustrated, the bus interface 130 may be used to provide data to the restore buffers 156 and to provide data from the save buffers 158. As will be appreciated, the data provided to the restore buffers 156 and/or provided from the save buffers 158 may be compressed. In some embodiments, data is provided to the bus interface 130 and/or received from the bus interface 130 via a device external to the state machine engine 14 (e.g., the processor 12, the memory 16, the compiler 20, and so forth). The device external to the state machine engine 14 may be configured to receive data provided from the save buffers 158, to store the data, to analyze the data, to modify the data, and/or to provide new or modified data to the restore buffers 156.

The state machine engine 14 includes a lattice programming and instruction control system 159 used to configure (e.g., program) the FSM lattice 30 as well as provide inserted instructions, as will be described in greater detail below. As illustrated, the lattice programming and instruction control system 159 may receive data (e.g., configuration instructions) from the instruction buffer 133. Furthermore, the lattice programming and instruction control system 159 may receive data (e.g., configuration data) from the restore buffers 156. The lattice programming and instruction control system 159 may use the configuration instructions and the configuration data to configure the FSM lattice 30 (e.g., to configure routing switches, STEs 34, 36, Boolean cells, counters, match MUX) and may use the inserted instructions to correct errors during the operation of the state machine engine 14. The lattice programming and instruction control system 159 may also use the de-compressor 138 to de-compress data and the compressor 140 to compress data (e.g., for data exchanged with the restore buffers 156 and the save buffers 158).

The Automata Processor Workbench (AP Workbench) is an application for creating and editing designs of AP networks (e.g., one or more portions of the state machine engine 14, one or more portions of the FSM lattice 30, or the like) based on, for example, Micron's Automata Network Markup Language (ANML). The ANML documentation can be found online at http://www.micronautomata.com. These designs may be imported from existing ANML files and the edited designs exported back to ANML. If ANML does not contain any information regarding visual layout, color, etc. an intermediate file format (graphML) can be used to persist this information. The AP Workbench uses this format as its native input/output mode when creating new designs, saving them and opening existing designs.

This section of the application will cover the use of the AP Workbench and is broken down into three main sections: 1) Menus and Toolbar Buttons; 2) Guide to getting started; and 3) Advanced topics.

The section on menus and toolbar buttons should serve as a reference and is divided into parts that follow the Menu layout. For instance, there is a subsection for each menu (File, View, Layout, etc.) with each subsection explaining the function of every item in the menu. Buttons in the toolbar are shortcuts for menu items.

Throughout this application, menu items followed by an ellipsis indicate that selecting this action will result in the appearance of a dialog to obtain additional information. Menu items without an ellipsis take immediate action. If context is required, a menu item will be specified with the parent menu prepended. For example, the "Print . . . " menu item found in the "File" menu would be specified as "File-→Print . . . ". Likewise, items in submenus will be expanded until the top-level menu is reached, as in the Smart Organic Layout action: "Layout→Organic→Smart . . . ."

The AP Workbench represents automata networks in a graphical manner, insulating the user from the complexities of XML in the ANML language. It can do this this by storing a network graph in a file that contains all the necessary ANML data as well as the visual data to position and size network elements. AP Workbench can store this file in the "root" of directory representing the project of the same name, i.e., project.graphml. Other necessary files can be stored here as well, including project settings and window layouts. Additionally, every project can have a default location created to store project macros (more on this later). Every graph in the AP Workbench paradigm can be represented as a unique file.

Automata Processor hardware constructs can be represented in the AP Workbench as graphical icons. As such, these icons can have properties that directly reflect the properties of the underlying hardware element, e.g., STE can have a symbol(s) to match against, Counter can have a target value, etc. Every design or macro can have a special node that acts as a title for the graph and provides a place to edit the metadata. For example, the properties of a project (description, etc.) can be opened by selecting the title node. Note elements may not be part of the ANML specification and can be for graph documentation purposes only. In the illustrated embodiment, all graph elements are displayed in the palette on the right hand side of the workbench window.

Automata Network elements can be grouped together into functional components called macros. These macros may or may not be capable of running on their own, but can be included into the "root" graph of a project. Each macro can be stored in a distinct Graphml-format file in a library directory. By default, each project can have a "macros" directory. Macros can be dragged off of the project library palette into the current graph, creating an instance of the macro within the network. The instance can then have its properties edited as any other element. Additionally, the macro itself can be edited just as the root graph. Upon saving, edits to the macro will be reflected in any graph referencing that macro.

AP Workbench can provide a way to test a project design via the simulation feature which simulates the running of a network on hardware given an input file. Simulation will validate and build the entire network including any referenced macros and allow the user to step over a symbol file of their choosing one symbol at a time. The Workbench will provide color feedback on the state of each element, as well as lists of elements that have indicated reports. This feature allows for proofing or debugging a network design without need to compile and debug on hardware.

Figure 10:
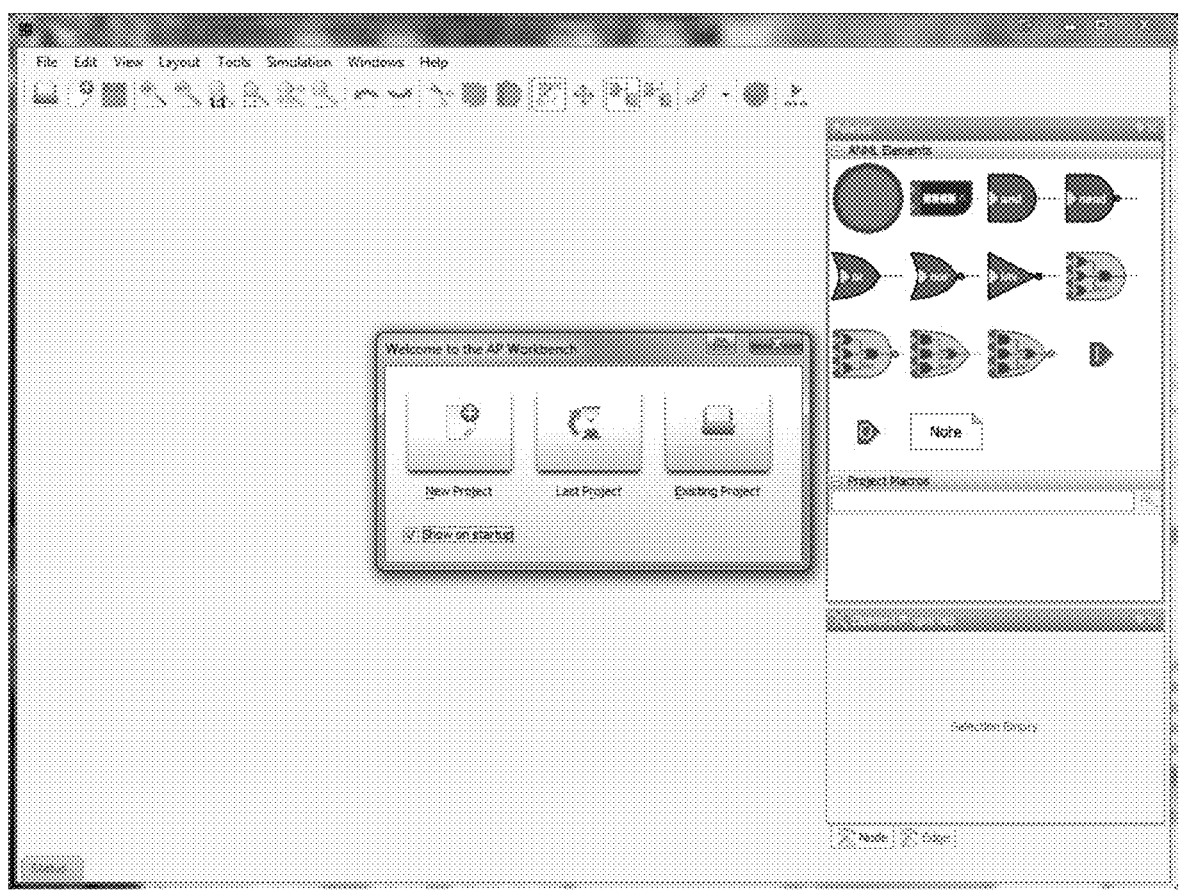
FIG. 10 illustrates an example of an Automata Processor (AP) Workbench startup.

As illustrated in FIG. 10, when a user first opens the AP Workbench, they can be presented with a small Welcome dialog with, for example, 3 options-New Project, Last Project and Existing Project. If the user selects New Project, they can be presented with the Create New Project dialog. The user may then browse to the location where they will store their projects and type in the name of their project. When they press "OK", a folder with this name can be created and the various files and sub-folders associated with the project can be stored here.

The default layout of the application can devote the majority of the workspace to the editing area for the user's design. On the top right-hand side can be the Palette with, for example, two default sections—ANML Elements and Project Macros. Below the Palette window can be a tabbed stack of windows labeled Node and Edge. These can be the properties of the Node or Edge selected in the main editing area (the current graph).

At the bottom of the application can be a tab labeled Status. Hovering over the tab or clicking on it can "unhide" the contents of the window. Information about operations can appear in this window. Any status that may require the user's attention (warnings or errors) can cause the tab to flash. At the top of the application can be the main menu bar with a row of buttons just below it (the Toolbar). The Toolbar buttons can be grouped. For example, from left to right they can be:
    file operations (open, create, save)
    view operations (various zoom operators)
    edit operations (undo/redo, cut/copy/paste)
    graph modes (edit, navigation)
    snap line and color
    quick layout
    validation
    start/stop simulation.

After opening you're a first project, the user can drag a State Transition Element (the first element in the top row) from the ANML Elements section of the Palette and drop it on the graph. If the user hovers over the instance of the element in the graph, they can be presented with, for example, three smaller circles around the perimeter. Two of these can be used for creating edges (incoming or outgoing) and the third can be for editing the properties of the element.

The element can be surrounded by a series of small black squares at the 8 compass points. These can indicate that the element is selected. The Element Properties window (in the lower right corner of the application by default) can display the properties for the selected element. To change the symbol set for the State Transition Element (STE), a user can:
    use the property sheet
    use a menu operation
    invoke a keyboard shortcut
    double-click with the mouse If the user places the mouse cursor in the center of the STE and double-click, a cursor can be presented that appears near their mouse location. At this point, anything the user types can become part of the symbol set. For example, if the user types "[aA]" and presses Enter to complete the edit, the appearance of the STE can change and the "Symbol" field in the property sheet can also reflect the change.

A user can click on the STE element to select it. A user can type, for example, Ctrl-I (control key plus "i") to edit the Id. In one or more embodiments, a cursor can then appears near the middle of the element. The user can then enter the id for the element.

According to one or more embodiments, an id may consist solely of letters, numbers and underscores. A user can type "ID1" and press Enter to complete the edit. In one or more embodiments, by default, the ID of the element isn't visible. The user can toggle the display of the symbol and id by pressing, for example, Ctrl-Space (control key plus the space bar). The first time a user uses this key combination, the symbol set can be replaced with the Id. The ID can be backed by a yellow rounded rectangle. If the user presses Ctrl-Space again, both the symbol set and the id can be made visible. If the user presses the key combination again, they can be presented with only the symbol set. If the element is selected, the property sheet can display "ID1" in the "Id" field.

If the user opens the "Start" drop-down in the property sheet and selects "All Input", the STE can change and a "wing" can be added in the upper left corner with an infinity symbol. Alternatively, if the user selected "Start of Data", the number 1 can be displayed in place of the infinity symbol.

According to one example, the user can place another STE on the graph (e.g., dragged from the Palette), such as to the right of the first one, and set the symbol set to "n" (the letter n, without the quotes). The user can place a third STE to the right of this one and set the symbol set to "d". The user can then place a fourth STE to the right of this one and set the symbol set to "[iy]". According to one or more embodiments, the Workbench can allow the zoom level of the graph to be adjusted using the buttons in the Toolbar, or by simply typing the "*" key on the numeric keypad to fit the contents of the graph on the screen.

Once the user has all 4 STEs on the graph, they might hover over the first STE (the one with the "[aA]" symbol set), press the top right button (an outgoing arrow) and drag the mouse to the second STE. According to one or more embodiments, the AP Workbench can then show the user an edge follow their cursor to the STE and an indication (4 corner pieces at the corners of the STE) that this STE is the "target" for the edge. If the user releases the mouse button, the Workbench can anchor the edge to the STE. The user could then have an edge coming from the first STE with an arrow pointing at the second STE. In a similar fashion, the user could create, for example, 2 more edges, one from "n" to "d" and one from "d" to "[iy]".

If the user is not precise with their drag'n'drops, the STEs might be unevenly spaced and misaligned. According to one or more embodiments, the AP Workbench can fix that by allowing the user to select many elements at once. The user can then draw a bounding box around the 4 STEs by placing their mouse cursor in an empty part of the graph above and to the left of the left-most STE. If the user presses the left button and drags the mouse to a position below and to the right of the right-most STE, and releases the button, the AP Workbench selects the 4 STEs.

In the Layout menu, the user can then select "Align Nodes". According to one or more embodiments, a non-modal dialog can then be presented to the user along with a combo menu. If the user selects "Horizontally Centered" from the menu and presses "Apply", the Workbench can operate to precisely align the STEs horizontally. If the user then selects "Horizontally Distributed" and presses "Apply", the Workbench can operate to evenly space the STEs. The user can then indicate they are finished using this dialog by pressing "Exit".

Figure 11:
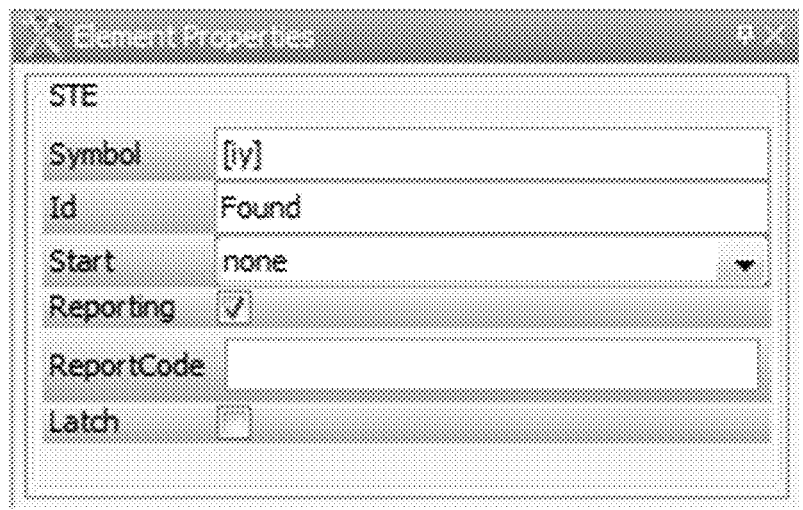
FIG. 11 illustrates an example of a property sheet screen in AP Workbench.

The automata designed in this example can scan the input stream looking for the variations of the word "andy"—it will match "andy", "andi", "Andy" and "Andi". To know if it's found a match, the user can make the last element a reporting element. According to one or more embodiments, the Workbench allows for this by allowing the user to select the "[iy]" element and click on the "Reporting" checkbox in the properties sheet (alternatively, the user could press, for example, "F6" and change the same value in the properties dialog that appears). The Workbench can then present the element with a new "wing" in the lower right corner with an "R" to indicate it is a reporting node. The user could, for example, change the Id of this element to "Found". The property sheet for this element might then match FIG. 11.

The Workbench can allow the user to save their project by, for example, allowing the user to either press the disk icon in a Toolbar, select "Save All" from a File menu, or type Ctrl-S from a keyboard.

According to one or more embodiments, the Workbench can also have a simulator portion. The simulator portion can allow the user to test their design with various input streams and try "what-if" scenarios. It can recreate the behavior of the hardware. According to one or more embodiments, it can also allow the user to single-step through an input stream and observe the behavior of their design.

For instance, the simulator portion might be accessed by the user pressing the "Start Simulation" button in the toolbar (e.g., a rightmost button) or selecting "Simulation→Start Simulation . . . " from a main menu bar. The user might can then be presented with a dialog requesting a symbol file as input to your design. A user can create a symbol file in a text editor or by using a symbol editor provided by the AP Workbench. For example, the Workbench can allow the user to access its symbol editor in response to the user pressing a "New symbol editor . . . " at the bottom of a dialog.

The Workbench can cause a full-featured text editor (e.g., the symbol tape editor) to appear in response. A user can then create a stream with a mixture of matching and non-matching words, for example. For instance, in an example of this capability, a user might enter the following in the text editor:

Billy, Andrew, Andi, ande, Andy and i

Figure 12:
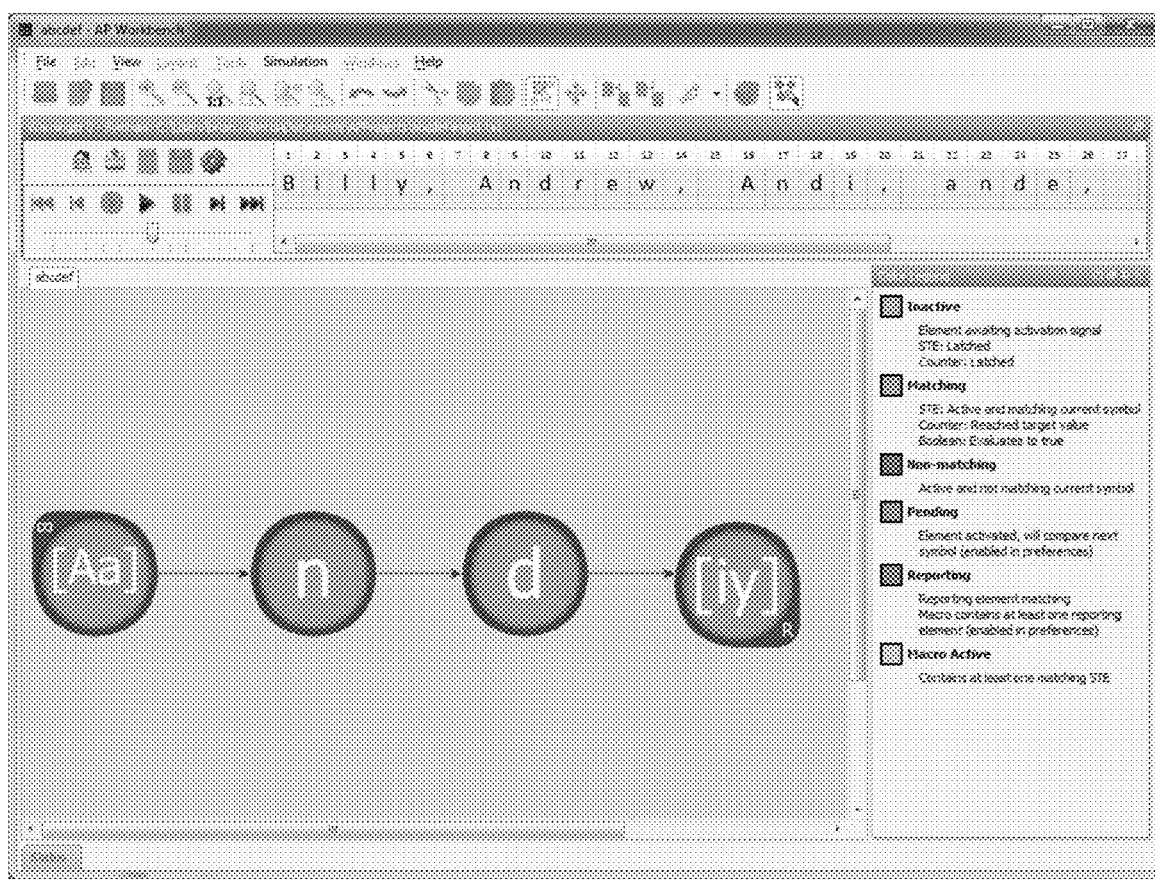
FIG. 12 illustrates an example of activities preparing for simulation screen in AP Workbench.

The user can then press a "Done, save . . . " button and save the file. The Workbench can then present the user with a progress bar to inform them of activities preparing for simulation. Once the process is complete, the Workbench can present the user with the following the information illustrated in FIG. 12:

A new dockable window with controls and a portion of the input stream can then be presented above the design of the user. As illustrated, to the right is an exemplary Legend window indicating the various colors used during simulation and their meaning.

The Symbol Tape window can have, for example, 3 sections. The majority of the window can display the input stream. The left side can be divided into, for example, two sections. The top section can be a set of buttons for working with the symbol tape stream. The bottom section can be a number of controls for stepping through the symbol stream. During simulation, the design can be immutable. The symbol stream can be modified (either in-place for simple edits or using the symbol tape editor for more expansive changes). Using the controls in the top section, the AP Workbench can allow the user to load a new symbol stream entirely, save the results of their simulation for comparison and/or later analysis, or save a modified symbol stream.

The bottom section can contain a set of controls for running the simulation. From left to right they could be, for example:

Rewind
Step Backward
Run to Breakpoint
Run
Pause
Step Forward
Fast Forward to End The buttons can be context-sensitive. A slider can be presented below the row of buttons. Such a slider could be presented to allow the user to set the speed when allowing the simulation to "Run" (as opposed to single-stepping).

The right side of the window can include a table with, for example, 3 rows. The top row can be the index. The middle row can be the symbol stream itself and the bottom row can provide indications of reporting nodes. In the initial state, the symbol stream and report row can be shown with a grey background, indicating that no part of the stream has been executed. If the entire symbol stream cannot be presented at once, the AP Workbench can present the user with a scroll bar to allow them to view the entire stream.

The first element in the example design will look at every symbol in the stream (the start condition was set to "All input"). If the user presses the Step Forward button, they can observe the changes. For example, a green reticule can first surround the first symbol ("B"). This can be the current symbol indicator. The background of this cell in the table can change to white to indicate the portion of the symbol stream that has been executed. Two additional buttons in the control row can be enabled (e.g., Rewind and Step Backward). Finally, in the main design, the first element can change color from "Inactive" to "Non-matching". If the user continues to single-step through the symbols stream until they reach index 8 (symbol "A"), they first element goes from "Non-matching" to "Matching". The arrow going to the second element can also change color, indicating "activation" of the next element and making it eligible to examine the next symbol in the stream. If the user steps again, the "n" element is "Matching" with the arrow indicating activation of the third element.

In addition to single-stepping, the AP Workbench can allow a user to "jump" to a particular symbol. At index 18, for example, the user might place the mouse pointer over the symbol ("d") and bring up the context menu (right-click). If they choose "Jump to this symbol", the AP Workbench can turn the background color of the intervening symbols to white to indicate that the symbols have been executed. Without single stepping through them, the state of the simulation at this point is exactly the same as if we had.

Continuing with the example, if the third element is "Matching" the last element is activated. The user can then single step to the next symbol. If the fourth element is "Matching" and "Reporting", a new indication can appear in the symbol ribbon. At index 19, for example, a "1" can appears in the bottom row, indicating that a node has reported. If more than one node had reported, the total count can be made visible here. If the user hovers over this column, the Workbench can present a tooltip to show the Id of the reporting node(s). In the case of the above example, the tooltip shows "Found".

The Workbench can allow the user to press the "Run" button to continuously step through the remainder of the stream. In the default position according to one or more embodiments, the slider can set the speed to be about 1 symbol per second. As the stream is ran through, the Workbench can automatically scrolls to show the current symbol. An indication of another report can be presented at index 31.

The File menu can contain actions related to managing a user's projects, libraries and macros. It can also have printing and application preferences actions, as well as a list of the most recently opened projects.

A New Project menu can be used to create a new project. Options can include allowing for creating a blank project or creating a project from a previously existing ANML specification.

An Open Project menu can be used to open an existing project. The user might select the project directory, or navigate into the project directory and select the top-level ".graphml" file. The top-level graphml file can have the same name as the enclosing directory.

The Add Library menu can be used to add a library to a project.

The New Macro menu can be used to create a new macro. The dialog can present, for example, 3 options for creating a new macro:
  A blank macro
  A macro populated from a regular expression
  A macro created from the currently selected element(s) in the graph According to one or more embodiments, creating a new macro might require a unique name. A new tab can be opened with the contents (if any) of the macro, ready for editing. If a macro is created from the current selection, the selected element(s) in the current graph can be replaced with an instance of the new macro, with connections preserved.

A Save All menu can be used to save all the currently modified graphs.

A Save Project As menu can be used to save the current project, including local project macros, under a different name. If the "Package" option is selected, macros from external libraries can be made local to the new project.

A Save Macro As menu can be used to save the current macro (only) under a different name.

An Export Project menu can be used to export the current project to ANML format.

An Export Macro menu can be used to export the current macro to ANML format.

An Import Macro menu can be used to allow for the importation of an ANML format file. Options might include importing the specified file as a macro into the current project or creating a new project to include the file. The former option can be used to create a new macro library, while the latter can be used to create a new project in the location specified with the new file as the root graph or as a macro in the default location or both (depending on if the file is an automata-network only, macro(s) only or both).

Figure 13:
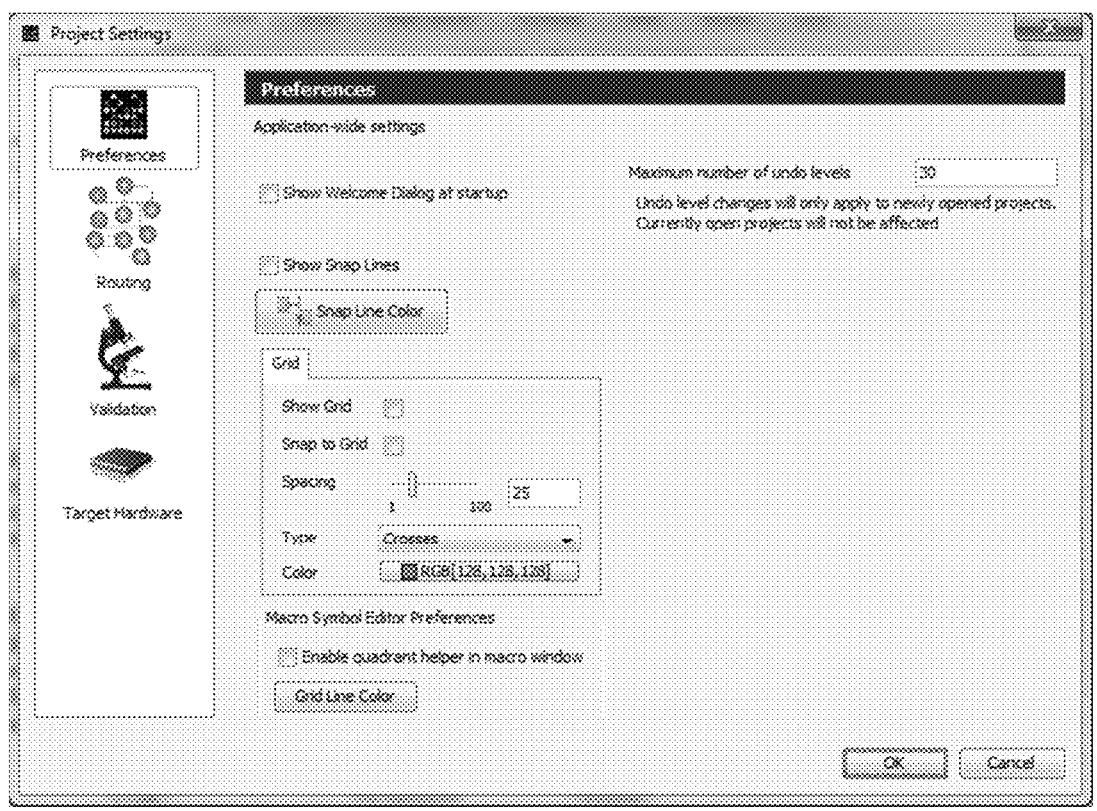
FIG. 13 illustrates an example of project preferences screen in AP Workbench.

FIG. 13 illustrates a project preferences screen inclusive of a menu. A Preferences menu can be used to invoke the Application-wide preference settings dialog, including, for example,
  Preferences: Application preferences such as snap line settings and colors, etc.
  Routing: Project edge and element routing and layout preferences
  Validation: Project Validation settings
  Target Hardware: Target hardware selection A Print action can be used to print the current graph. An Options dialog can be presented to the user allowing them to set the region to be printed, scaling, title, etc. Meanwhile, a Print Preview action can be used to preview the print settings as applied to the current graph.

From a Quit menu, the application can be closed with prompts to save any modified graphs.

An Edit Menu can also be presented. The Edit Menu can allow for an Undo action that can be used to undo the last graph change, a Redo action that can be used to redo an undone action, a Cut action that can be used to remove selected elements from the graph (which can be placed in the clipboard), a Copy action that can be used to copy selected elements from the graph (which can be placed in the clipboard), a Paste action that can be used to paste the contents of the clipboard into the current graph, and a Duplicate action that can be used to duplicate the selected element(s) and their connections.

An Add Successor action can be used to add an STE as a successor to the currently selected node. According to such an action, a new STE will be created with a connection from the selected node to the new STE. Similarly, an Add Predecessor action can be used to add an STE as a predecessor to the currently selected node. According to such an action, a new STE will be created with a connection from the new STE to the selected node. A Default Node action can be used to modify the properties of the STE used for the Successor/Predecessor actions.

A Select All action can be used to select all the elements in the current graph, except the property node. A Deselect All action can be used to unselect all the selected elements in the graph. Only the property node will be selected when this action completes.

A Delete action can be used to delete the currently selected node(s) and/or edge(s).

A Make Macro . . . action can be used to create a new macro from a selected element(s). The user can be prompted to supply a name for the new macro. An Edit Macro Definition action can be used to open a graph for the selected macro's definition.

An Edit Symbol action can be used to open the in-place editor for the symbol set of an STE. An Edit Counter target action can be used to open the in-place editor for the counter target of a Counter element. An Edit ID action can be s used to open the in-place editor for the Id of the selected element (e.g., all elements except "Note"). An Add Note action can be used to add a Note element to the current graph. A Properties Action can be used to open the properties dialog for the selected element(s).

Figure 14:
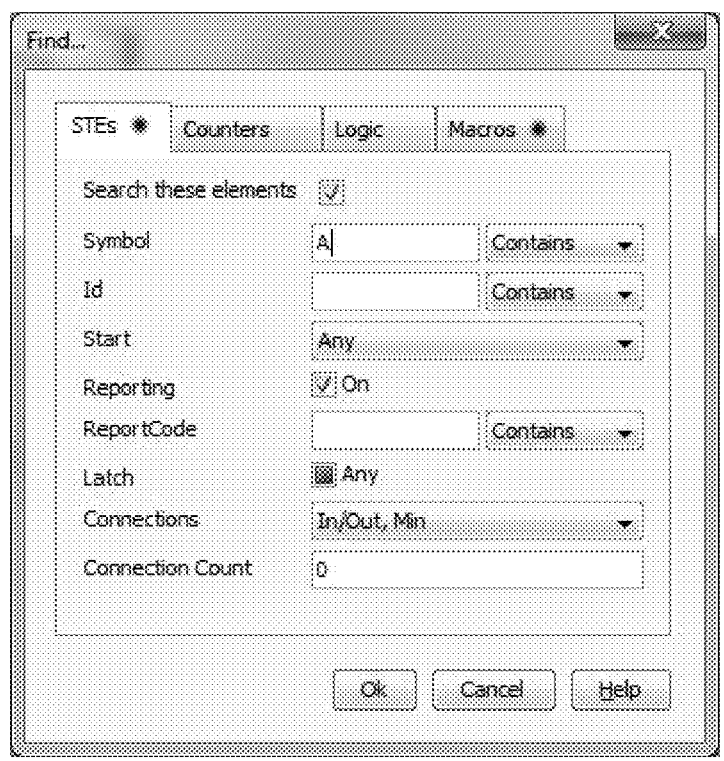
FIG. 14 illustrates an example of a find dialog screen in AP Workbench.

A View Menu can also be presented to the user. The View Menu can include a Find action, which can be used to locate and highlight elements in the current graph matching a wide set of criteria. In general, if an element has a changeable property, it can be part of the criteria. The Workbench can allow the user to set criteria for multiple element types (i.e. look for both STEs and Counters). Elements with criteria to be matched can be indicated with a marker next to the name on the tab. In FIG. 14, STEs and Macros will be searched. If a text field is left blank, it will not be included in the search. Text fields can be matched in, for example, one of 4 ways and are case-sensitive:

Contains—text contains the supplied substring
Begins With—text starts with the supplied substring
Ends With—text ends with the supplied substring
Exact—text matches the supplied string in its entirety
Connections can be matched based on direction and minimum/maximum count:

Incoming, Min—element has at least {n} incoming connections
Incoming, Max—element has no more than {n} incoming connections
Outgoing, Min—element has at least {n} outgoing connections
Outgoing, Max—element has no more than {n} outgoing connections
In/Out, Min—element has at least {n} incoming or outgoing connections. Example: if the count is set to 2, a matching element has at least 2 incoming connections, 2 outgoing connections, or 1 of each.
In/Out, Max—element has no more than {n} incoming or outgoing connections. Example: if the count is set to 2, a matching element has no more than 2 outgoing connections, 2 incoming connections, or 1 of each.

Checked fields (Reporting, Latch, EOD) have a tri-state check box-Off, On, or any. For example, in FIG. 14, STEs with any Start condition, any Latch state, any connection count, has Reporting enabled and has a symbol set that contains "A" will match.

A Find Next action can be used to jump to the next matching element. According to one or more embodiments, this might be enabled only if more than one element matches the criteria. A Find Previous action can be used to jump to the previous matching element. According to one or more embodiments, this might be enabled only if more than one element matches the criteria and have done at least one "Find Next" operation.

A Zoom In action can be used to constrain the view of the graph to see more detail. Meanwhile, a Zoom Out action can be used to expand the view of the graph to see a larger portion in less detail. In addition, a Zoom 100% action can be used to set the scaling to 1:1. Still further, an Area Zoom action can be used to select a region of the graph and fill the view with the selected region. A Magnifying Glass action can be used to create a round "lens" attached to the mouse cursor allowing the user to examine in details portion of the graph under the lens. A Fit Content action can be used to set the scaling of the graph such that the entire contents are visible.

A Show STE Ids action can be used to enable/disable the display of the Id of STEs. A Show STE Symbols action can be used to enable/disable the display of the symbol-set of STEs. A Cycle STE Label Display can be used to iterate through the STE display options: e.g., Symbol only, ID only, Symbol and ID.

A Toggle Grid action can be used to turn the display of the grid on or off. A Grid Options action can be used to bring up the preference settings for the grid. An Edit Mode action can be used to switch the graph to Edit mode. In this mode, elements can be selected, moved, have their properties changed, make or remove connections, etc. A Navigation Mode action can be used to switch the graph to Navigate mode. In this mode, all editing functions can be disabled. The zoom functions and view movement functions might be left available. A Snap Lines action can be used to disable/enable the appearance of snap lines when adding or moving elements. Snap lines can provide aesthetic assistance in placing elements on the graph. A Snap Line color action can be used to change the color of the snap lines. According to one or more embodiments, during simulation, a Show Color Legend action can also be presented and used to display the Color Legend window if it is not already visible.

A Layout Menu can also be presented to the user. AP Workbench uses algorithms for automatically placing the elements and routing the connections between them. The time to complete place and route can increase exponentially with the size of the design. According to one or more embodiments, the AP Workbench allows the user to select which routing options provide the best result.

An Update Layout action can be used to (re) layout the current graph using the layouter specified in the "Routing Settings" portion of the preferences dialog. A Hierarchical action can be used to invoke various Hierarchical layout modules. Generally, this will affect nodes and edges, unless the module allows for constraints. A Organic action can be used to invoke various Organic layout modules. Generally, this will affect nodes and edges, unless the module allows for constraints. An Orthogonal action can be used to invoke the various Orthogonal layout modules. Generally, this will affect nodes and edges, unless the module allows for constraints.

An Edge Router action can be used to invoke various edge router modules. These modules affect edge routing and should not cause nodes to be moved (or moved only slightly to accommodate edge placement). An Align Nodes action can be used to precisely align elements. A non-modal dialog can be presented with a combo menu. Only selected elements will be affected in one or more embodiments. The AP Workbench can allow the user to select nodes while the dialog is open, allowing them to apply one alignment to some nodes and a different alignment to other nodes. The alignment types can be grouped into horizontal, vertical and grid alignments. The user can align selected elements either by their centers, upper or lower borders (horizontal), left or right borders (vertical). They can also be evenly distributed (vertically and/or horizontally). Finally, selected elements can be arranged in a grid (which might be desirable with macros).

A Snap to Grid action can be used to invoke a non-modal dialog whose action is to snap elements to the grid. By default, all elements can be snapped to the grid; a checkbox can be presented to allow the user to specify only selected elements will be affected.

Figure 15:
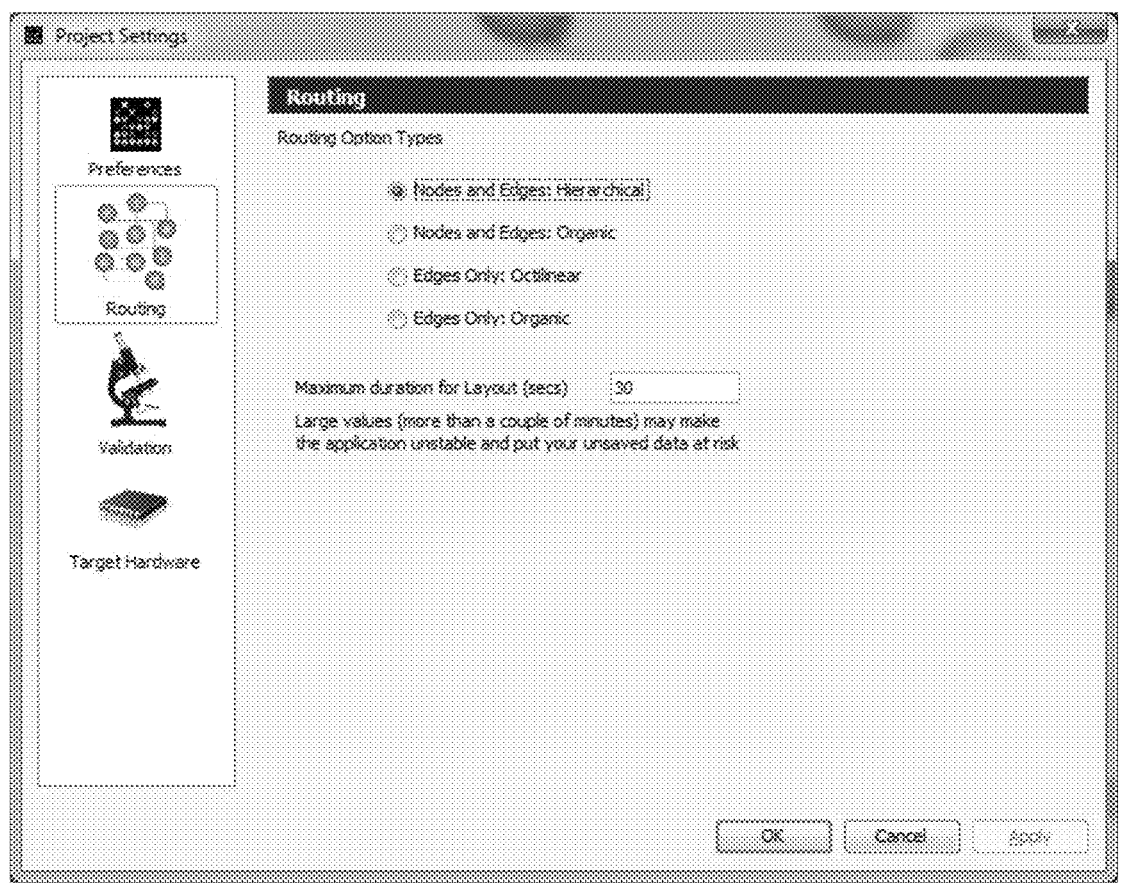
FIG. 15 illustrates an example of a routing preferences screen in AP Workbench.

FIG. 15 illustrates a routing preferences screen. A Routing Settings action can be used to display/modify various routing preferences. Many layout and routing choices can be made available. Each can be configurable and at least some can have many interacting options. AP Workbench can provide, for example, 4 pre-configured layout and routing options. Additional layout and routing modules with all options can be made available from the Hierarchical, Organic, Orthogonal and Edge Router actions in the Layout menu.

Node and Edges: Hierarchical—an incremental hierarchical layouter which affects all nodes and uses octilinear routing for edge placement.
Nodes and Edges: Organic—a smart organic layouter which affects all nodes and uses an organic router for edge placement.
Edges Only: Octilinear—an edge router that uses octilinear routing. This will not affect nodes (or affect them only slightly) to accommodate edge placement.

Edges Only: Organic—an edge router that uses organic routing. This will not affect nodes (or affect them only slightly) to accommodate edge placement.

Figure 16:
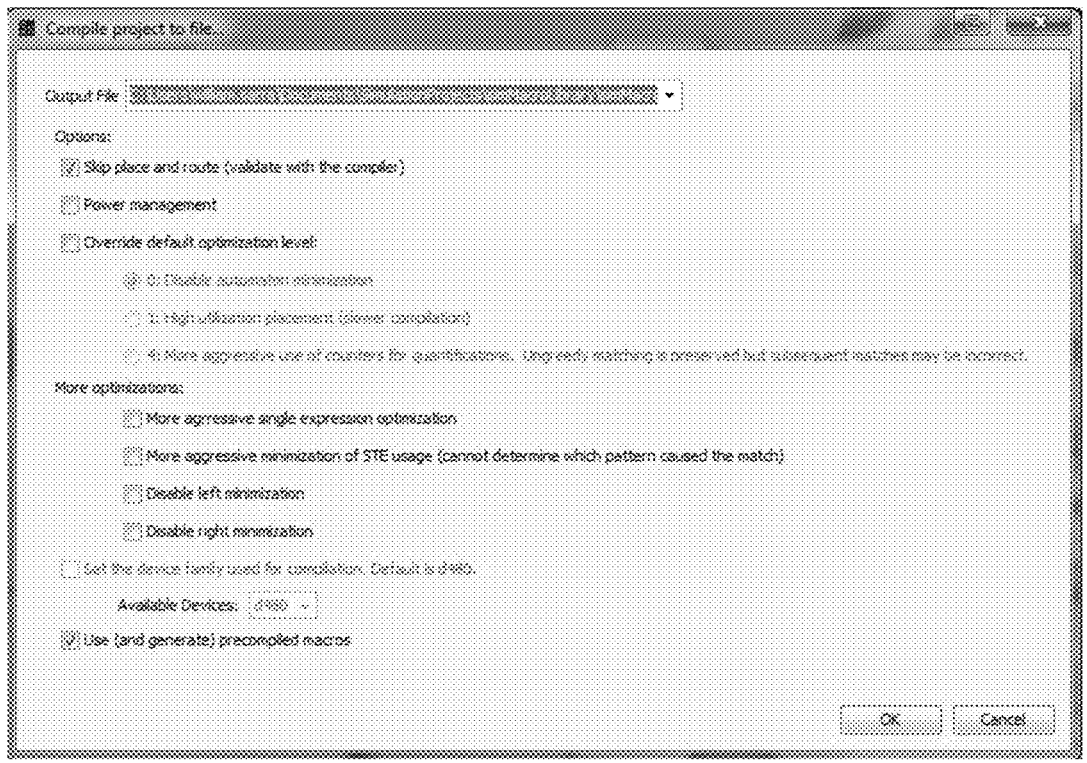
FIG. 16 illustrates an example of xompile project dialog screen in AP Workbench.

A Tools Menu can also be presented to the user. The Tools Menu can include, for example, an Analyze Graph menus that provides basic graph information unassociated with ANML. FIG. 16 illustrates a compile project dialog screen inclusive of a menu. A Compile Project menu can also be presented from which the user can compile the current project. This will allow the user to load the compiled network on to hardware. The menu will present a dialog to the user in which they may choose a number of options. Note that many of the options will increase compile time as the compiler optimizes the network.

Please see the APSDK documentation at http://www.micronautomata.com/documentation/ap_sdk for details on various optimization options. One time saving option might be to specify the use of precompile macros when compiling the project. Generation of the precompiled macros, may increase the initial compilation (as the macros are precompiled the first time), but subsequent compiles may show significant time savings.

Figure 17:
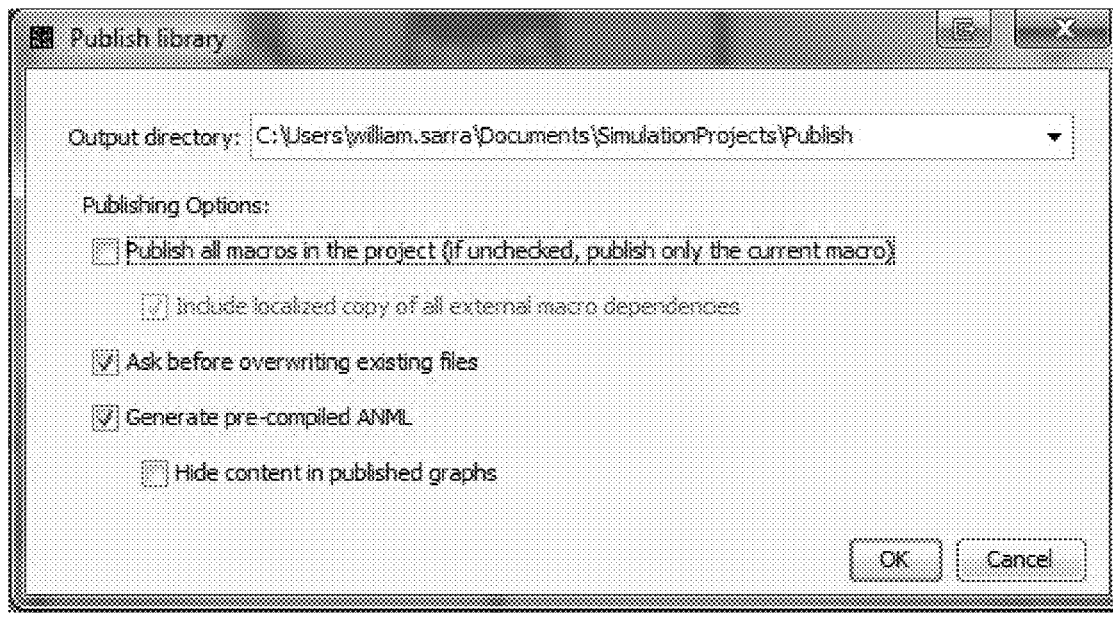
FIG. 17 illustrates an example of a publish macros dialog screen in AP Workbench.

FIG. 17 illustrates a publish macros dialog screen. Individual macros may be (pre-) compiled for subsequent consumption or to publish functionality while hiding the details of the network contained in the macro. Macros in the current project can be published to another directory via a Publish Macros menu command. The user can be presented with a number of options, such as:

Publish all macros in the project vs. Current macro only. This will place the .GRAPHML file in the directory specified.
Publish any referenced macros currently in external libraries
Publish precompiled ANML for all macros
Hide content: When publishing precompiled macros, this option will replace the GRAPHML file that contains the automata network details with one that provides only stubs to the user. This allows a network developer to include the GRAPHML in their design without the publisher risking 1) editing of or 2) loss of intellectual property of the macro contents.

Figure 18:
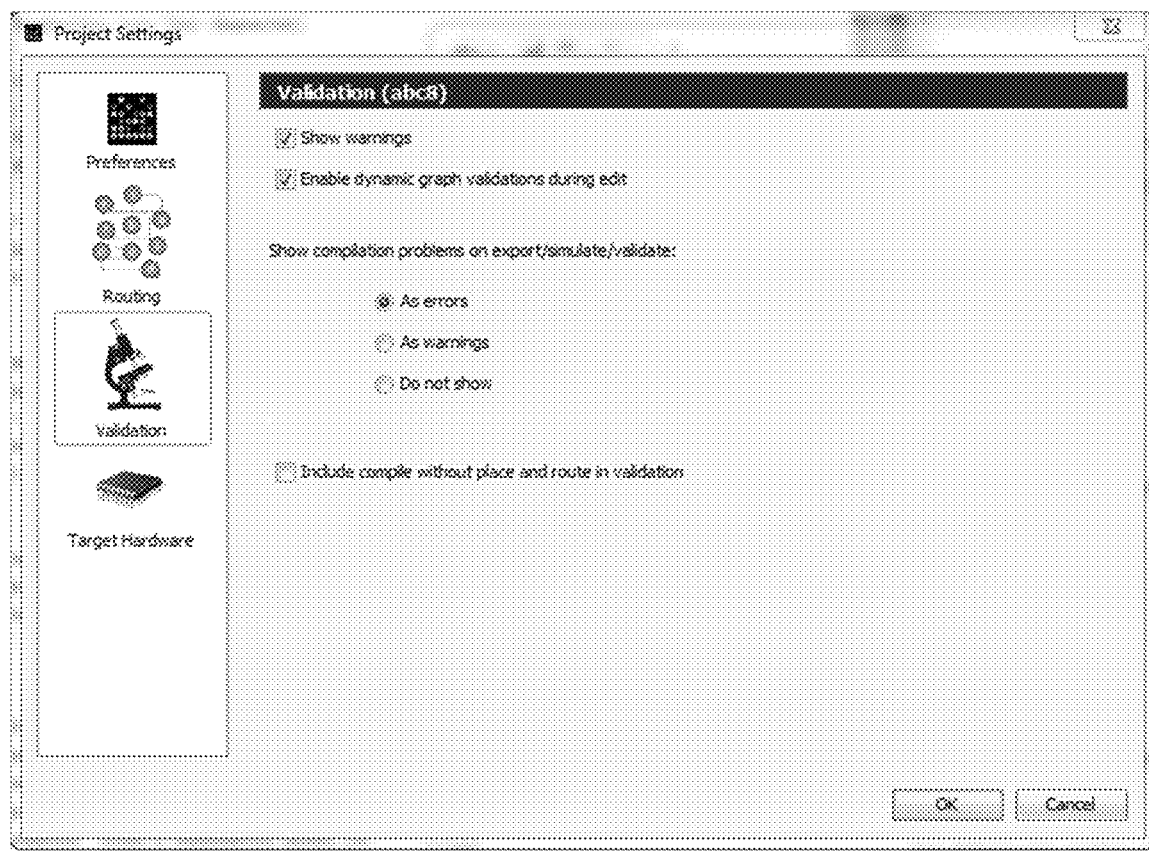
FIG. 18 illustrates an example of a validation preferences screen in AP Workbench.

FIG. 18 illustrates a validation preferences screen. A Validation Menu can also be presented to the user and used to validate the current design of the project including statistics on the network. A Validation Settings menu can display the project settings dialog, focusing on the Validation page. Many options can also be made available, such as:

Show Warnings—the Validation dialog will always display errors. If this option is checked, it will display warnings as well.
Enable dynamic graph validations during edit-Some validations can be performed immediately. If checked, these validations will be displayed (usually as a dialog, tooltip and/or graphic) during editing. For example, connecting an input port directly to an output port is a validation error. If attempted, a warning triangle will be displayed on the graph, and a dialog will appear with information about the error.
Show compilation problems on export/simulate/validate: if the APSDK is available and compilation is enabled, problems may be handled in one of three ways:
As errors, preventing further processing,
As warnings, allowing the export/simulation to proceed, or
Do not show, ignoring compilation problems completely.
Include compile without place and route in validation-if checked, the generated ANML file will be passed to the compiler for additional validation. To minimize the processing time, no "place and route" will be done.

Figure 19:
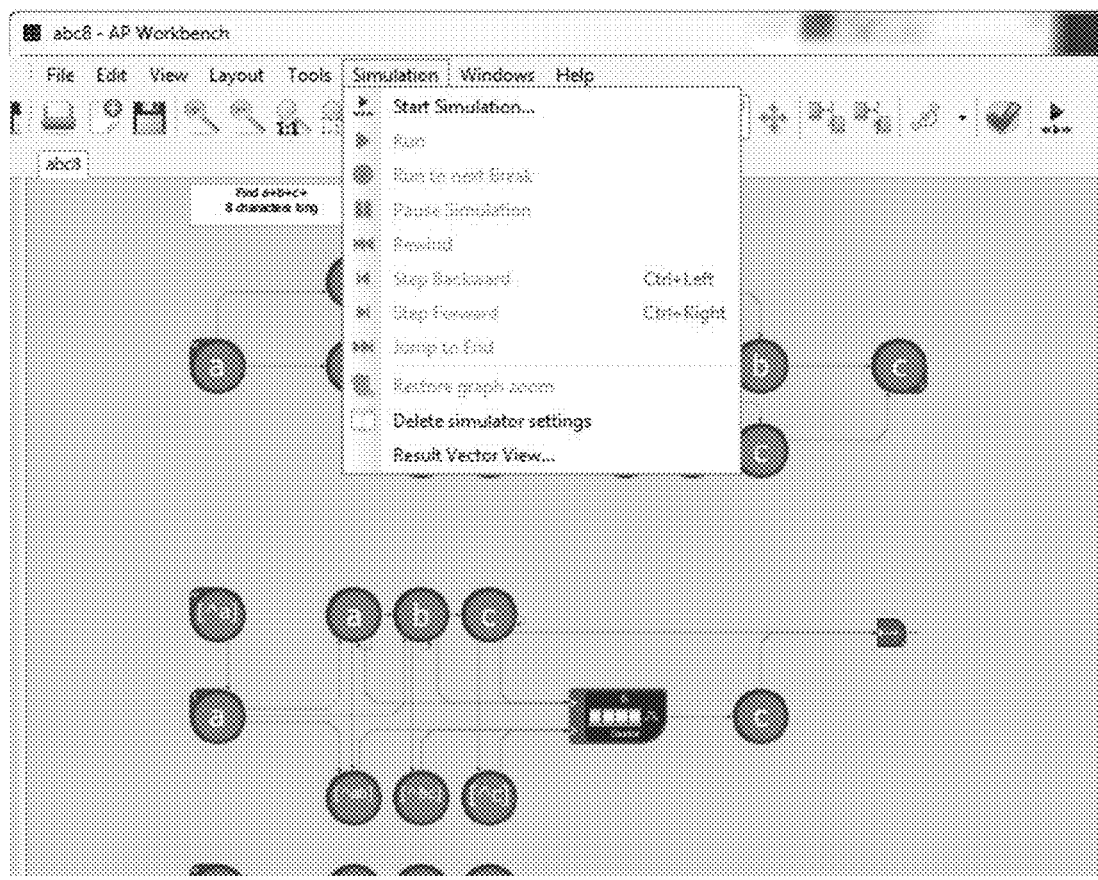
FIG. 19 illustrates an example of a simulation menu screen in AP Workbench.

FIG. 19 illustrates a simulation menu screen A Simulation Menu can also be presented to the user. Simulation of the current project can be started via this menu. If simulation is currently running, this menu item can change to also allow for termination of the simulation. When a simulation session is active, a Run menu item can be used to automatically step through the specified symbol file as the speed specified by the user slider settings.

A Pause Simulation menu item can be used to pause a simulation that has been set to "run". A Rewind menu can be is used to reset the simulation state to immediately prior to the first symbol in the stream. A Step Backward menu can be used to step back one symbol in the stream. A Step Forward menu item can be used to step forward one symbol in the stream. A Jump to End menu item can be used to immediately jump to the last symbol in the stream, processing the network for every symbol. A Restore Graph Zoom menu can be used to allow the user to restore the zoom setting of the last simulation setting. A Delete Simulator Settings menu can be used to delete saved simulation settings. Such settings can include, for example:

Previous symbol file
Zoom setting
Pop-up macro details windows size and positions
Simulation Options Dialog settings A Windows Menu can also be presented to the user. The Windows menu can include a Reset Window Layout action that can be used to restore the placement of standard windows (palette, properties, status) to their original default locations and dock orientation. An Element Properties action can be used to open (if necessary) and activate the Element Properties window. An Edge Properties action can be used to open (if necessary) and activate the Edge Properties window. A Palette action can be used to open (if necessary) and activate the Palette window. A Status action can be used to open and activate the Status window.

A Help Menu can also be presented to the user. The Help menu can include an About action that can be used to display a dialog with information about the application, including version information, copyrights and Software License agreement. A Demo action can be used to run a demonstration script, such as to showcase some of the capabilities of the AP Workbench. For example, a temporary project can be created for the demonstration and automatically deleted after completion.

A Start/Stop Recording action can be used to start or stop recording user interactions. The AP Workbench can allow for recording most interactions directly with the graph (adding elements from the palette, changing properties of an element, creating connections, etc.), as well as keyboard input, main menu, context menus and toolbar selections. According to one or more embodiments, interaction with dialogs that manipulate or reference the file system may not be recorded (such as Add Library, Save Project As, Import ANML, etc.). When starting a recording, the AP Workbench can prompt a user to select a file in which the recorded interactions will be placed. The format of this file can be plain text.

Figure 20:
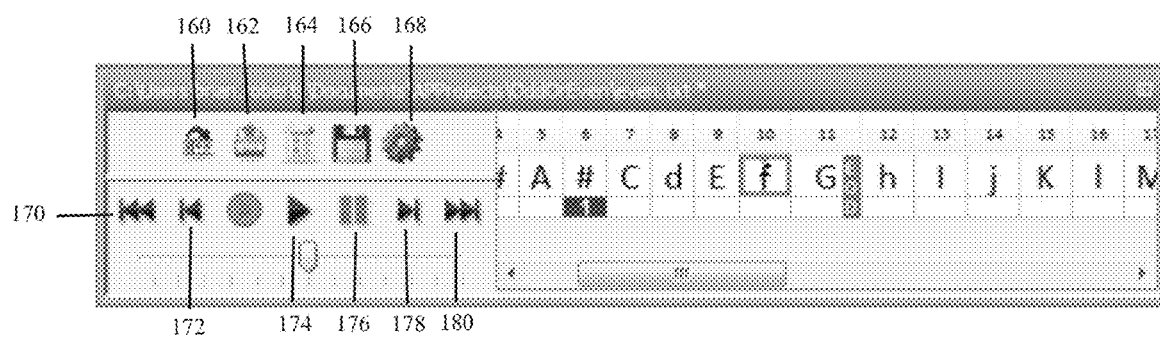
FIG. 20 illustrates an example of a symbol stream window screen in AP Workbench.

FIG. 20 illustrates a symbol stream window screen A Playback action can be used to playback a previously recorded user interaction file. When the simulator is running, the AP Workbench can open a Simulator Symbol Stream Window. The AP Workbench can make a number of actions available from this window.

Such a window can include a section (e.g., in the upper left) containing a set of actions for working with the symbol stream and adjusting settings for the behavior of the simulator. Directly below can be actions for stepping through the symbol stream. The major portion of the window can be devoted to the symbol stream table, which can be a scrollable table with, for example, 3 rows. The top row can be the index. The middle row can be the symbol stream. The bottom row can be for displaying report counts.

In FIG. 20, there was one reporting node on symbol "#" at index 6. Index 11 contains an End of Data marker. The rectangle at index 10 marks the current symbol for the simulator.

The AP Workbench can provide, for example, the following Stream Actions.

Jump to symbol (160) . . . —this action moves the current symbol to the desired index. The state of the simulator reflects the processing of the symbol stream from the beginning to that index.

Load simulation symbols (162) . . . —this action loads a new symbol stream from a file.

Save Report (164) . . . —this actions saves the current report(s) from the entire stream to a file for later comparison and analysis.

Save modified symbols as (166) . . . —this action saves a modified stream to a new file.

Figure 21:
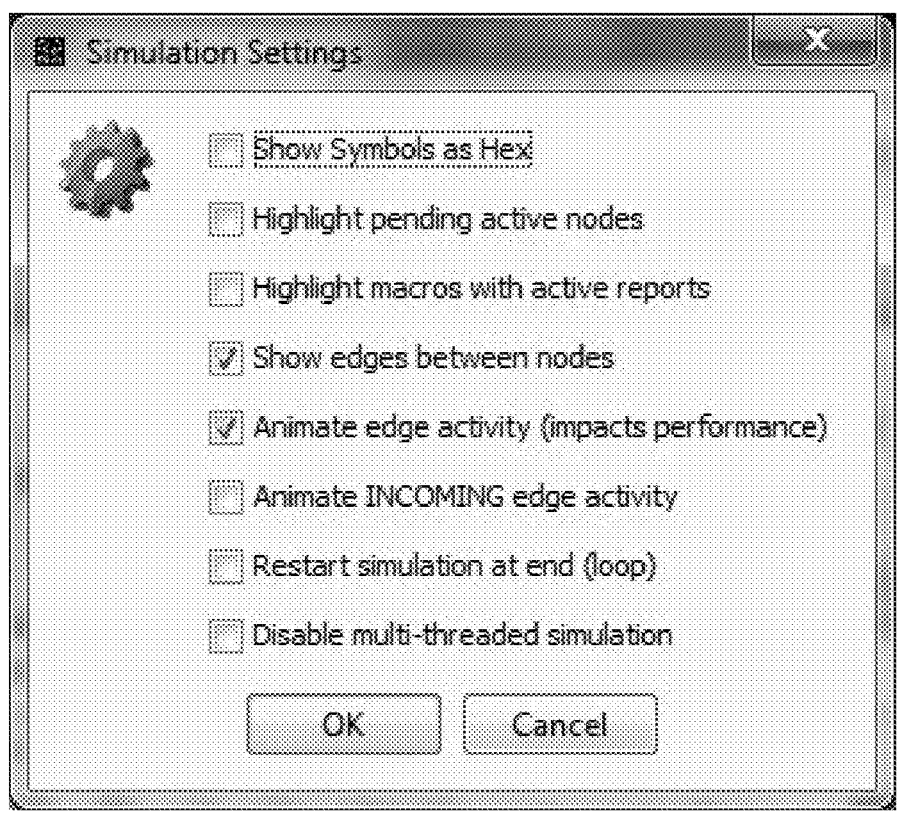
FIG. 21 illustrates an example of a simulation settings dialog screen in AP Workbench.

Settings (168) . . . —this action invokes a dialog for modifying the settings for the simulation. See FIG. 21.

The AP Workbench can further present the following exemplary Stepping Actions:

Rewind back to first symbol (170)—this action prepares the simulator for executing the first symbol in the stream.

Step backward (172)—step back one symbol in the stream.

Run (174)—step continuously; speed is determined by slider

Pause (176)—pause a running simulation

Step forward (178)—step forward one symbol in the stream.

Jump to end (180)—jump to the last symbol in the stream, processing the network for every symbol Show Symbols as Hex—symbols in the stream will be displayed as hexadecimal values.

Highlight pending active nodes—activated elements will be highlighted

Highlight macros with active reports—macros with active reports will be highlighted. This highlighting can be different than the highlighting used to indicate a macro with matching elements.

Show edges between nodes—A large number of connections between elements can clutter the display. This setting can be unchecked to hide the connections.

Animate edge activity—Highlight edges. This can help visualize which elements have been activated.

Animate INCOMING edge activity—Indicate the connection(s) that activated this element.

Restart simulation at end (loop)—When the simulation reaches the end of the symbol stream, rewind and play it again.

Disable multi—threaded simulation—for internal debugging use. In normal use, it should probably be unchecked.

The AP Workbench can also present context-sensitive menus in several places, such as: various sections of the Palette, the background (root) of the graph, elements of the graph, and the status window. For example, The main section of the Palette, the ANML elements, might not have a context menu. However, a macros library section, including the local library (Project Macros), can have a context menu with the following actions:

Add Library—This can be the same action as the one found in the File menu.

Remove Library—This action can be used to remove the macros library section from the current project and the palette. The project can be marked "dirty". If it is not saved, the macros library can still be associated with the project and will re-appear in the Palette the next time the project is opened. In one or more embodiments, a user cannot remove the local library (Project Macros).

New Macro—This can be the same action as the one found in the File menu.

Delete Macro—This action can be used to delete the macro from the macros library along with any instances in the current project. If this is a shared library, other projects that have instances of this macro can be flagged as needing repair the next time they are opened.

Highlight Macro Instances—This toggle action can be used to highlight any instances of the macro in the current graph.

Edit Macro Instances—This action can be used to open a graph for the macro definition.

Compile Macro—This can bethe same action as the one found in the Tools menu.

The AP Workbench can also allow the user to click on the background (empty space) of a graph to select, for example, the Design Properties node (main graph) or Parameters node (macro). The context menu can have the following items.

Add Note—Add a Note element to the graph. This can be the same action as dragging a Note element from the Palette to the graph.

New Macro—This can be the same action as the one found in the File menu.

Properties—This can be the same action as the one found in the Edit menu.

The AP Workbench can also allow for all graph elements to have a number of action in common. Context will determine whether the action is enabled. Such actions can include, for example:

Delete—This can be the same action as the one found in the Edit menu.

Cut—This can be the same action as the one found in the Edit menu.

Copy—This can be the same action as the one found in the Edit menu.

Paste—This can be the same action as the one found in the Edit menu.

Duplicate—This can be the same action as the one found in the Edit menu.

Add Successor—This can be the same action as the one found in the Edit menu.

Add Predecessor—This can be the same action as the one found in the Edit menu.

Default Node—This can be the same action as the one found in the Edit menu.

Make Macro—This action can invoke the New Macro . . . dialog with the "From Selection" option selected.

Edit Symbol/ID/Counter Target/Name—This action can invoke the in-line editor for the named property. The "Edit ID" action can be made available for State Transition Elements, Logic (simple and complex) Gates, and Macro instances. "Edit Symbol" can be made available for the State Transition Element. "Edit Counter Target" can be made available for Counters. "Edit Name" can be made available for Input and Output Macro Ports.

Properties—This can be the same action as the one found in the Edit menu.

Edit Macro Definition—This action can open a graph for the macro definition of the selected instance. In one or more embodiments, this action is only available for Macro Instances.

The following section of the application provides some examples of potentially useful automaton. One such automaton can be an automaton that will count the number of symbols in a stream and report either an even or odd count. It assumes input in the form of one or more leading '#' followed by an unbroken sequence of 'A' followed by a symbol '#' terminating the sequence.

Here are a few valid input sequences and the result:
##AAAAA #—reports ODD
AA #—reports EVEN
Invalid streams won't report anything:
AAAAAA (doesn't start or end with "#")
####(no As)
AAAAA (doesn't end with a "#")
AB #("B" is not part of the search pattern)

To create such an automaton in the AP Workbench, a user might open a new graph and add 2 STEs. For the first element, the user might set the symbol-set to "#" (without the quotes), set the id of this element to "lead" and it's start condition to "Start of Data". The user might set the second element's symbol-set to "A" (again, without the quotes). The lead element will match the first character of the stream (since we assume the stream must start with at least 1 "#"). But there may be many "#" symbols before we get to the first "A". The lead element must loop. This can be done by creating a connection to itself. For example, the user might hover over the element and press the forward arrow-move out a little ways and then back to the element and release— to create a loop. The user can then draw a connection from the lead element to the second element, representing a transition from one or more "#" to the first "A". The user can add another STE to handle the terminating "#". This can be a reporting node. The user can set the ID to "ODD" and draw a connection from the "A" element to this last element.

Alternatively, the user could hover over the last element and draw a reverse arrow to the "A" element. The automaton will now handle a stream that begins with one or more "#" followed by a single "A" followed by a "#" and report ODD. A reporting node is needed for EVEN. The user could add another STE to the graph from the palette, but it might take fewer steps to just copy the element and change the ID. To do this, the user can select the "ODD" element and press Ctrl-C to copy and then Ctrl-V to paste.

Alternatively, the user could use the buttons in a button bar to do the copy and paste. Still further, the user could alternatively use the context menu of the element to do the copy and paste. The user can move this new element below the "ODD" element and change its ID to "EVEN".

Figure 22:
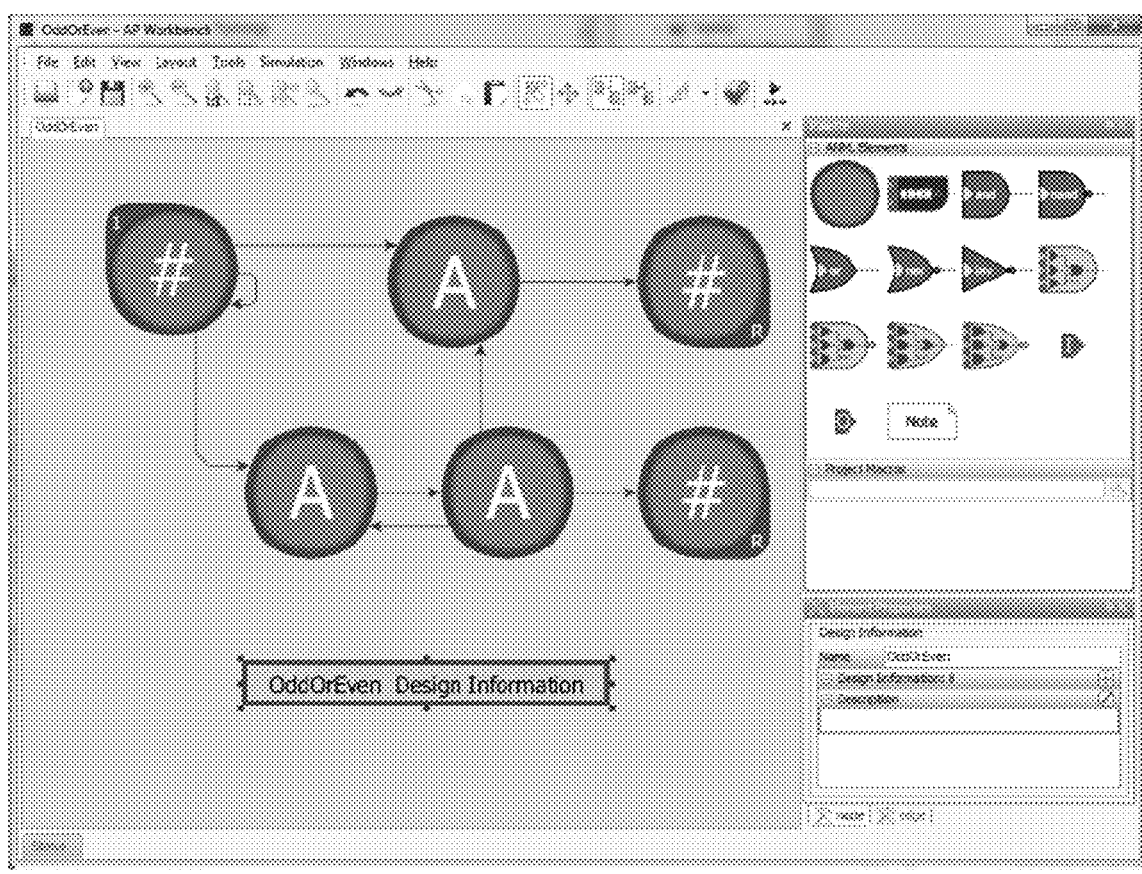
FIG. 22 illustrates an example of an odd or even count automaton screen in AP Workbench.

In order to detect an even number of A's, the user could add two more STEs. The user could copy the original "A" element and paste 2 more. The user could then draw a connection from the lead element to the first of the new "A" elements, draw a connection from this "A" element to the second new "A" element, and draw a connection from that element back to the first. This would give an "even" loop (one A followed by another). The user could draw a connection from this second "A" to the "EVEN" element so that an even count can be reported. The last connection to make is from this second "A" to the original "A" element. This would gives the final piece of the pattern-any odd number of "A"s. The automaton could look like what is depicted in FIG. 22.

The automaton could be tested out using the simulator of the AP Workbench. Simulation. A user might do this by selecting "Start Simulation" from a Simulation menu. Alternatively, the user might do this by pressing the start simulation button in a toolbar. If it is the first time this design is simulated, an input stream might need to be supplied. In one or more embodiments, this might be done by pressing the "New symbol editor" on a dialog that appears, wherein the user can then type in a stream such as:
AAAAA The user can then press "Done, Save . . . " and change the name of the file from "input.txt" to "odd.text" and press "OK". The user can run the simulator by selecting "Run" from a Simulation menu. Alternatively, the user can press the play button in the Symbols window.

When the simulation has completed, a report can be presented at, for example, index 10. The stream can be modified to give an even report. For example, a user can bring up a context menu on any symbol in the stream and select "Symbol stream editor . . . ". The user can then insert one A into the existing block of As to give an even count.

The user can select "Rewind" from the Simulation menu to reset the simulator. Alternatively, the user can press the rewind button in a Symbols window. The user can run the simulator by selecting "Run" from the Simulation menu (or press the play button). When the simulation completes, the user can be presented with one report at index 10.

If the user hovers over that report, the ID of the reporting node ("EVEN") can be presented. If the user brings up the context menu at this index, they can see "EVEN" at the bottom of the menu. Selecting this will highlight the reporting node.

If more than one node reports, all of them will be available at the end of this menu and selecting one will highlight it. The user can preserve their changes by pressing the Disk icon in the Symbols window, change the name of the file from "odd.txt" to "even.txt" and press "OK".

The user can create a non-reporting stream by, for example, changing one of the As to a different letter. The user does not necessarily need to use the full editor to do this. For example, the user can double-click one of the As to put it in edit mode and type "B". The user can press the Enter or Tab key to leave edit mode. The user can rewind and play the stream again.

The user can save this modification to the stream as a negative test (since there are no longer any reports) such as by following the steps discussed before. The user can select "Stop Simulation" from the Simulation menu (or press the button in the toolbar).

A macro can be a self-contained automaton that can be replicated. In addition to providing encapsulation, the macro can provide for re-use and simple parameterization. The example automaton discussed here is small, but it can still be used to demonstrate the potential power of macros.

The user can select the "ODD" reporting STE and the "A" element connected to it. They might do this using a bounding box or by selecting one element and then shift-selecting the second. The user can then copy the elements to the clipboard (Ctrl-C), and select "New Macro . . . " from the "File" menu or the graph's or element's context menu. Alternatively, the user could use a keyboard shortcut Ctrl-M. In the dialog that appears, the user could type "OddReport" in the Name field.

The button selection should be "New Macro". The user can press "OK" to dismiss the dialog.

Figure 23:
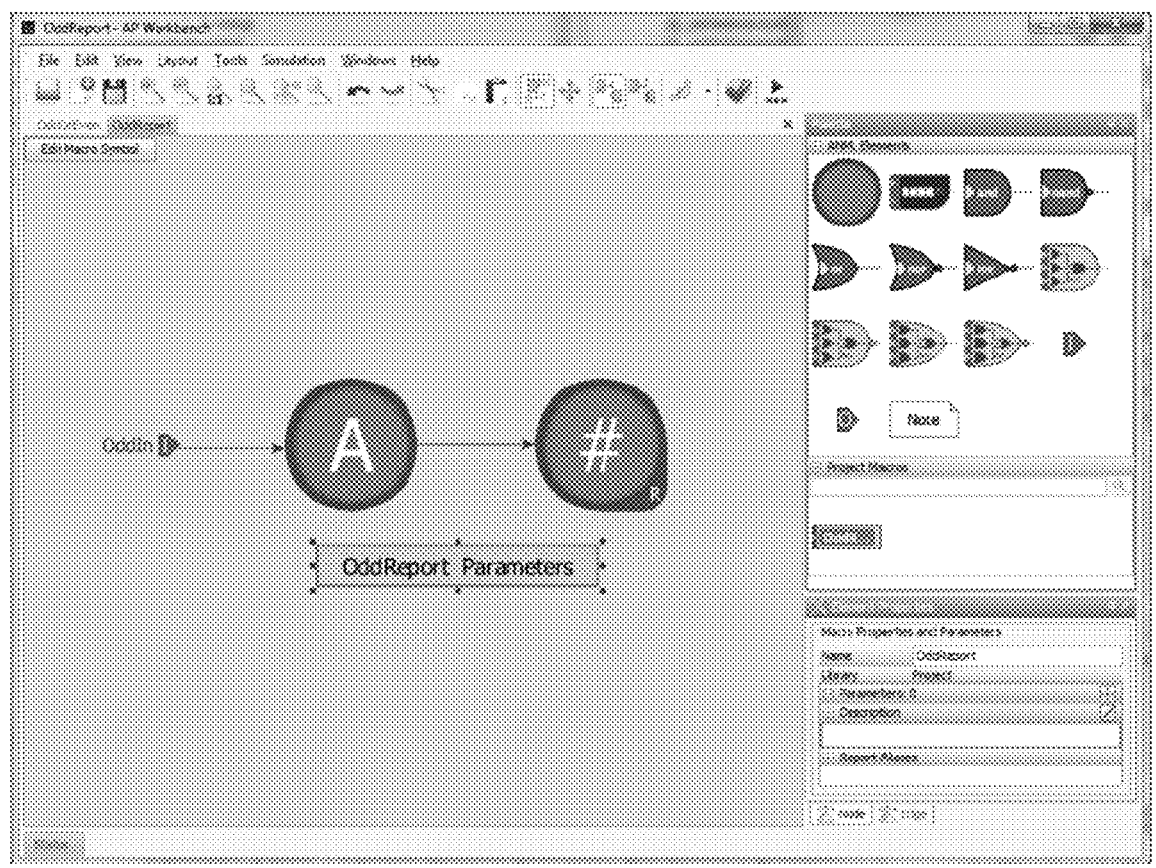
FIG. 23 illustrates an example of an oddreport macro screen in AP Workbench.

A new graph tab can be created with the macro "Parameters" box. The user can type Ctrl-V to paste the copied elements into the graph. While both are still selected, the user can move them to a location above the "Parameters" box. Since the macro will need to receive input, the user can drag an input port element from the palette to a location to the left of the "A" element. The user can draw a connection from the input port to the "A" element. According to one or more embodiments, input ports must have a name. In one embodiment, the user can press "F6" to bring up the properties dialog for the input port. The user can type "OddIn" in the Name field and press "OK". The resulting automaton would then look similar to the automaton in FIG. 23. This automaton can be referred to as the macro definition. This macro element can then appear in the "Project Macros" section of the Palette window. It can then be placed on a graph just as any element in the ANML Elements section. The user can return to the main design by clicking on its tab.

Figure 24:
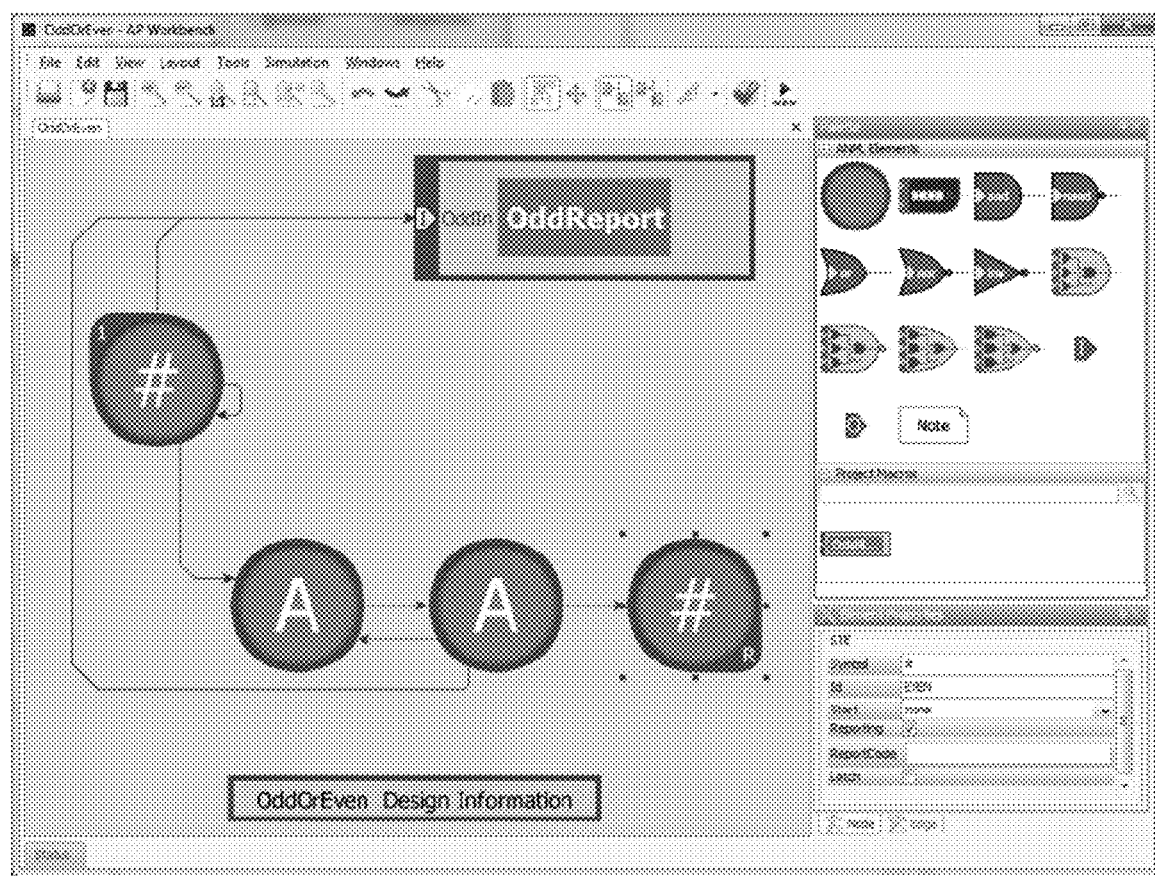
FIG. 24 illustrates an example of an oddoreven with a macro screen in AP Workbench.

A user can drag the new macro from the "Project Macros" section to the graph. The user can place it just above the elements used to create the macro. The user may need to adjust the zoom level or scroll area to provide more working room. In an exemplary embodiment, the two elements are going to be replaced with the macro. The user can duplicate the connections—there are two that need to be made—one from the "lead" element and one from the second "A" element of the "even" pair. The user can connect these to the "OddIn" port of the macro. Once that is complete, the user can delete the original two elements used to make the macro (this may delete their connections as well). The resulting automaton is shown in FIG. 24.

A user can also create a macro for the even report section of the automata using a slightly different method. For the left-most "A" element, the user can change the ID to "evenIn". For the other "A" element, the user can change the ID to "evenOut". The user can select the 3 STEs that make up the even report section (the two "A" elements and the "EVEN" element) using a bounding box or shift-select, for example.

The user can type Ctrl-M, for example, to bring up the new macro dialog. The user can enter "EvenReport" in a Name field and press a "From Selection" button. The user can press "OK" to dismiss the dialog. The Workbench can open a new tab with the three elements and an input port and an output port.

If the user switches back to the main graph, the elements have been replaced by a macro instance. The connections to the macro can already be made. If the macro is too large, the user can wwitch back to the macro definition and press the "Edit Macro Symbol" button in the top-left corner of the graph. The Workbench can then open up a representation of the macro instance.

The user can click on a, for example, green label in the center of the macro instance to select it. The user can then be presented with "handles" they can use to resize the bounding rectangle. The user can use the top middle handle to make the box thinner, similar to the OddReport macro instance shown in FIG. 24. The user can use the middle left or right handle to make the box less wide (until the text of the ports is close to, but not overlapping, the center label). If the label starts to truncate, the user can make the box wider until the entire text of the label is visible. The user can click anywhere outside the macro instance (but still within the editor graph) to deselect the instance symbol.

To move the ports around, the user can click in the middle of the "I" of the input port "home plate" symbol. The user can drag it to the middle of the left border of the macro instance. The Workbench can operate to "snap" it into place along one of the grid lines.

Figure 25:
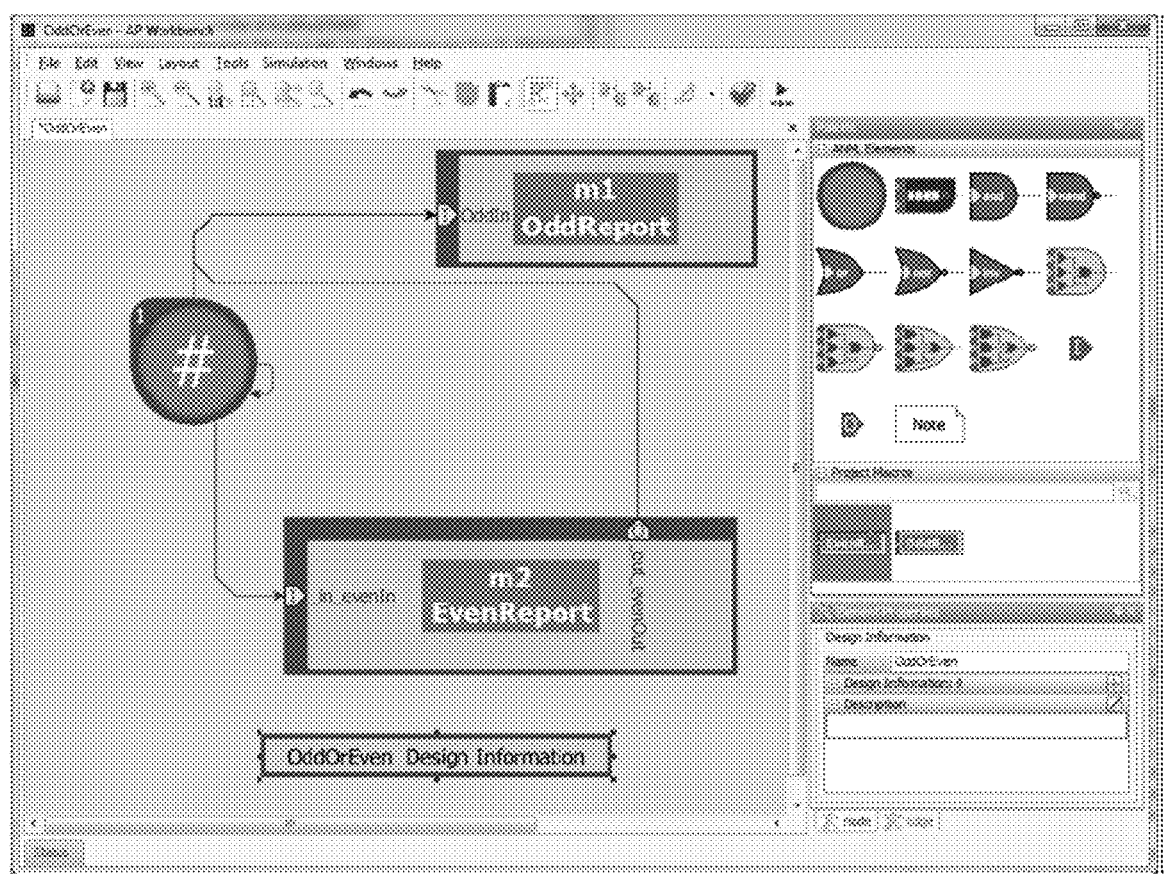
FIG. 25 illustrates an example of an oddoreven with two macros screen in AP Workbench.

In the main project, the output port of this macro is connected to the input port of the "OddReport" macro which is currently above the instance of this macro. The user can move the output port to the top of the symbol by clicking on the "O" in the output port "home plate" symbol to select it and dragging it to the top border of the macro, off to right side of the label so the port name doesn't overlap. Depending on how thin the user made the box, they may want to adjust the bounding box so the port label doesn't extend beyond the bottom. The user can click on the label to get the handles to appear and adjust as needed. Once they are satisfied with the symbol appearance and port placement, the user can select "Save All" from the "File" menu (or click the Disk icon in the toolbar). A new thinner version can be presented at a mini-representation in the Project Macros section of the Palette. The user can switch to the main graph and the Workbench can present the macro fits a bit better. The user can click on the reroute edge button in the toolbar ( ) to clean up the connections. The user can change the IDs of the two macro instances to "m1" for "OddReport" and "m2" for "EvenReport" and save the design. A depiction of the resultant automaton appears in FIG. 25.

The example design can be simulated by pressing the "Start Simulation" button in the toolbar. The last symbol file used can be recalled. If the input file is not "even.txt" in this example, the user could press the "Load Simulation Symbols" button in the Symbols window and select the "even.txt" symbol file. The user can single step to index 5 (symbol "A").

The macros can change to the "Macro Active" color. Doing so can indicate that at least one matching STE is present in the macro instance. The user can double click on either of the macros. The AP Workbench can open a new floating window showing the contents of the macro (e.g., a Macro Instance window). These windows can remain open during the simulation in order for the user to see what is going on inside the macro. If the user has not done so yet, they can open the Macro Instance window for the "EvenReport" macro. The user can Fast Forward (or single step) to the end of the simulation.

In the example embodiment, the user would notice that the "EVEN" element in the macro is active and reporting (as expected). If the user hovers over the report row at the last symbol index, they can see that the tooltip says "m2.EVEN (m2)". This can indicate that the reporting element is located in a macro ("m2").

If the user brings up the context menu, they will notice that "m2" is in the menu with a submenu with one action ("m2.EVEN"). If the user selects this action, the element can be highlighted in the macro instance window. If the macro instance window was not already open, it will be opened.

The user can close all the macro instance windows and rewind the simulation to the beginning. The user can click on the "Settings" button ( ) and select "Highlight macros with active reports" so that it is checked. The user can run (or Fast Forward) the simulation to the end.

The Workbench Notice can highlight the "EvenReport" macro instance in a different color. This can be used to indicate that the macro has an active reporting element. The user can return to design mode by, for example, pressing the button in the toolbar or selecting "Stop Simulation" from the Simulation menu.

The Workbench can make Macro Instance windows available in design mode using the same gesture (double-click) on a macro instance. A potentially powerful feature of macros is parameterization. The example pattern has been limited to looking for "A"s in the input stream. If the user wants to report on an odd or even number of "C"s, they could copy the existing macros and create two new macros. A potentially more flexible alternative could use parameters.

The user can open the "OddReport" macro definition. The "OddReport Parameters" element can be selected. In the Element Properties window, a collapsible pane called "Parameters" can be presented followed by a count (0 in our case) and a "plus" button on the far right. The user can press the button. The Workbench can create a new table entry with three columns—Name, Default Value, and Description.

Figure 26:
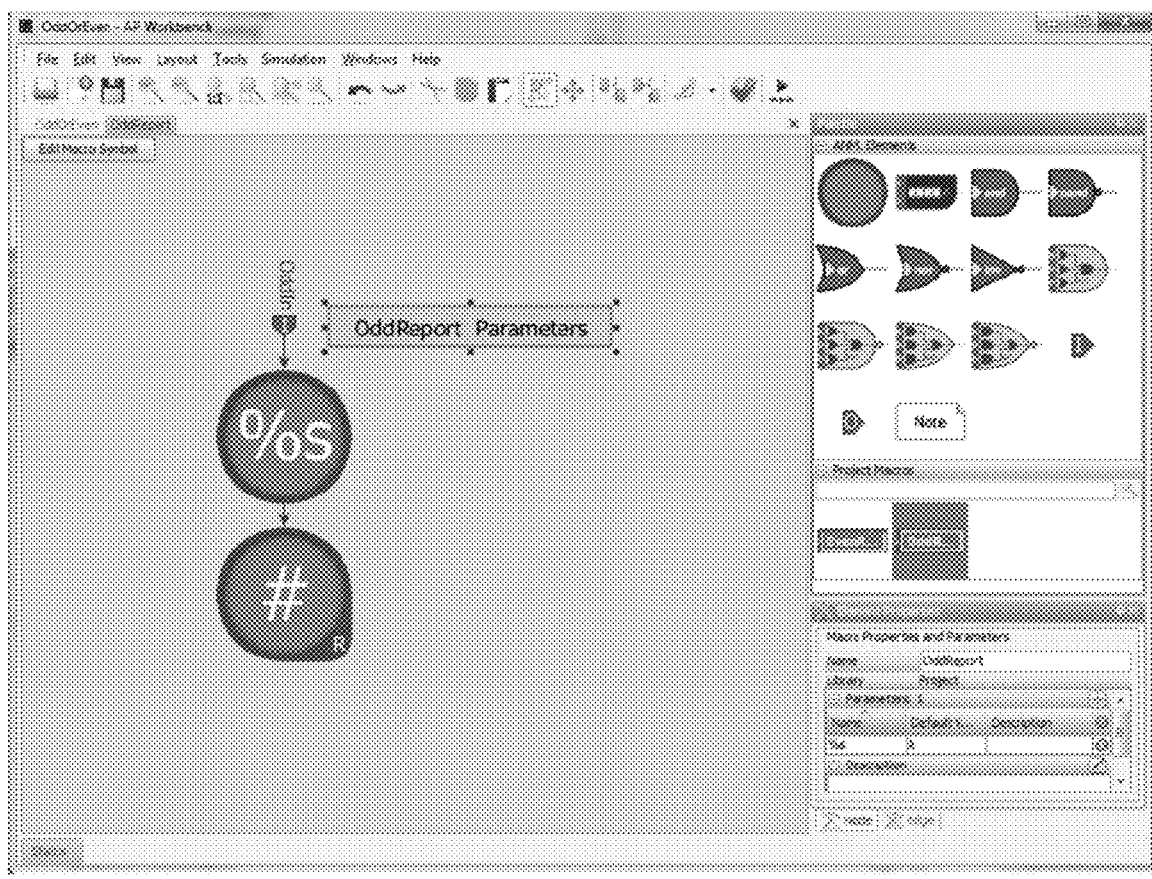
FIG. 26 illustrates an example of an oddoreven macro parameterized screen in AP Workbench.

The first entry can be in edit mode with a default value of "% name". The user can change this by typing "s" and then TAB to move to the next field (Default Value). The user can type "A" and press TAB again. The user can select the "A" element in the graph and change the Symbol to "% s". The user can save the design. The resultant automaton can be similar to that depicted in FIG. 26.

The user can return to the main graph and select the "OddReport" macro instance. The Workbench can present the Element Properties for the instance with a Parameter whose value is "A" (italicized to indicate that it is the default value from the macro definition). If the user wants to count occurrences of "C"s, the user can change the Value to "C". The user can double-click on the instance to open the macro instance window. The user can resize the window to see the symbols in the STEs if necessary. The depicted symbol set for the first element can then be "C" and can be a different color than the "#" element. This can be used to indicate that the symbol set has been set from a parameter.

In a similar fashion, the user can add a parameter to the EvenReport macro. The user can replace the "A" in both STEs with the parameter. To be consistent, the default value of the parameter should be "A". In the main graph, for the value in the instance, the user can set the parameter to "C".

A set of exemplary rules for using parameters are listed below. The Workbench can operate to flag any violation as a validation error and not allow simulation to proceed.

Parameter names must be unique.
Parameters must be used at least once in the definition.
Parameters must be the entire symbol set. A parameter cannot be used as part of symbol set. For instance, you may want to use a parameter as the anchor in a range of values (i.e. "% s-z"). This will not work-it would be interpreted as a pattern with the "character and a range of characters "s" to "z".
A parameter must have a default value defined in the macro definition.

Publish-Subscribe is a widely used communication paradigm in computing systems. PubSub is a highly decoupled architecture where the information producer (publisher) does not specify the destination for the information and information consumers (subscribers) receive information based on examination of the information content, determining, through a mediating process (PubSub engine) if it meets criteria for an object of interest. The publisher sends the information to the PubSub engine and the PubSub engine resends the information to the subscribers. The pubsub engine also receives the subscribers subscription criteria which it uses when deciding whether or not to send an information object to the subscriber.

As an example, a user might want to scan an input stream for the occurrence of new items on a menu or restaurant openings or coupons or specials. A formalized query might looks like this: AND (Cheesecake Factory, OR (AND (menu, new items),AND (restaurant, openings),OR (coupons, specials))) Matching valid input streams:

Cheesecake Factory menu new items.
Cheesecake Factory restaurant openings
Cheesecake Factory coupons
Non-matching input streams:
Cheesecake Factory restaurant menu
Cheesecake specials
Cheesecake Factory restaurant closings For purposes of this example, an input stream will always begin with a carriage return (0x0d) character. Phrases will be separated by one or more lines. Line termination may be CR (0x0d), LF (0x0a), or CR LF (0x0d 0x0a).

The basic design of the query is recognizing specific patterns and tying them together with logical expressions. A user could have one large graph with many STEs connected through logic gates to yield the proper results. While this is a perfectly feasible approach, something more modular and easily maintained might be a better choice.

For modularity, placing the phrases in macros could be ideal. The user could construct the macros by hand, but AP Workbench can provide a mechanism for creating macros from regular expressions (regex) quickly. For example, the user can create a new project called "CFLover". The first phrase to be be searched for is "Cheesecake Factory". This could require a minimum of 18 STEs (one for each character in the phrase). This might typically involve a lot of dragging and dropping, editing the symbol-sets, placement, etc.

According to one or more embodiments, the AP Workbench can operate to provide a macro creator tool with an easy shortcut. With the "CFLover" main graph selected, the user can invoke "New Macro . . . " from the File menu. In the "Name:" field, the user can type "tx18-1" (first term of 18 characters). The user can select "From Regular Expression" and type "/Cheesecake Factory/" in the text box. The user can press "OK" to generate the new macro.

The Workbench can operate to open a graph with the 18 STEs in a single vertical column. In order to make the macro a bit more compact and easier to work with, the user might select the STEs for "Factory" (e.g., using a bounding box to make the selection) and move the group so that the "F" element is directly to the right of the top "C" element. The user can press the reroute button ( ) in the toolbar to reroute the connection. The user can add an Input port left of the top "C" element and connect the two. The user can set the name of the port to "CFIn". The user can add an Output port to the right of the "y" element and connect them. The user can set the name of the port to "CFOut". The user can edit the macro symbol so that it is 255×120 pixels (the values in the status bar at the lower right of the editing window can help as the user resizes the bounding box). The user can move the ports such that "CFIn" is centered on the left border and "CFOut" is centered on the right border.

If the user is searching for several phrases, the user can preserve the fact that we found one. The user can do this by using the "latch" feature of an STE. The user can select the "y" element and check the Latch property. The Workbench can operate to cause a latch symbol tp appear in the lower part of the STE. This can be used to indicate that once it matches, the STE will activate any downstream elements regardless of the current symbol in the stream. The user can give the reporting node a notable ID (like "Factory"). The user can use the same pattern to create macros for "menu" (name it "tx4-1"), "new items" ("tx9-1"), "restaurant" ("tx10-1"), "openings" ("tx8-1"), "coupons" ("tx7-1") and "specials" ("tx8-2"), adding an input port connected to the first element, and output port connected to the last element, setting the reporting node to latch and changing the ID to something notable.

After the user has created all the macros, the user can return to the main graph ("CFLover") and create a vertical tower of macro instances. The first (top-most) macro instance can be tx18-1 (the "cheesecake factory" macro). Below that, the user can place tx4-1 ("menu"), tx9-1 ("new items"), tx10-1, tx8-1, tx7-1, and finally tx8-2. The output of tx4-1 and tx9-1 can be connected to an AND gate, as can the outputs from tx10-1 and tx8-1. The output from the two AND gates can be connected to an OR gate. In addition, the outputs from tx7-1 and tx8-2 can be connected to this OR gate. Finally, the output from tx18-1 and this OR gate can be connected to an AND gate to complete the query. This last AND gate can be reporting and have an ID of "Found".

Figure 27:
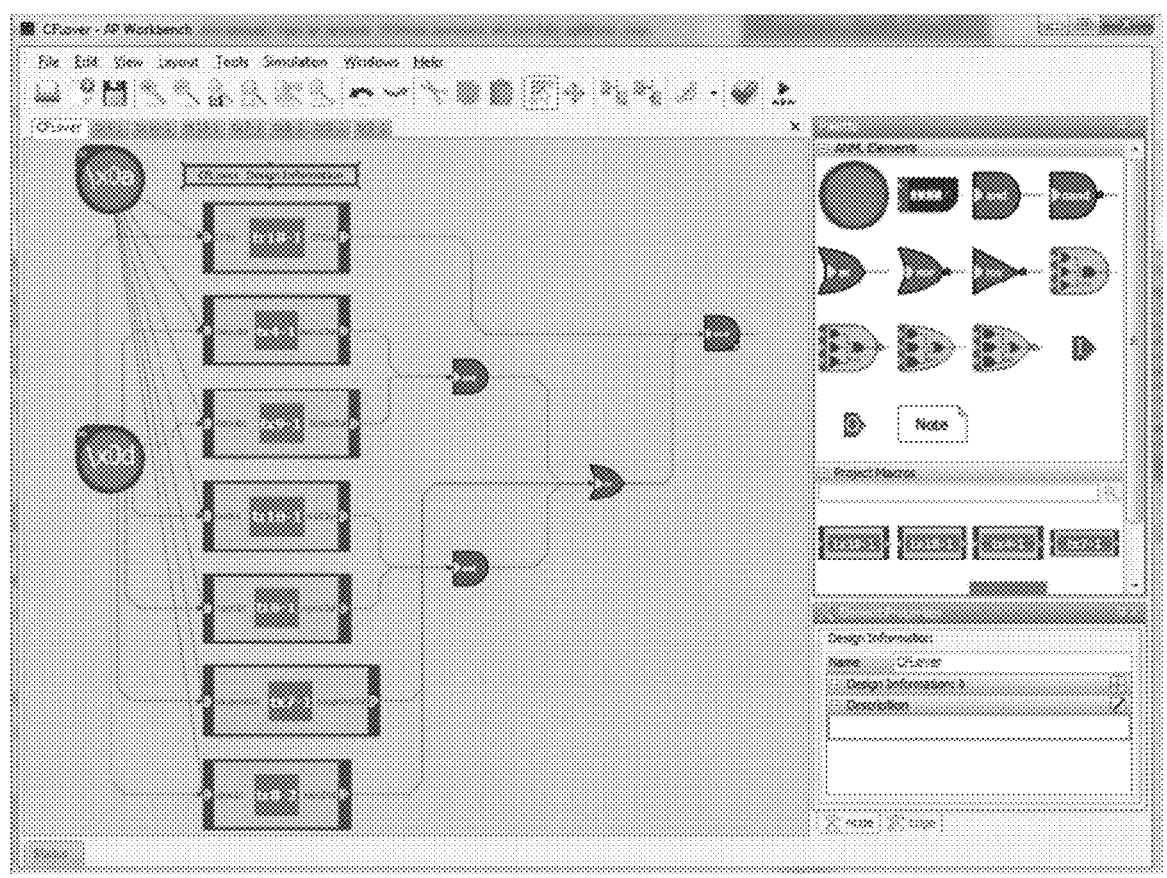
FIG. 27 illustrates an example of a publish subscribe query screen in AP Workbench.

As for input, the macros will only look at the start of data. If the user needs to have them fed with a continuous stream, the user could change the start element of each macro to receive all input. Alternatively, the user can put the phrase delimiter as the start condition and have it feed the macros. The user can add an STE on the far left side of the design, more or less centered in the tower of macros. The user can change its Start property to be "All Input" and connect it to the input of each macro. The user can set the symbol-set to be "@\x0d". After all the connections have been made, the use can make sure that only STE is selected and invoke "Duplicate" from the Edit menu. The Workbench can operate to add a new STE with all the same connections to the graph. The user can change the symbol set from "@\x0d" to "@\x0a" and so that we now have the phrase delimiter. The resultant automaton can depicted as shown in FIG. 27.

The user can then use the Workbench to validate their design to see if they have violated any rules of engagement for the Automata Processor. Validation can run a number of checks and, by default, present any errors and/or warnings in a dockable window.

The user can invoke a "Validation Settings . . . " action found in a Tools menu. The Workbench can operate to present the user with the Project Settings dialog with the Validation page selected. At the top of the page can be the title for the current Project Settings page (Validation) with the name of the project in parentheses. If multiple projects can be open at once, this can provide confirmation that the user is changing the settings for the correct project.

A first checkbox can enable the display of Warning level violations. In one or more embodiments, error level violations are always displayed. By default, warnings can also be displayed. According to one or more embodiments, some validations can be performed during edit. For instance, using illegal characters in an ID field. If the user does not want these dynamic checks to be performed, they can uncheck a second checkbox.

In addition to built-in validations the AP Workbench can perform, the user can also send their design to the Automata Processor compiler. Compilation problems can be handled in at least one of three ways: as errors (preventing export/simulation), as warnings (allowing export/simulation to proceed), or ignored (they won't appear in the validation report dialog). The default setting can be to have compilation problems treated as errors. Whether or not to use the compiler is governed by a last checkbox presented by the Workbench.

Validations with the compiler might not include "place and route", which can be a lengthy operation depending on the design. The default setting can be to not use the compiler during validation.

The user might also invoke "Validate Project . . . " from a Tools menu. After validation is complete, a dialog can be presented with the results. In an exemplary embodiment, there might be 3 warnings, for example, indicating that Boolean elements directly connected to other Boolean elements will slow the clock. In such an instance, although the design is valid (no errors), it isn't optimal.

Before dismissing the dialog, the user can be presented with a couple of options. A "Dock Results" button can be used to create a docked window at the bottom of the AP Workbench with the same validation results. If the user double-clicks on a validation, the element(s) in question can be highlighted and centered (if possible) in order to assist the user with identifying and fixing the issue.

A "Design Statistics" button can be used to open another dialog with information about the design (number of nodes, connections, count by type of element, etc.). This can be a purely informational dialog (e.g., it may not contain any actionable information).

Cascading logic gates often require additional time to process. The user can replace the AND-OR chains using a single complex logic element—e.g., the SoP (sum-of-products) element. The outputs from tx4-1 and tx9-1 can be connect to the first terminal of the SoP element. The outputs from tx10-1 and tx8-1 can be connected to the second terminal of the SoP element. Once these connections are made, the user can delete the two AND gates. The automataon still has cascading Boolean elements. The user e can replace the OR gate with an STE that matches all input. In an exemplary embodiment, the user might want the STE to be activated if one or more of the following is true:

"coupons" found
"specials" found
"menu" AND "new items" found
"restaurant" and "openings" found.

Figure 28:
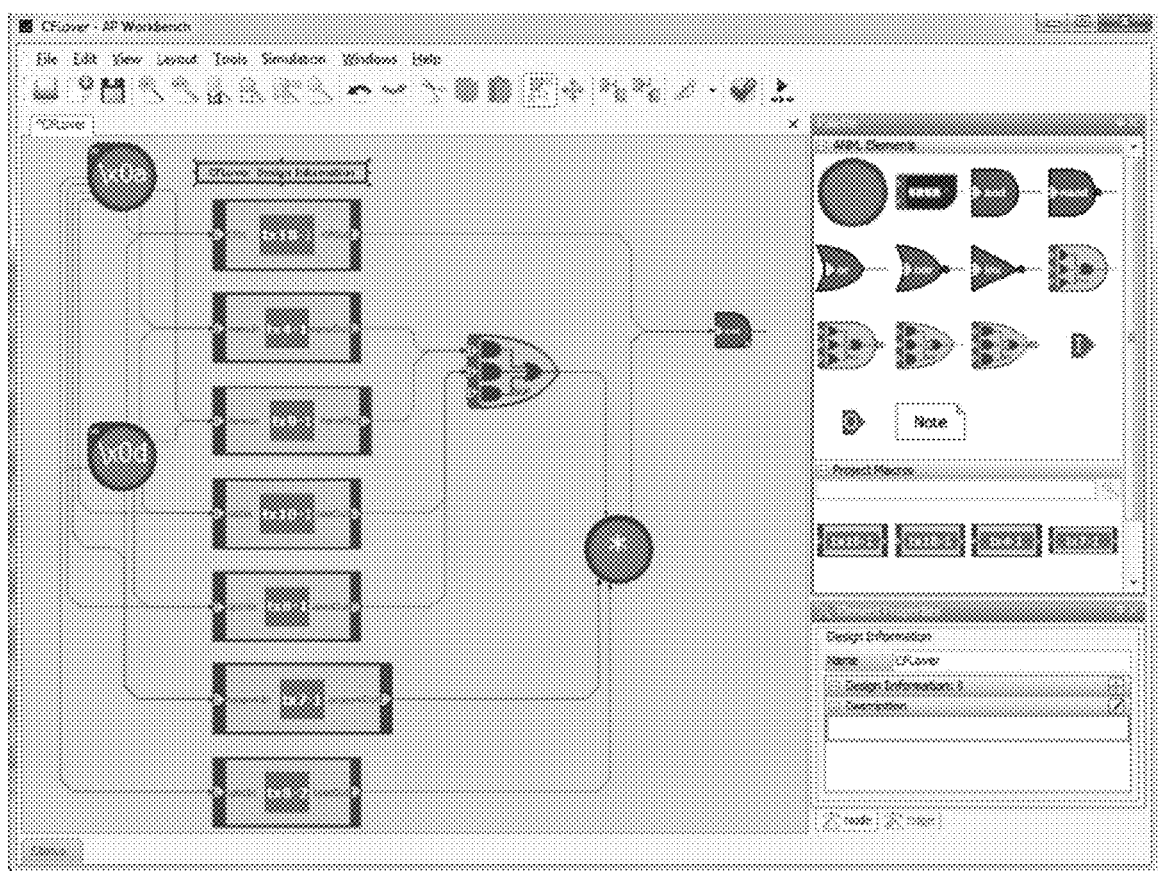
FIG. 28 illustrates an example of a revised publish subscribe query screen in AP Workbench.

The user can drag a new STE to the graph and change the symbol set to "*". The user can connect tx7-1 to the STE, connect tx8-2 to the STE, connect the output of the SoP to the STE and connect the output of the STE to the reporting AND gate. The user can delete the OR gate and save the design. The resultant automaton can be depicted as shown in FIG. 28.

After validating the project, the user can "Start Simulation" from a Simulation menu. If this is the first simulation of this design, the user can create a new symbol stream by pressing "New symbol editor . . . " and typing the following:
<enter>Cheesecake Factory<enter>menu<enter>openings<enter>specials<enter>Where
<enter> is the Enter key.

In this example, the input stream must begin with a new line character. Each phrase is separated new lines. The user can press "Done, save . . . " and save the file as pass1.txt. Even though the input stream is multiline, the Workbench can still present it as a single line in the Symbol Stream window. At index 1, there may be what appears to be a blank space. This can be the first delimiter (the beginning new line character).

The user can open up the Settings dialog by pressing a button. The user can check the first box to "Show Symbols as Hex" and press OK to dismiss the dialog. The Workbench can operate to replace the symbols with hex digits and present the symbol at index 1 as "OA" (it may be "OD" depending on operating system platform).

The user can open the Settings dialog and turn off the hex display. The user can single step the first symbol. One of the phrase delimiter STEs will match and all of the macros will be activated, ready to process the next symbol. The user can jump (or single step) to index 19.

The first phrase matches and generate a report. The user can jump to index 34. Macros tx18-1, tx4-1 ("menu") and tx8-1 ("openings") have all matched. But that is not sufficient to satisfy the query. The user can jump to index 42. Macro tx8-2 ("specials") is now matching and has activated the STE. It will match the next character and activate the reporting AND. Since the other input to the AND gate is already active ("Cheesecake Factory"), it can report "Found".

Because this exemplary input stream contains embedded non-printable characters, it may be considered "binary". The Symbol stream can also be used in "interpreted" mode. If necessary, the user can move the scroll bar so that index 1 is visible. The user can double-click the "blank" symbol and type "\n" and press <Enter> to exit editing. The user can do the same at index 20, 25, 34 and 43.

The user can rewind back to the first symbol and then Fast-Forward (or Run) the simulation to the end. In an exemplary embodiment, the results are the same. If the user opens a stream editor, they can see that the previous new line characters have been replaced with the newline escape sequence and the stream is now a single line. The user can return to design mode by invoking "Stop Simulation" from a Simulation menu (or pressing the button in the toolbar).

While the various modifications and alternative forms are envisioned, specific embodiments have been shown by way of example in the drawings and have been described in detail herein. However, it should be understood that the embodiments are not intended to be limited to the particular forms disclosed. Rather, the embodiments are to cover all modifications, equivalents, and alternatives falling within the spirit and scope of the following appended claims.

What is claimed is:

1. A tangible, non-transitory computer-readable medium configured to store instructions executable by a processor of an electronic device, wherein the instructions comprise:
   instructions to provide a graphical user interface (GUI) utilized in creation of an automata network based on an underlying markup language; and
   instructions to present a toolbar via the GUI to provide interactive icons corresponding to actions regarding the automata network, wherein the actions regarding the automata network comprise stream actions to work with a symbol stream to be applied to the automata network in conjunction with a simulation of operation of at least a portion of the automata network to analyze at least a portion of the symbol stream via the at least a portion of the automata network or wherein the actions regarding the automata network comprise stepping actions corresponding to navigating to a first symbol in the symbol stream being applied to the automata network in conjunction with the simulation of operation of at least a portion of the automata network, wherein the GUI is additionally configured to provide a macros library section selectable by a user to create new macros or edit existing macros, wherein each respective macro of the new macros and existing macros comprises a self-contained automaton that can be replicated, wherein the GUI provides a creator tool shortcut allow the user to access a regular expression from a set of preexisting regular expressions to apply in creating the new macros.

2. The tangible, non-transitory computer-readable medium of claim 1, comprising instructions to represent circuitry of the automata network as graphical icons in the GUI.

3. The tangible, non-transitory computer-readable medium of claim 1, comprising instructions to present a first selectable icon via the GUI corresponding to creation of at least a portion of the automata network as a new project.

4. The tangible, non-transitory computer-readable medium of claim 3, comprising instructions to store a new project as a file that contains visual data and data in the underlying markup language.

5. The tangible, non-transitory computer-readable medium of claim 3, comprising instructions to present a second selectable icon via the GUI corresponding to a network element of the automata network.

6. The tangible, non-transitory computer-readable medium of claim 5, comprising instructions to present an editable workspace via the GUI upon which the network element can be presented based on a determination that the first selectable icon has been selected and the second selectable icon has been selected.

7. The tangible, non-transitory computer-readable medium of claim 5, comprising instructions to present a third selectable icon via the GUI corresponding to an existing macro of the existing macros, wherein the existing macro and corresponding to a group of network elements of the automata network.

8. The tangible, non-transitory computer-readable medium of claim 7, comprising instructions to present an editable workspace via the GUI upon which the existing macro can be presented based on a determination that the first selectable icon has been selected and the third selectable icon has been selected.

9. The tangible, non-transitory computer-readable medium of claim 1, comprising instructions to present a status indication via the GUI to visually indicate a warning or an error regarding the automata network.

10. A tangible, non-transitory computer-readable medium configured to store instructions executable by a processor of an electronic device, wherein the instructions comprise:
    instructions to provide a graphical user interface (GUI) to edit an automata network that is generated based on an underlying markup language; and
    instructions to present a toolbar via the GUI to provide interactive icons corresponding to stream actions to work with a symbol stream to be applied to the automata network in conjunction with a simulation of operation of at least a portion of the automata network to analyze at least a portion of the symbol stream via the at least a portion of the automata network, wherein the instructions are additionally configured to provide via the GUI a macros library section selectable by a user to create new macros or edit existing macros, wherein each respective macro of the new macros and existing macros comprises a self-contained automaton that can be replicated, and the instructions are additionally configured to provide via the GUI a creator tool shortcut configured to allow a user to access a regular expression from a set of preexisting regular expressions to apply in creating the new macros.

11. The tangible, non-transitory computer-readable medium of claim 10, comprising instructions to present a first selectable icon via the GUI corresponding to loading of at least a portion of the automata network from a file comprising a saved project.

12. The tangible, non-transitory computer-readable medium of claim 11, comprising instructions to present the at least a portion of the automata network via the GUI based on a determination that the first selectable icon has been selected.

13. The tangible, non-transitory computer-readable medium of claim 12, comprising instructions to present a second selectable icon via the GUI corresponding to an editing action of at least one element of the at least a portion of the automata network via the GUI.

14. The tangible, non-transitory computer-readable medium of claim 13, comprising instructions to present a visually editable icon via the GUI corresponding to a determination that the at least one element of the at least a portion of the automata network has been selected.

15. The tangible, non-transitory computer-readable medium of claim 11, comprising instructions to present a second selectable icon via the GUI corresponding to saving of the at least a portion of the automata network to the file comprising the saved project.

16. The tangible, non-transitory computer-readable medium of claim 15, comprising instructions to save the at least a portion of the automata network to the file comprising the saved project via the GUI based on a determination that the second selectable icon has been selected.

17. A method, comprising:
providing a graphical user interface (GUI) on a computing device, wherein the GUI when in operation provides for creating and editing of an automata network based upon an underlying markup language, wherein the GUI comprises a toolbar to provide interactive icons corresponding to stepping actions corresponding to navigating to a first symbol in a symbol stream being applied to the automata network in conjunction with a simulation of operation of at least a portion of the automata network, wherein the GUI is additionally configured to provide a macros library section selectable by a user to create new macros or edit existing macros, wherein each respective macro of the new macros and existing macros comprises a self-contained automaton that can be replicated, wherein the GUI provides a creator tool shortcut allow the user to access a regular expression from a set of preexisting regular expressions to apply in creating the new macros.

18. The method of claim 17, comprising generating via the GUI a first selectable icon corresponding to creation of at least a portion of the automata network as a new project as a file that contains visual data and data in the underlying markup language.

19. The method of claim 17, comprising generating via the GUI a first selectable icon corresponding to loading of at least a portion of the automata network as a saved project as a file that contains visual data and data in the underlying markup language.

20. The method of claim 17, wherein the stepping actions further correspond to affecting the simulation of operation of at least a portion of the automata network.

* * * * *